United States Patent
Zhu

(10) Patent No.: US 11,289,499 B2
(45) Date of Patent: Mar. 29, 2022

(54) MEMORY DEVICE, METHOD OF MANUFACTURING THE SAME, AND ELECTRONIC DEVICE INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 249 days.

(21) Appl. No.: 16/338,235

(22) PCT Filed: Jul. 31, 2017

(86) PCT No.: PCT/CN2017/095189
§ 371 (c)(1),
(2) Date: Mar. 29, 2019

(87) PCT Pub. No.: WO2018/059110
PCT Pub. Date: Apr. 5, 2018

(65) Prior Publication Data
US 2020/0035696 A1     Jan. 30, 2020

(30) Foreign Application Priority Data

Sep. 30, 2016 (CN) .......................... 201610872924.X
Jun. 30, 2017 (CN) .......................... 201710530337.7

(51) Int. Cl.
*H01L 27/11556* (2017.01)
*H01L 27/11519* (2017.01)
(Continued)

(52) U.S. Cl.
CPC .. *H01L 27/11556* (2013.01); *H01L 27/11519* (2013.01); *H01L 27/11565* (2013.01);
(Continued)

(58) Field of Classification Search
CPC ......... H01L 27/11556; H01L 27/11519; H01L 27/11565; H01L 27/11582;
(Continued)

(56) References Cited

U.S. PATENT DOCUMENTS 8,278,170 B2 * 10/2012 Lee .................... H01L 27/11578
438/261
8,767,465 B2 * 7/2014 Chang .................... G11C 16/10
365/185.17
(Continued)

FOREIGN PATENT DOCUMENTS

CN     102280492 A     12/2011
CN     104078466 A     10/2014
(Continued)

*Primary Examiner* — Shahed Ahmed
*Assistant Examiner* — Sun Mi Kim King
(74) *Attorney, Agent, or Firm* — Christensen, Fonder, Dardi & Herbert PLLC

(57) ABSTRACT

A memory device may include first and second pillar-shaped active regions formed on a substrate and extending upward. The first and second active regions are arranged in a first array and a second array, respectively. Each of the first active regions comprises alternatively stacked source/drain layers and channel layers, wherein the channel layers of the respective first active regions at a corresponding level are substantially coplanar with each other, and the source/drain layers of the respective first active regions at a corresponding level are substantially coplanar with each other. Each of the second active regions comprises an active semiconductor layer extending integrally. The memory device may include multiple layers of first storage gate stacks surrounding peripheries of and being substantially coplanar with the
(Continued)

respective levels of the channel layers, and multiple layers of second storage gate stacks which surround peripheries of the respective second active regions.

25 Claims, 36 Drawing Sheets

(51) Int. Cl.
    *H01L 27/11565*    (2017.01)
    *H01L 27/11582*    (2017.01)
    *H01L 27/11587*    (2017.01)
    *H01L 27/11597*    (2017.01)
    *H01L 21/28*    (2006.01)

(52) U.S. Cl.
    CPC .. *H01L 27/11582* (2013.01); *H01L 27/11587* (2013.01); *H01L 27/11597* (2013.01); *H01L 29/40111* (2019.08); *H01L 29/40114* (2019.08); *H01L 29/40117* (2019.08)

(58) Field of Classification Search
    CPC ......... H01L 27/11587; H01L 27/11597; H01L 27/11575; H01L 27/11548; H01L 27/11595; H01L 27/11507; H01L 27/11521; H01L 27/11568
    See application file for complete search history.

(56) References Cited

U.S. PATENT DOCUMENTS

| | | |
|---|---|---|
| 9,263,462 B2 | 2/2016 | Eom |
| 2017/0236836 A1* | 8/2017 | Huo ........................ H01L 28/00 |
| | | 257/324 |
| 2017/0358598 A1* | 12/2017 | Bedeschi .......... H01L 27/11582 |

FOREIGN PATENT DOCUMENTS

| | | |
|---|---|---|
| CN | 104157654 A | 11/2014 |
| CN | 104681084 A | 6/2015 |
| CN | 106298679 A | 1/2017 |

* cited by examiner

MEMORY DEVICE, METHOD OF MANUFACTURING THE SAME, AND ELECTRONIC DEVICE INCLUDING THE SAME

CROSS REFERENCE TO RELATED APPLICATIONS

This application is a U.S. national phase application of PCT Application No. PCT/CN2017/095189, filed on Jul. 31, 2017, entitled "MEMORY DEVICE, METHOD FOR MANUFACTURING SAME, AND ELECTRONIC APPARATUS COMPRISING SAME," which claims priority to Chinese Patent Application No. 201610872924.X, filed on Sep. 30, 2016, entitled "MEMORY DEVICE, METHOD OF MANUFACTURING THE SAME, AND ELECTRONIC DEVICE INCLUDING THE SAME," and also Chinese Patent Application No. 201710530337.7, filed on Jun. 30, 2017, entitled "MEMORY DEVICE, METHOD OF MANUFACTURING THE SAME, AND ELECTRONIC DEVICE INCLUDING THE SAME," which are incorporated herein by reference in their entireties.

TECHNICAL FIELD

The present disclosure relates generally to the field of semiconductors, and more particularly, to a memory device based on vertical devices, a method of manufacturing the same, and an electronic device including the memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

However, it is difficult to control a gate length of the vertical device, especially if its channel has a monocrystalline material. On the other hand, if a polycrystalline material is used for the channel, the channel will has a greatly increased resistance, as compared to the monocrystalline material. Thereby, it is difficult to stack a plurality of vertical devices because this may lead to an excessively high resistance.

SUMMARY

In view of the above, the present disclosure aims to provide, among others, a memory device based on vertical devices, a method of manufacturing the same, and an electronic device including the memory device, with a better controlled gate length.

According to an aspect of the present disclosure, there is provided a memory device, comprising a plurality of first pillar-shaped active regions and a plurality of second pillar-shaped active regions formed on a substrate and extending upward from the substrate. The first pillar-shaped active regions are arranged in a first array, and the second pillar-shaped active regions are arranged in a second array. Each of the first pillar-shaped active regions comprises alternatively stacked source/drain layers and channel layers, wherein the channel layers of the respective first pillar-shaped active regions at a corresponding level are substantially coplanar with each other, and the source/drain layers of the respective first pillar-shaped active regions at a corresponding level are substantially coplanar with each other. Each of the second pillar-shaped active regions comprises an active semiconductor layer extending integrally. The memory device comprises multiple layers of first storage gate stacks substantially coplanar with the respective levels of the channel layers, and multiple layers of second storage gate stacks which surround peripheries of the respective second pillar-shaped active regions. The multiple layers of first storage gate stacks surround peripheries of the respective levels of the channel layers.

According to an aspect of the present disclosure, there is provided a memory device, comprising a plurality of first pillar-shaped active regions and a plurality of pillar-shaped stress-applying regions formed on a substrate and extending upward from the substrate. The first pillar-shaped active regions are arranged in a first array, and the pillar-shaped stress-applying regions are arranged in a second array. Each of the first pillar-shaped active regions comprises alternatively stacked source/drain layers and channel layers, wherein the channel layers of the respective first pillar-shaped active regions at a corresponding level are substantially coplanar with each other, and the source/drain layers of the respective first pillar-shaped active regions at a corresponding level are substantially coplanar with each other. The memory device comprises multiple layers of first storage gate stacks substantially coplanar with the respective levels of the channel layers, wherein the multiple layers of first storage gate stacks surround peripheries of the respective levels of the channel layers.

According to another aspect of the present disclosure, there is provided a method of manufacturing a memory device, comprising: providing a stack of source/drain layers and channel layers alternatively stacked on a substrate, wherein the lowermost layer of the stack is a source/drain layer, and the uppermost layer of the stack is a source/drain layer; forming a number of machining holes in the stack; selectively etching the channel layers in the stack through the machining holes, to form an array of multiple cell channel portions, which are separated from each other, in each of the channel layers of the stack; forming storage gate stacks for first memory cells in gaps in the stack through the machining holes; removing materials left in the machining holes to expose the machining holes; selectively etching the source/drain layers in the stack through the machining holes, to form cell source/drain portions respectively on upper and lower sides of each of the cell channel portions, wherein each of the cell channel portions and the cell source/drain portions on upper and lower sides thereof form a corresponding one of the first memory cells; forming an isolation layer in the gaps in the stack through the machining holes; removing materials left in the machining holes to expose the machining holes; and forming storage gate stacks for second memory cells on sidewalls of the machining holes, and filling an active semiconductor layer for the second memory cells in the machining holes of which the sidewalls have the storage gate stacks for the second memory cells formed thereon.

According to a further aspect of the present disclosure, there is provided a method of manufacturing a memory device, comprising: providing a stack of source/drain layers and channel layers alternatively stacked on a substrate, wherein the lowermost layer of the stack is a source/drain layer, and the uppermost layer of the stack is a source/drain layer; forming a number of machining holes in the stack; selectively etching the channel layers in the stack through the machining holes, to form an array of multiple cell channel portions, which are separated from each other, in each of the channel layers of the stack; forming storage gate stacks for first memory cells in gaps in the stack through the machining holes; removing materials left in the machining holes to expose the machining holes; selectively etching the source/drain layers in the stack through the machining holes, to form cell source/drain portions respectively on upper and lower sides of each of the cell channel portions, wherein each of the cell channel portions and the cell source/drain portions on upper and lower sides thereof form a corresponding one of the first memory cells; forming an isolation layer in gaps in the stack through the machining holes; and forming a stress-applying material in the machining holes.

According to yet another aspect of the present disclosure, there is provided an electronic device, comprising the memory device described above.

According to embodiments of the present disclosure, the channel region is defined by the channel layer so that the gate length is determined by the thickness of the channel layer. The channel layer may be formed by, for example, epitaxial growth so that its thickness can be well controlled. Therefore, the gate length can be well controlled. In addition, the channel layer may comprise a monocrystalline semiconductor material which may have a high carrier mobility and low leakage current, thereby improving the device performances. Since vertical devices can be stacked on each other relatively easily, a three-dimensional memory device can be manufactured, thereby increasing the storage density. In addition, additional memory cells may be formed in the machining holes, which facilitates saving the wafer area.

BRIEF DESCRIPTION OF THE DRAWINGS

The above and other objects, features, and advantages of the present disclosure will become more apparent from following descriptions of embodiments thereof with reference to attached drawings, in which.

Throughout the drawings, like or similar reference numbers denote like or similar elements.

DETAILED DESCRIPTION

Figure 1:
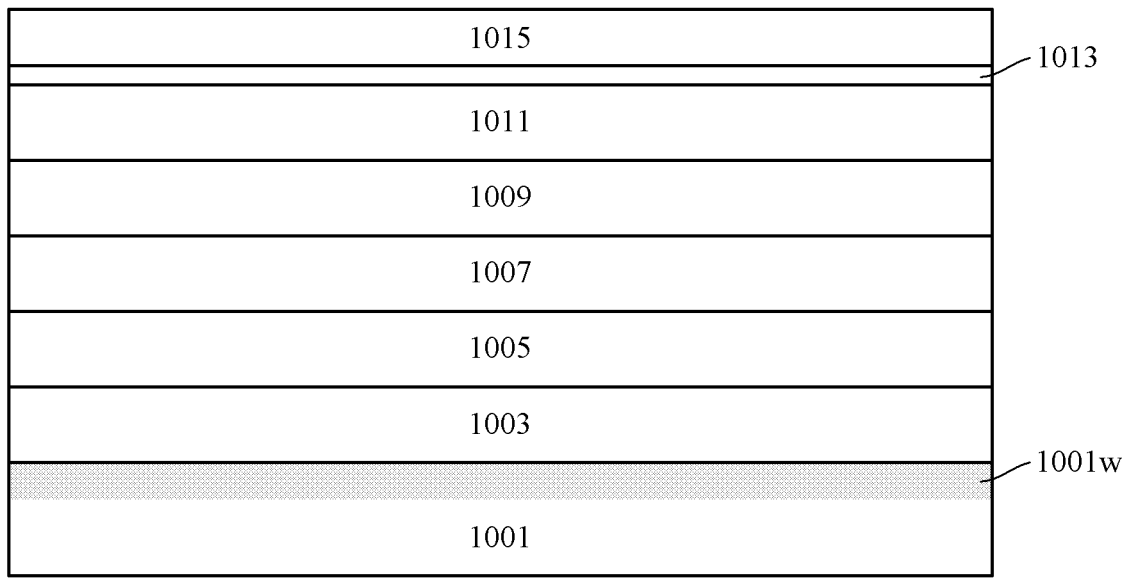
FIGS. 1-18(b) are schematic views showing a flow of manufacturing a memory device according to an embodiment of the present disclosure.
Figure 2:
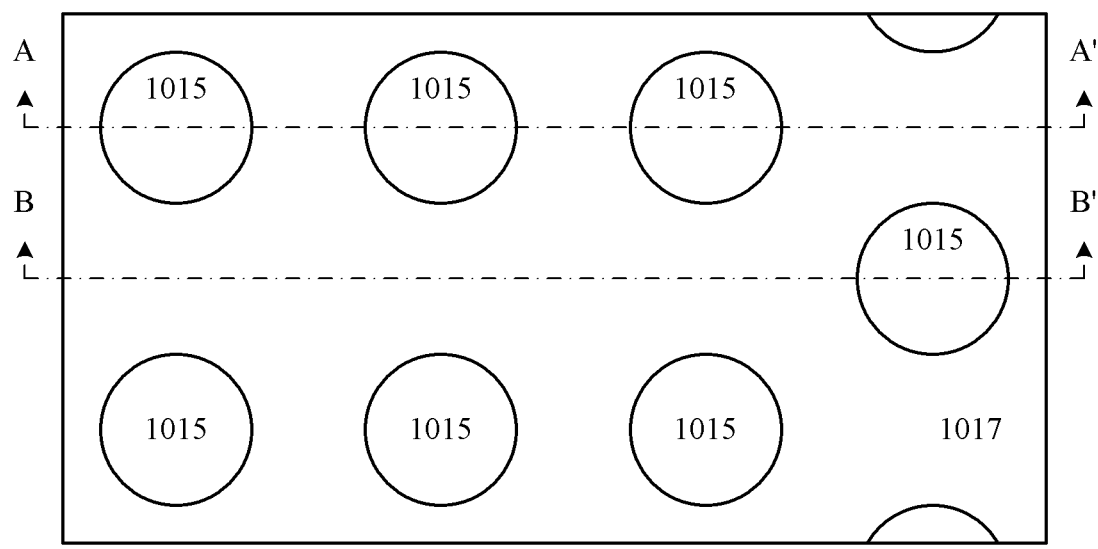

Hereinafter, descriptions are given with reference to embodiments shown in the attached drawings. However, it is to be understood that these descriptions are illustrative only and not intended to limit the present disclosure. Further, in the following, descriptions of known structures and technologies are omitted to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations therefrom may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layer/element is "on" a further layer/element in an orientation, then the layer/element can be "under" the further layer/element when the orientation is turned.

A memory device according to an embodiment of the present disclosure is based on vertical devices, and thus may comprise a plurality of first pillar-shaped active regions and a plurality of second pillar-shaped active regions formed on a substrate and extending upward from the substrate (for example, in a direction perpendicular to a surface of the substrate). Based on these pillar-shaped active regions which extend vertically, vertical devices may be formed by forming gate stacks around their peripheries. Each of the gate stacks may be a storage gate stack, which may comprise, for example, a floating gate layer or charge trapping layer or a ferroelectric material in order to achieve a storage function. For example, the storage gate stack may comprise a first gate dielectric layer, a floating gate layer or charge trapping layer, a second gate dielectric layer and a gate conductor layer which are stacked in sequence, or may comprise a first metal layer, a ferroelectric material layer, a second metal layer, a gate dielectric layer and a gate conductor layer which are stacked in sequence. As a result, the vertical devices form vertical memory cells. Here, the memory cell may be a flash memory cell.

According to an embodiment of the present disclosure, each of the first pillar-shaped active regions may comprise a stack of alternatively stacked source/drain layers and channel layers. The lowermost layer of the stack may be a source/drain layer, and the uppermost layer of the stack may also be a source/drain layer. All of the first pillar-shaped active regions may have the same number of layers, and the channel layers of the respective first pillar-shaped active regions at a corresponding level (for example, those same numbered layers from top down or those same numbered layers from bottom up) may be located in substantially the same plane (for example, they may be separated from the same semiconductor layer) or be coplanar with each other, and the source/drain layers of the respective first pillar-shaped active regions at a corresponding level may be located in substantially the same plane (for example, they may be separated from the same semiconductor layer) or be coplanar with each other. These layers may extend in a direction substantially parallel to the substrate surface, for example.

Multiple layers of storage gate stacks (hereinafter referred to as first storage gate stacks) may be formed corresponding to the planes where the channel layers are located. Each of the multiple layers of storage gate stacks may be integral and surround peripheries of the respective channel layers in a corresponding plane (and in fact also surround peripheries of the respective second pillar-shaped active regions, because the first gate stacks extend laterally on the substrate while the second pillar-shaped active regions extend vertically on the substrate). In this way, each of the channel layers, the source/drain layers on upper and lower sides thereof and a corresponding one of the first storage gate stacks form a first memory cell. Source/drain regions of the device may be formed in the source/drain layers, and a channel region of the device may be formed in the channel layer. A conductive channel may be formed by the channel region between the source/drain regions on opposite sides of the channel region.

As a result, a gate length may be determined by a thickness of the channel layer itself, rather than depending on etching timing as in the conventional art. The channel layer may be formed by, for example, epitaxial growth, so that its thickness may be well controlled. Therefore, the gate length may be well controlled. The channel layer may be formed of a monocrystalline semiconductor material to improve the device performances. In particular, a channel resistance may be reduced, thereby facilitating stacking the vertical devices on each other. Certainly, the source/drain layers may also be formed of a monocrystalline semiconductor material. In this case, the monocrystalline semiconductor material of the channel layer and the monocrystalline semiconductor material of the source/drain layers may be eutecticum.

According to an embodiment of the present disclosure, the channel layer may have etching selectivity with respect to the source/drain layers, for example, by comprising a semiconductor material different from that of the source/drain layers. In this way, it is advantageous to process the channel layer and the source/drain layers respectively. In addition, each of the source/drain layers may comprise the same semiconductor material.

A periphery of the channel layer may be recessed inward with respect to peripheries of the source/drain layers, so that the formed gate stack may be embedded in a recess of the channel layer with respect to the source/drain layers, to facilitate reducing an overlap between the gate stack and the source/drain layers so as to reduce parasitic capacitance between the gate and the source/drain.

According to an embodiment of the present disclosure, each of the second pillar-shaped active regions may comprise an active semiconductor material extending integrally. Each of the second pillar-shaped active regions may be solid or hollow (thereby forming a ring-shaped structure in which a dielectric may be filled). Likewise, multiple layers of second storage gate stacks may be formed around peripheries of the respective second pillar-shaped active regions. Because the first storage gate stacks in fact also surround the second pillar-shaped active regions as described above, gate conductors in the first storage gate stacks may also be used for the second storage gate stacks. Therefore, it suffices to form only another first gate dielectric layer, another charge trapping layer, and another second gate dielectric layer on a periphery of each of the second pillar-shaped active regions. The other first gate dielectric layer, the other charge trapping layer, and the other second gate dielectric layer may extend around the corresponding one of the second pillar-shaped active regions over substantially the entire height thereof. As a result, the other first gate dielectric layer, the other charge trapping layer, and the other second gate dielectric layer may form a structure of concentric rings around the corresponding second pillar-shaped active region.

Here, although the other first gate dielectric layer, the other charge trapping layer, and the other second gate dielectric layer extend continuously over the entire height of the corresponding second pillar-shaped active region, it is portions of these layers facing the respective gate conductor layers that function (these layers are formed in a continuous form mainly due to the manufacturing process to be described below). That is, although the other first gate dielectric layer, the other charge trapping layer, and the other second gate dielectric layer extend continuously over the entire height of the corresponding second pillar-shaped active region, multiple layers of second storage gate stacks are defined by these layers in combination with the respective gate conductor layers. A second memory cell is defined by the second storage gate stack together with the corresponding second pillar-shaped active region.

According to another embodiment of the present disclosure, the second pillar-shaped active regions may be replaced with pillar-shaped stress-applying regions. Each of the stress-applying regions may comprise a stress-applying material to create stress in the channel layers. For example, the stress-applying material may be compressive stressed to create tensile stress in the channels for an n-type memory cell, or tensile stressed to create compressive stress in the channels for a p-type memory cell. In order to protect the memory cells, a protection layer may be formed around the stress-applying material.

According to an embodiment of the present disclosure, the first pillar-shaped active regions may be arranged in a first array (for example, generally a two-dimensional array arranged in rows and columns) and the second pillar-shaped active regions or the pillar-shaped stress-applying regions may be arranged in a second array (for example, generally a two-dimensional array arranged in rows and columns). In addition, the first pillar-shaped active regions and the second pillar-shaped active regions or the pillar-shaped stress-applying regions extend vertically on the substrate as described above and multiple layers of memory cells are defined respectively by the multiple layers of gate stacks, so that the memory device may be a three-dimensional (3D) array. In this 3D array, each of the pillar-shaped active regions may define a string of memory cells.

Due to the manufacturing process, the first array and the second array may be nested with each other, as described below. For example, each of the first pillar-shaped active regions may be located at an approximate center of a corresponding one of grids of the two-dimensional array of the second pillar-shaped active regions or the pillar-shaped stress-applying regions, and each of the second pillar-shaped active regions or the pillar-shaped stress-applying regions may be located at an approximate center of a corresponding one of grids of the two-dimensional array of the first pillar-shaped active regions.

Such a memory device may be manufactured as follows, for example. Specifically, a stack of alternatively stacked source/drain layers and channel layers may be provided on the substrate, wherein the lowermost layer of the stack may be a source/drain layer, and the uppermost layer of the stack may also be a source/drain layer. For example, these layers may be provided by epitaxial growth, and therefore there may be clear crystal interfaces between at least some adjacent ones of the layers. During the epitaxial growth, a thickness of each of the grown channel layers may be controlled. In addition, during the epitaxial growth, in-situ doping may be performed to achieve a desired doping conductivity and a desired doping concentration. The respective layers may be doped separately, so that there may be doping concentration interfaces between at least some adjacent ones of the layers.

In order to facilitate processing the layers in the stack, a number of machining holes may be formed in the stack. These machining holes may extend in a stacking direction of the stack (i.e., a vertical direction), and all the channel layers may have their respective sidewalls exposed in the machining holes. In the following processes, these machining holes are machining paths.

Each of the channel layers in the stack may be selectively etched through the machining holes. In order to better control etching of the channel layer, dopants may be firstly driven, through the machining holes, into the channel layer from the sidewalls of the channel layer exposed in the machining holes, to form a lateral dopant distribution in the channel layer. Due to diffusion of the dopants in all directions from the machining holes, a doping distribution gradually decreasing from the respective machining holes to positions therebetween may be formed after a certain period of time. The channel layer, particularly doped portions therein, may then be selectively etched through the machining holes. As a result, portions of the channel layer may be left at positions between the respective machining holes, while substantially all other portions of the channel layer at other positions may be removed. The remaining portions of the channel layer may be used as channels for memory cells, which are referred to herein as cell channel portions. By setting a layout of the machining holes (which may be referred to as a first array), an array of cell channel portions (which may be referred to as a second array) may be left in each of the channel layers. Further, as the machining holes extend in the stacking direction of the stack (i.e., the vertical direction), the diffusion in the respective channel layers goes on laterally to substantially the same extent, so that the etching in the respective channel layers goes on to substantially the same extent. As a result, the arrays of cell channel portions remaining in the respective channel layers are substantially the same, and the cell channel portions in the respective arrays may roughly be aligned in the stacking direction of the stack (i.e., the vertical direction).

Storage gate stacks may be formed in gaps in the stack through the machining holes. For example, a first gate dielectric layer, a floating gate layer or charge trapping layer, a second gate dielectric layer and a gate conductor layer may be formed in sequence, thereby forming the gate stacks. Due to the presence of the upper and lower source/drain layers, the gate stacks are filled in gaps between the respective source/drain layers, i.e., at positions where the channel layers were originally located, to be self-aligned with the cell channel portions.

Hereto, a channel (which is provided by the cell channel portion), the gate stack, and source/drain regions (which are provided by the source/drain layers above and below the cell channel portion) are all prepared completely for each of the memory cells, but the source/drain regions of the respective memory cells are connected to each other (in this case, the respective source/drain layers are contiguous except for the machining holes). To this end, each of the source/drain layers in the stack may be selectively etched through the machining holes (preceded by exposing the machining holes by removing materials filled therein, for example, the gate stack described above). As the selective etching goes on in all directions from the machining holes, portions of the source/drain layer may be left at positions between the respective machining holes while substantially all other portions of the source/drain layer at other positions may be removed by controlling an amount of the etching. Certainly, it is also possible here to firstly drive, through the machining holes, dopants into the source/drain layer from the sidewalls of the source/drain layer exposed in the machining holes, to form a lateral dopant distribution in the source/drain layer, so as to better control the etching of the source/drain layer. As the etching or dopant diffusion is performed through the same machining holes, the etching goes on in all directions from the machining holes in the same manner (possibly at different rates, i.e., etching rates, but along substantially the same path, i.e., etching path) as the etching of the channel layers, so that the remaining portions of the source/drain layers are substantially aligned with the respective portions previously left in the channel layers in the vertical direction. As a result, the remaining portions of the source/drain layers are respectively located on the top and bottom surfaces of the respective cell channel portions, thereby forming cell source/drain portions for the respective memory cells.

Subsequently, an isolation layer may be further formed on the device. At the same time, the isolation layer may move into the stack through the machining holes, to be filled in the gaps in the stack. In addition, various electrical contacts may be further formed.

According to an embodiment of the present disclosure, additional memory cells (which may be referred to as second memory cells) may be further formed in the machining holes. For example, a storage gate stack for a second memory cell may be formed on the sidewalls of each of the machining holes (preceded by exposing the machining holes by removing materials filled therein, such as the above isolation layer), and then an active semiconductor layer for the second memory cell is filled in the machining hole of which the sidewalls have the storage gate stack for the second memory cell formed thereon. As a result, the active semiconductor layer of the second memory cell may extend along an extending direction of the machining hole (i.e., the vertical direction), and the storage gate stack of the second memory cell may extend along the sidewalls of the machining hole (i.e., the vertical direction) and form a structure of concentric rings around the active semiconductor layer.

Here, it suffices to form only another first gate dielectric layer, another charge trapping layer, and another second gate dielectric layer for the second memory cells on the sidewalls of the machining holes, without additionally forming a gate conductor layer. As described above, the gate stacks of the first memory cells are filled in the gaps between the respective source/drain layers, that is, at the positions where the channel layers were originally located. As a result, the gate conductor layers in the respective gate stacks of the first memory cells are exposed on the sidewalls of the machining holes, and thus are in physical contact with the other first gate dielectric layer, the other charge trapping layer, and the other second gate dielectric layer of the second memory cells, so as to act as a gate conductor layer for the second memory cells. Therefore, at the same level, the gate conductor of the first memory cells and the gate conductor of the second memory cells may be integral with each other.

In addition, the extending direction of the gate conductor layer for the first memory cells (i.e., the extending direction of the channel layer, for example, a direction substantially parallel to the substrate surface) intersects (for example, is perpendicular to) the extending direction of the other first gate dielectric layer, the other charge trapping layer, and the other second gate dielectric layer for the second memory cells (i.e., the extending direction of the machining holes, that is, the vertical direction). As a result, the gate conductor layer defines a channel region at a position in the active semiconductor layer corresponding to the channel layer, and source/drain regions may be formed on opposite sides of the channel region (positions in the active semiconductor layer corresponding to the upper and lower source/drain layers, respectively).

Alternatively, stress-applying regions may be formed in the machining holes. For example, a stress-applying material may be filled in the machining holes.

The technology of the present disclosure can be implemented in various ways, some of which are exemplified in the following with reference to the drawings.

FIGS. 1-18(b) are schematic views showing a flow of manufacturing a memory device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate will be described by way of example for convenience of description.

In the substrate 1001, a well region 1001w is formed by, for example, ion implantation. The well region 1001w may then act as a common ground potential plane of the memory device to which lower source/drain regions of respective memory cells in the memory device at the lowermost level may be connected. The well region 1001w may be doped into n-type if the memory cells are n-type devices or into p-type if the memory cells are p-type devices, or to have the same conductivity as channel regions if the memory cells are junctionless devices.

A first source/drain layer 1003, a first channel layer 1005, a second source/drain layer 1007, a second channel layer 1009, and a third source/drain layer 1011 may be formed in sequence on the substrate 1001 by, for example, epitaxial growth. As an example, for the p-type devices, the first source/drain layer 1003, the second source/drain layer 1007, and the third source/drain layer 1011 may each comprise a suitable semiconductor material such as SiGe (with an atomic percentage of Ge being about 10-40%), with a thickness of about 20-50 nm; and the first channel layer 1005 and the second channel layer 1009 may each comprise a semiconductor material such as Si, which is different from that of the source/drain layers 1003, 1007 and 1011, with a thickness of about 10-100 nm. SiGe has a greater lattice constant than Si, without being strained. The materials for the source/drain layers and the channel layers are not limited thereto. Other semiconductor materials are also possible as long as they can provide appropriate etching selectivity. For example, for an n-type device, the source/drain layers may each comprise Si:C (with an atomic percentage of C being about 0.1-5%), with a thickness of about 20-50 nm, and the channel layers each may comprise Si, with a thickness of about 10-100 nm. Si:C has a smaller lattice constant than Si, without being strained. Certainly, the present disclosure is not limited thereto. For example, the channel layers may each comprise a semiconductor material, with the same components as the source/drain layers, but with different contents of the components from the source/drain layers (for example, they all comprise SiGe, but with different atomic percentages of Ge), as long as the channel layers have etching selectivity with respect to the source/drain layers.

Each of the source/drain layers 1003, 1007 and 1011 may be in-situ doped while being grown, to form source/drain regions later. For example, for the n-type devices, n-type doping may be performed; for the p-type devices, p-type doping may be performed; or for the junctionless devices, it may be doped to have the same conductivity as the channel layers.

In addition, each of the channel layers 1005 and 1009 may also be in-situ doped while being grown, to adjust a threshold voltage (Vt) of the respective devices. For example, for the n-type devices, p-type doping may be performed; for the p-type devices, n-type doping may be performed; or for the junctionless devices, it may be doped to have the same conductivity as the source/drain regions.

In this example, the first source/drain layer 1003 is additionally grown on the substrate 1001. However, the present disclosure is not limited thereto. For example, the first source/drain layer may be formed by the substrate 1001 itself. In addition, more source/drain layers and more channel layers may be formed to form more layers of memory cells.

In addition, a hard mask may be further formed on these grown semiconductor layers for convenience of patterning in subsequent processes or providing an appropriate stopper layer. For example, an oxide (for example, silicon oxide) layer 1013 (with a thickness of, for example, about 2-10 nm) and a nitride (for example, silicon nitride) layer 1015 (with a thickness of, for example, about 10-100 nm) may be formed in sequence.

Subsequently, machining holes may be defined. As shown in a top view of FIG. 2, photoresist 1017 may be formed on the structure shown in FIG. 1. The photoresist 1017 is patterned by photolithography (exposure and development) to expose the underlying nitride layer 1015 at positions where the machining holes are to be formed. Arrangement of the positions of the machining holes will be described in further detail below.

Figure 3A:
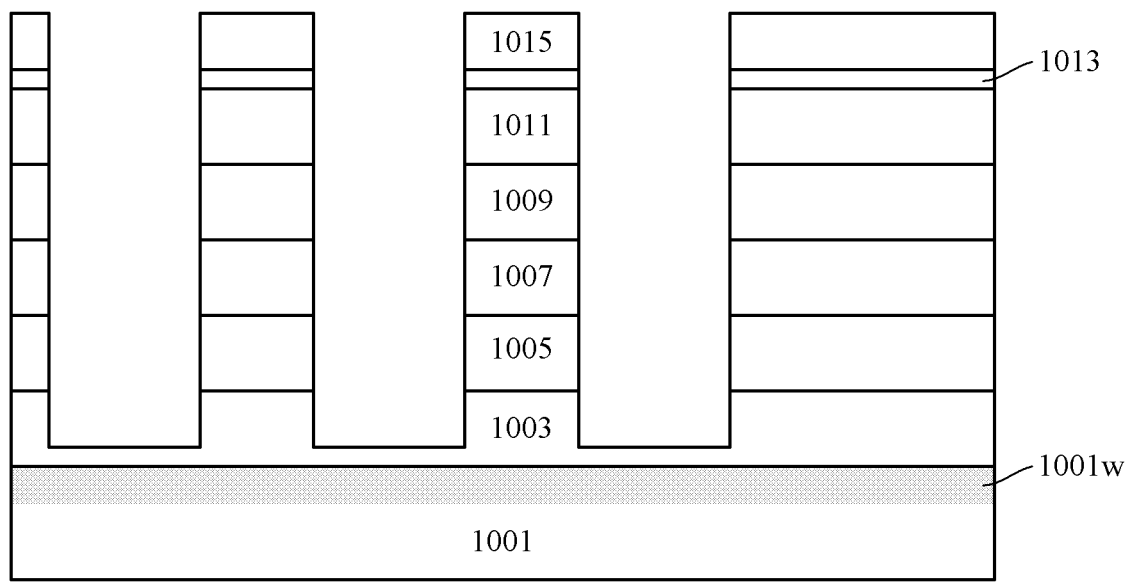
Figure 3B:
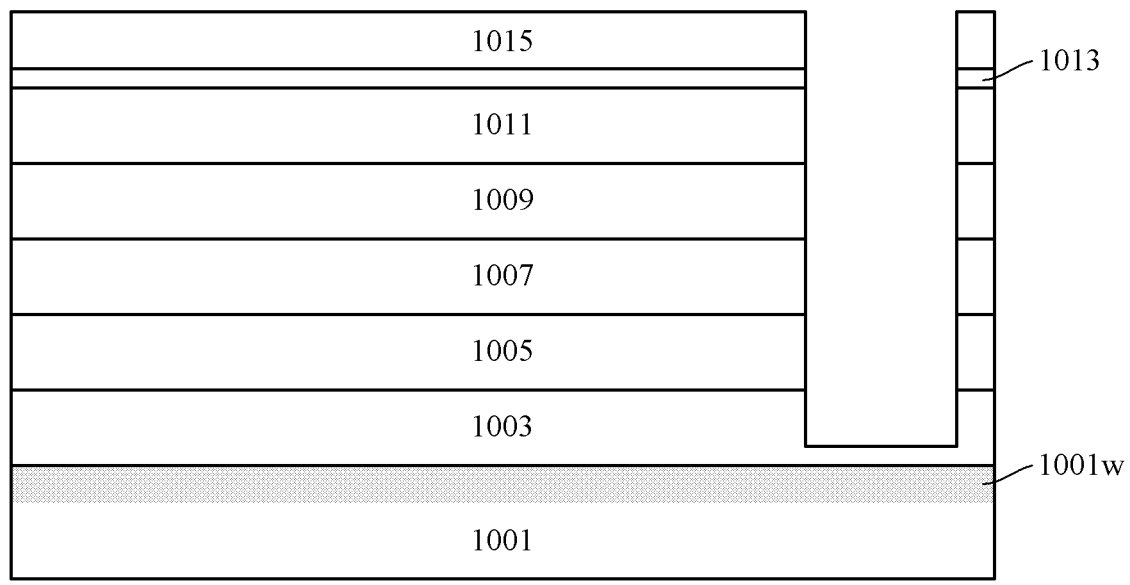

Next, as shown in FIG. 3(a) (a cross-sectional view taken along line AA' in FIG. 2) and FIG. 3(b) (a cross-sectional view taken along line BB' in FIG. 2), holes may be formed downwards through the photoresist. Specifically, for example, the nitride layer 1015, the oxide layer 1013, the third source/drain layer 1011, the second channel layer 1009, the second source/drain layer 1007, the first channel layer 1005 and the first source/drain layer 1003 may be selectively etched by, for example, Reactive Ion Etching (RIE) in sequence to form the machining holes. For example, the RIE may be performed in a direction substantially perpendicular to a surface of the substrate, so that the machining holes extend in the direction substantially perpendicular to the substrate surface. After that, the photoresist 1017 may be removed. In this example, a portion of the first source/drain layer 1003 remains at the bottom of the machining holes for better contact with the ground potential plane. However, the present disclosure is not limited thereto. For example, the machining holes may pass through the stack of the channel layers and the source/drain layers. These machining holes form machining paths to the respective layers in the stack.

Figure 4A:
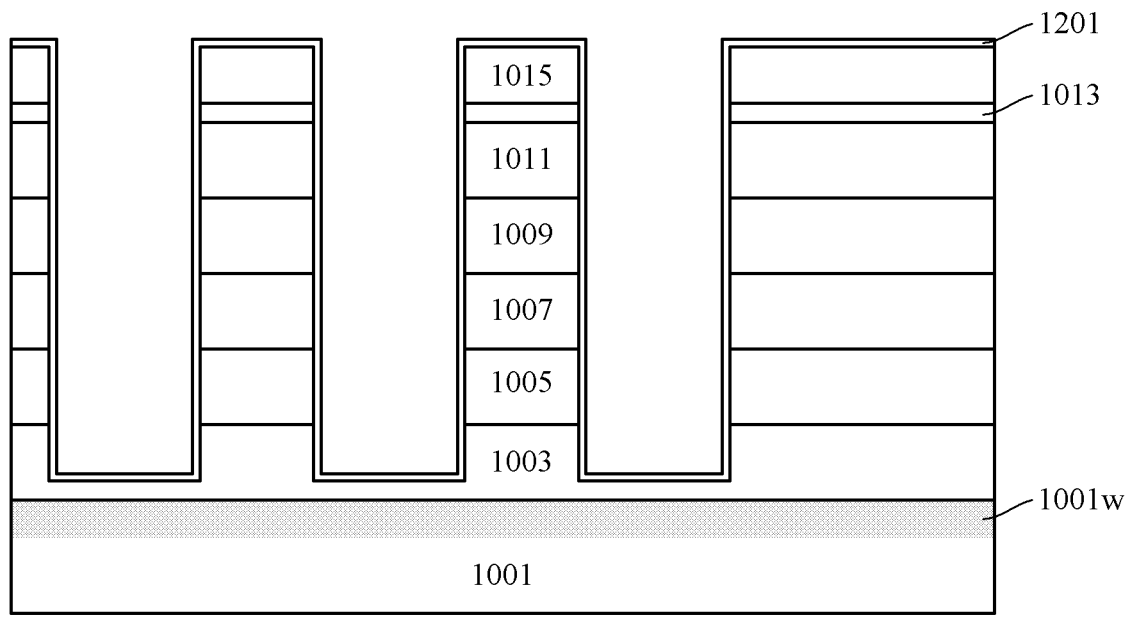
Figure 4B:
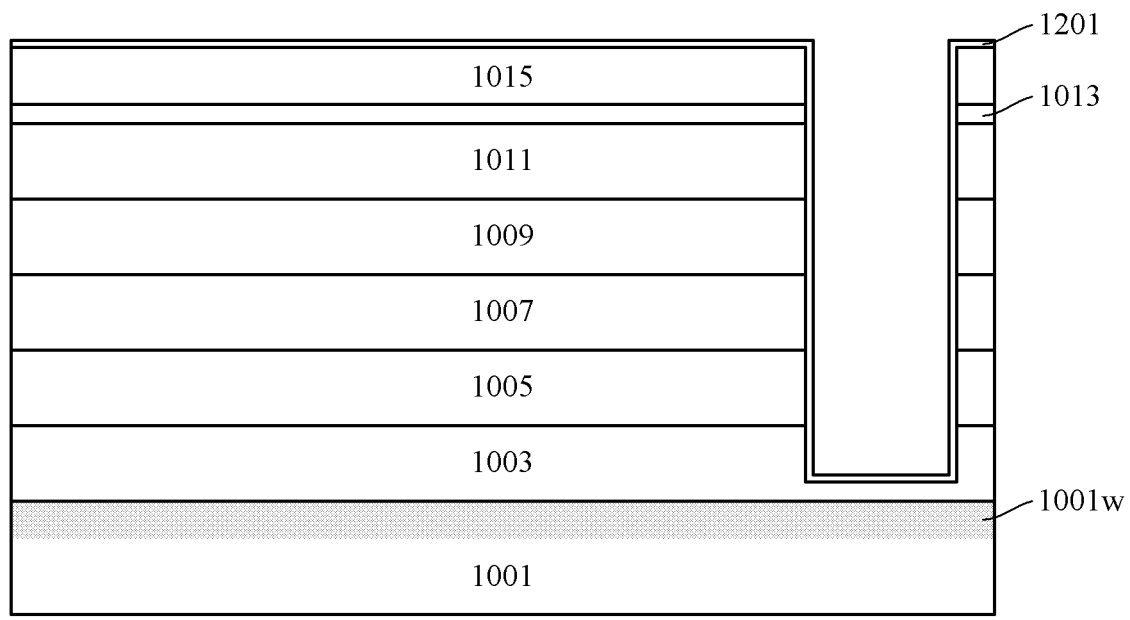

Then, as shown in FIGS. 4(a) and 4(b), a solid-phase dopant source layer 1201 is formed on the structure shown in FIGS. 3(a) and 3(b) by, for example, deposition. For example, the dopant source layer 1201 may comprise oxide with a thickness of about 2-10 nm, and may contain dopants by, for example, being in-situ doped while being deposited. The dopants in the dopant source layer comprise, for example, B, P or As, and preferably As, with a content of about 0.01%-10%. The dopants are selected here for convenience of subsequent selective etching of the channel layers. The dopant source layer 1201 may be covered by a diffusion barrier layer (not shown), if desired, to avoid outward diffusion of the dopants during subsequent annealing.

Figure 5A:
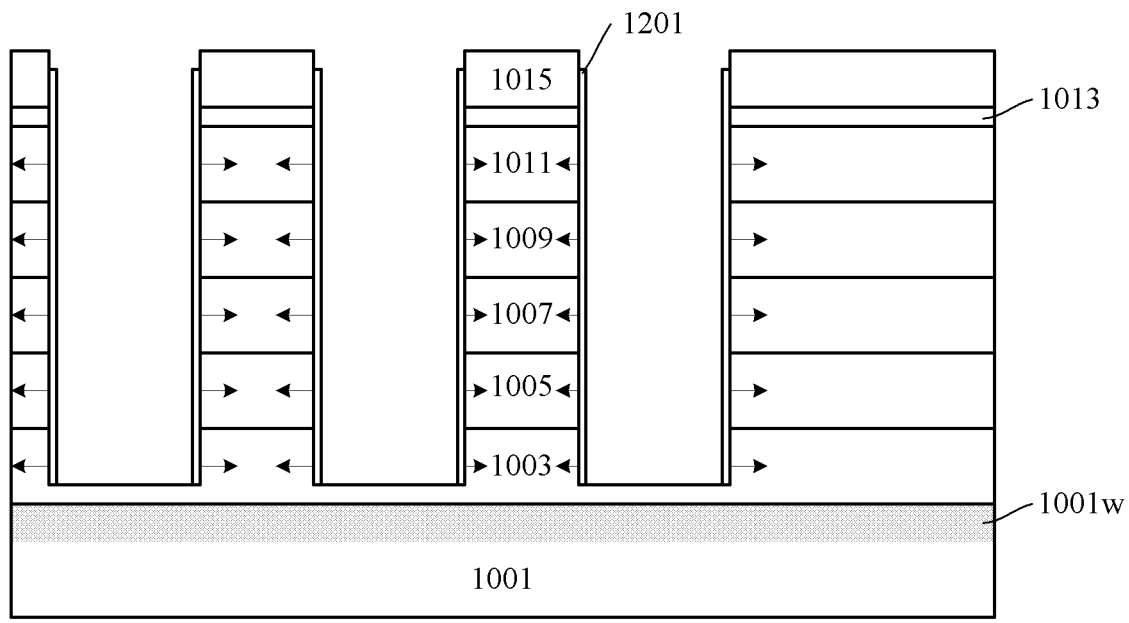
Figure 5B:
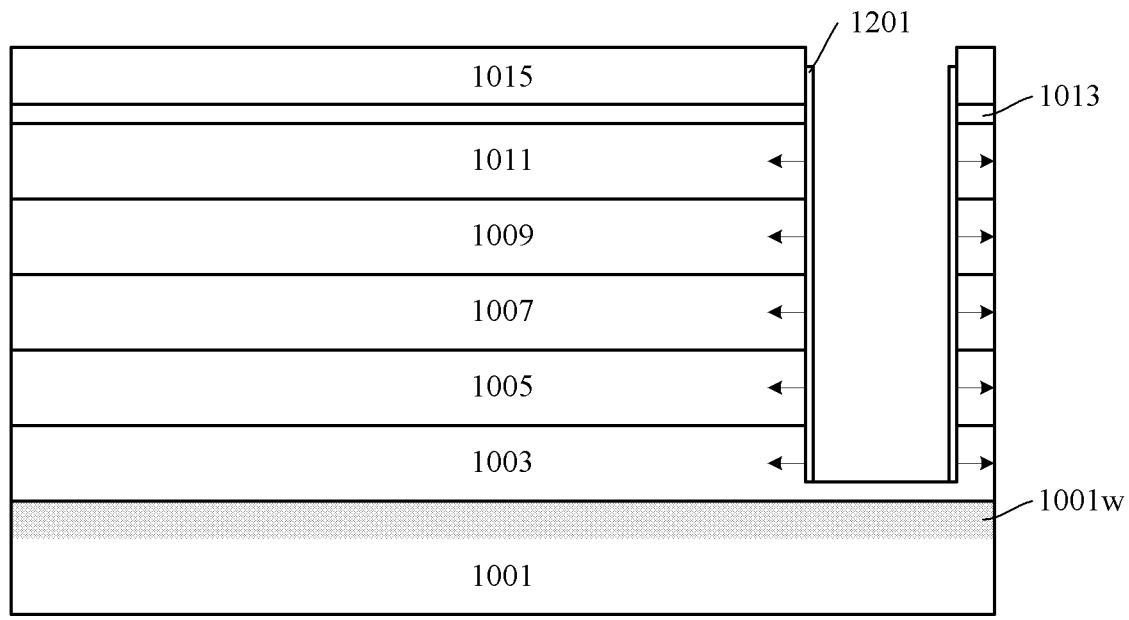

Next, as shown in FIGS. 5(a) and 5(b), the dopant source layer 1201 may be selectively etched by RIE. The RIE may be performed in the direction substantially perpendicular to the substrate surface, so that laterally extending portions of the dopant source layer 1201 may be removed, and vertically extending portions of the dopant source layer 1201 may be left. As a result, the dopant source layer 1201 remains in a form of spacer on sidewalls of the machining holes. Next, an annealing process may be performed to drive the dopants from the dopant source layer 1201 into the channel layers 1005 and 1009, as indicated by arrows in the figures. After that, the dopant source layer 1201 may be removed. Certainly, the dopants may also move into the source/drain layers 1003, 1007 and 1011. The content and an amount of diffusion of the dopants may be controlled, so that the doping conductivity of the source/drain layers 1003, 1007 and 1011 may not be changed.

Here, the drive-in of the dopants may be controlled to some extent, to form a certain lateral concentration distribution in each of the channel layers 1005 and 1009. Here, arrangement of the machining holes and a corresponding diffusion effect will be described with reference to FIGS. 19(a) and 19(b).

Figure 19A:
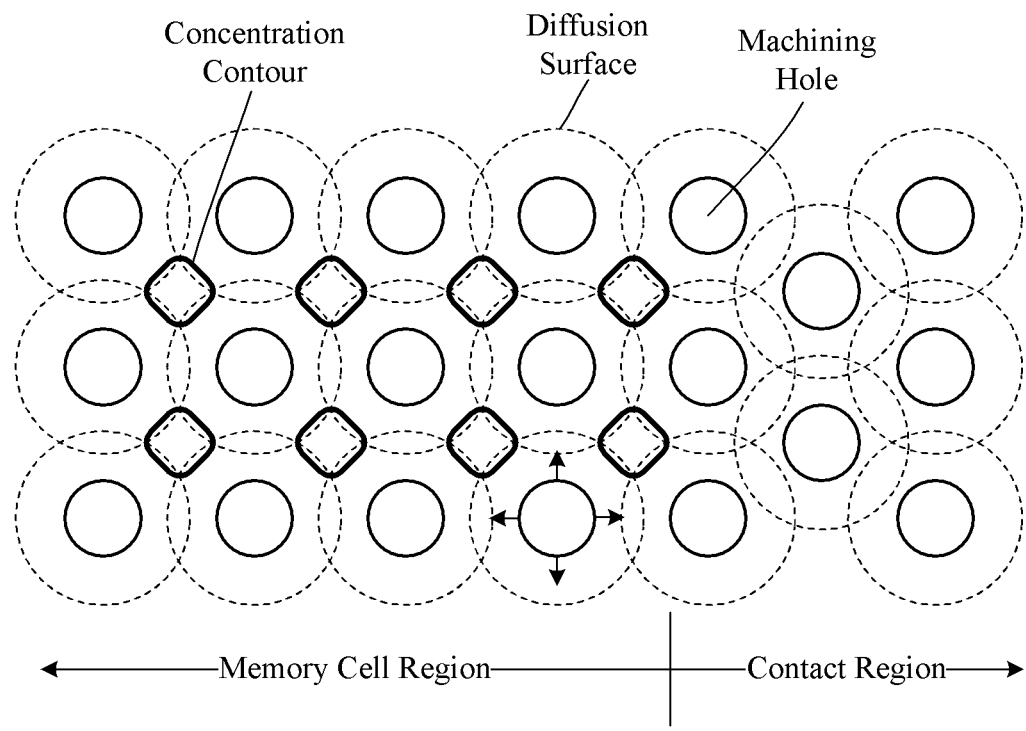
FIGS. 19(a) and 19(b) are schematic views showing arrangement of machining holes according to an embodiment of the present disclosure.

As shown in FIG. 19(a), the substrate may comprise a memory cell region in which the memory cells are to be formed and a contact region in which the electrical contacts are to be formed. Certainly, the substrate may further comprise other regions, such as a circuit region for relevant circuits, or the like.

According to an embodiment of the present disclosure, the machining holes may be provided in the memory cell region at such a density that concentration contours in portions of the channel layers in the memory cell region may define isolated islands after the dopants are driven into the channel layers through the machining holes for a given period of time. The diffusion goes on in all directions from the respective machining holes, as indicated by the arrows in FIG. 19(a). Without considering the directionality (i.e., assuming that the diffusion is isotropic), an extent reached by the diffusion (or a diffusion plane) at any given time point is a circle centered on each of the machining holes, as indicated by dotted circles in the figure. The diffusion extent (i.e., a radius of the circle) may be controlled by an amount of diffusion (for example, diffusion time). By controlling the amount of diffusion, it is possible to have a lateral concentration distribution in each of the channel layers which gradually decreases from the respective machining holes towards positions therebetween. As a result, there may be such concentration contours, outside which there is a relatively high doping concentration, and inside which there is a relatively low doping concentration. The so called "relatively high" and "relatively low" here are determined according to the etching selectivity, that is, a portion with a relatively high doping concentration may be selectively etched with respect to a portion with a relatively low doping concentration. In this example, in a case of Si channel layers and doping with As, the concentration contours may be those with a concentration of, for example, about 1E18-1E19 $cm^{-3}$.

In addition, the machining holes may be provided in the contact region at such a density that substantially all portions of the channel layers in the contact region have a relatively high doping concentration after the given period of time. More specifically, the machining holes are arranged more densely in the contact region than in the memory cell region. Certainly, in order to provide support for the source/drain layers in subsequent processes, the density of the machining holes may be reduced in some areas of the contact region, so that there may be concentration contours in these areas, similar to those in the memory cell region.

Figure 19B:
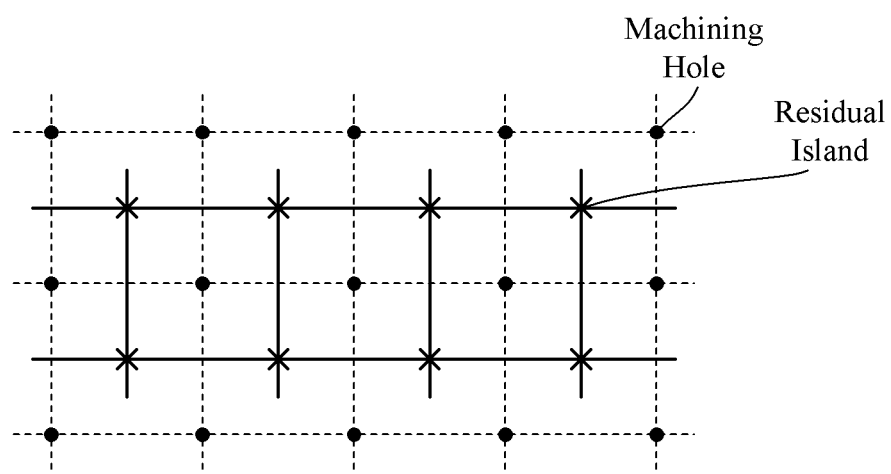

FIG. 19(b) schematically shows a relationship between an array of the machining holes (i.e., a dot array in the figure) and an array of the islands (i.e., an "x" array in the figure) defined by the concentration contours. In a case of a conventional two-dimensional array of memory cells arranged in rows and columns, the machining holes may be arranged in a corresponding two-dimensional array. Both the arrays may be nested with each other. More specifically, each of the islands is located at an approximate center of a corresponding grid of the machining holes, and each of the machining holes is located at an approximate center of a corresponding grid of the islands.

In this example, the grid of the machining holes is quadrilateral. However, the present disclosure is not limited thereto. The grid of the machining holes may also have other shapes, for example, a triangle or other polygons, and a corresponding island may be located approximately at a geometric center thereof. Certainly, the machining holes are not limited to have a circular shape, but may also have other shapes, preferably a regular polygon, which is convenient for layout design.

Figure 6A:
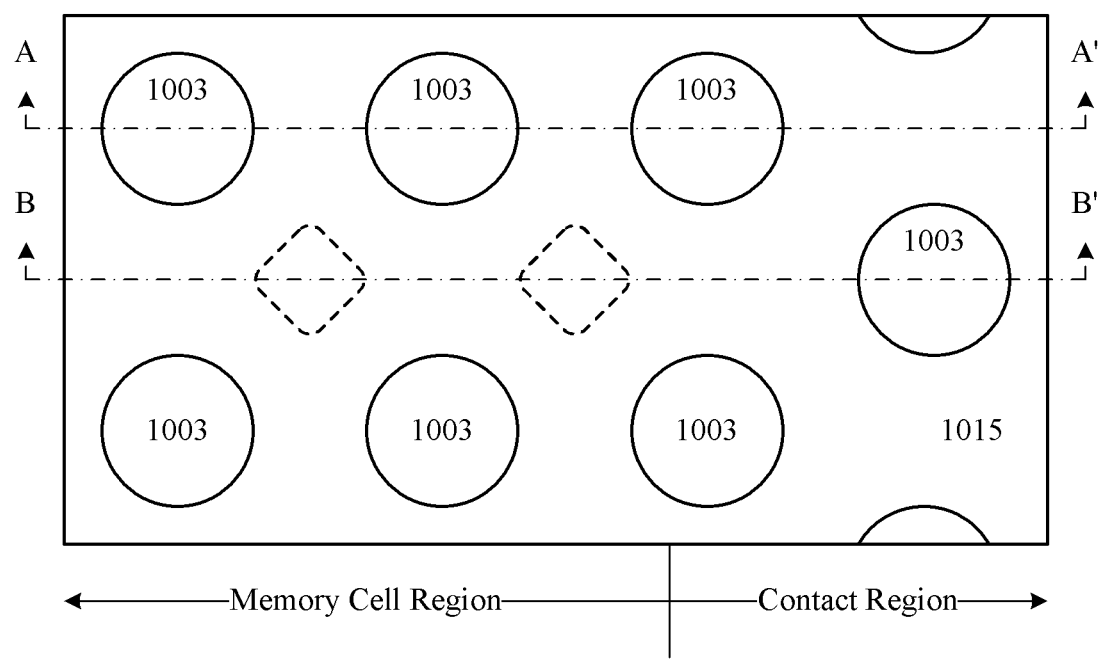
Figure 6B:
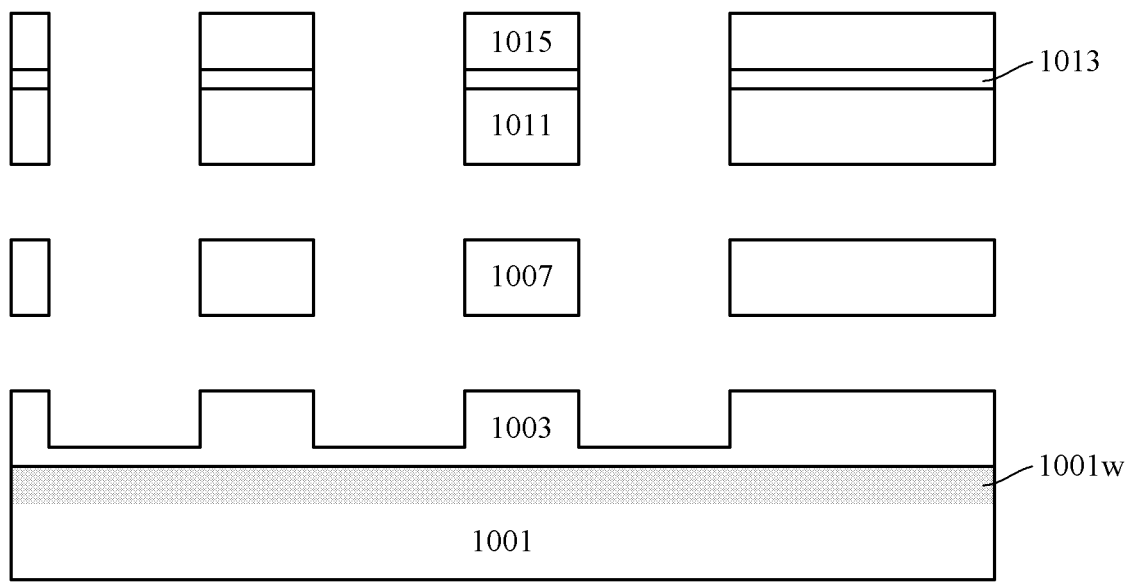
Figure 6C:
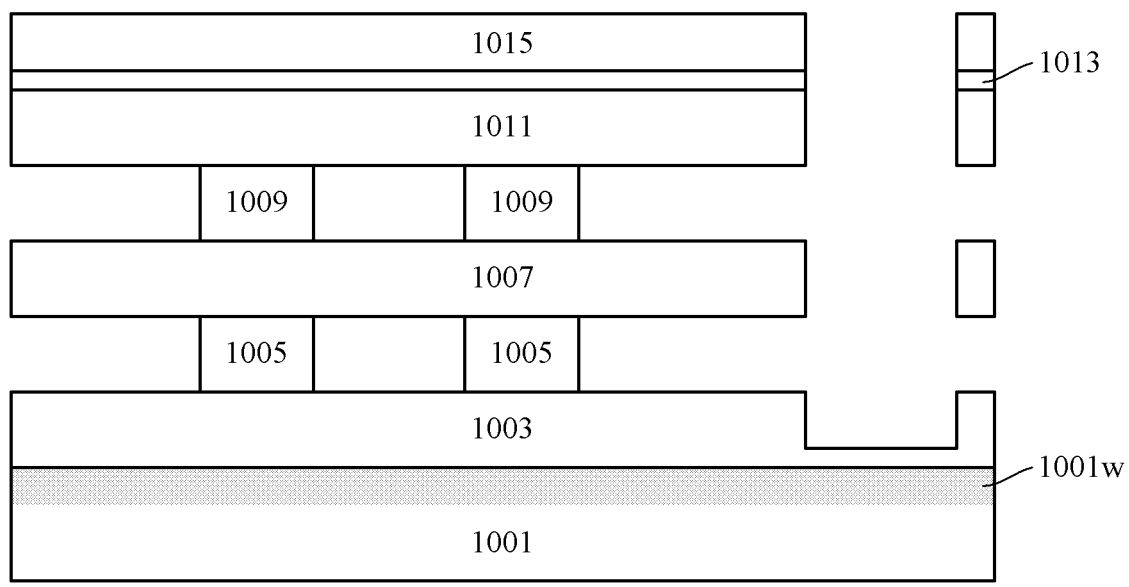

Then, as shown in FIGS. 6(a), 6(b) and 6(c) (FIG. 6(a) is a top view, FIG. 6(b) is a cross-sectional view taken along line AA' in FIG. 6(a), and FIG. 6(c) is a cross-sectional view taken along line BB' in FIG. 6(a)), portions of the channel layers 1005 and 1009 with a relatively high doping concentration may be selectively etched (with respect to the source/drain layers) through the machining holes. For example, a suitable etchant may be selected, so that the portions of the channel layers (of Si in this example) with a relatively high doping concentration is etched (much) more than the source/drain layers (of SiGe in this example) and also the portions of the channel layers with a relatively low doping concentration.

As a result, a plurality of portions corresponding to the above concentration contours (see dotted blocks in the top view of FIG. 6(a), and the cross-sectional view of FIG. 6(c)) which are separated from each other may be formed in each of the channel layers 1005 and 1009, and then may act as cell channel portions for the memory cells.

As described above, most portions of the channel layers 1005 and 1009 are removed after being etched for the certain period of time, so that only some isolated islands remain to act as the cell channel portions (there may also be some islands in the contact region for structural support). As the machining holes pass through the stack vertically, the remaining islands are at almost the same positions in the respective channel layers (centers of the respective grids of the machining holes as shown in FIG. 19(b)), and therefore these islands are substantially aligned with each other in the vertical direction.

In addition, spaces (which are originally occupied by the channel layers) are left between the source/drain layers 1003, 1007 and 1009. Gate stacks may be formed in these spaces. As a result, the gate stacks may be self-aligned to the respective cell channel portions.

Figure 7A:
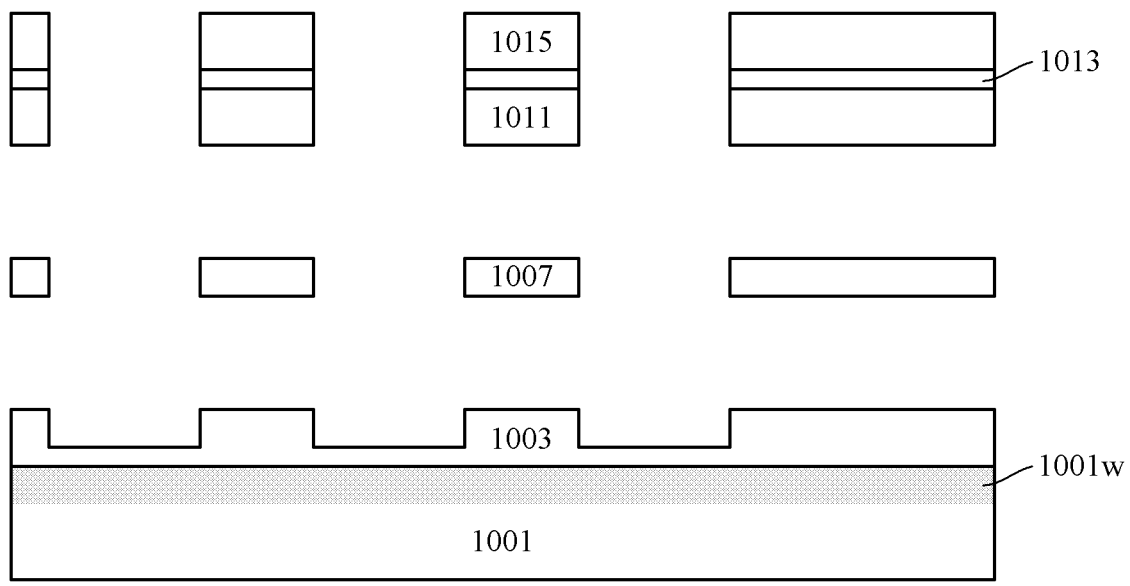
Figure 7B:
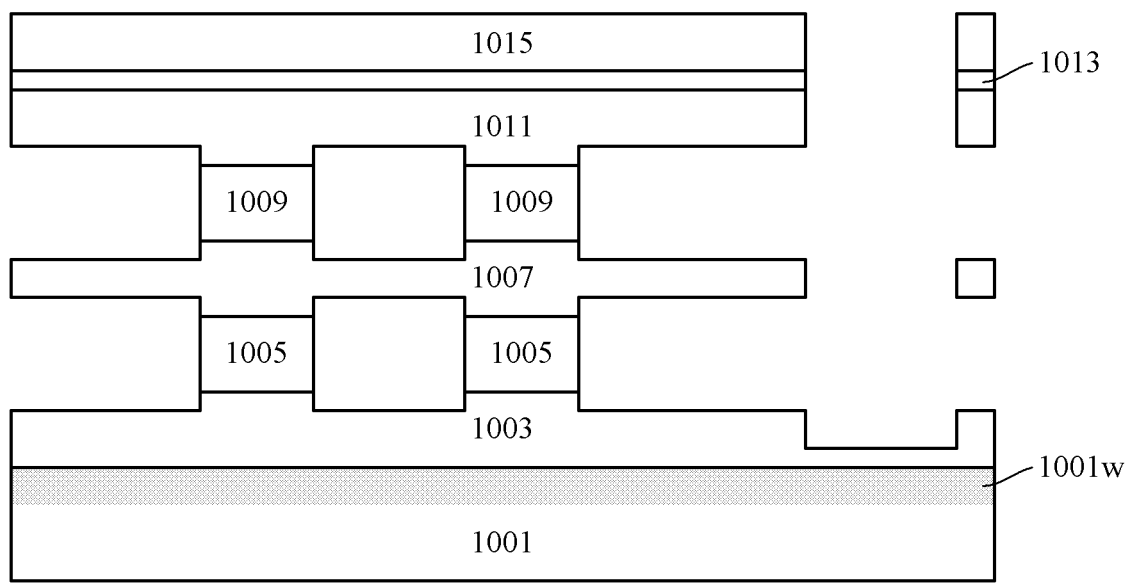

For ease of fabrication, as shown in FIGS. 7(a) and 7(b), the source/drain layers 1003, 1007 and 1011 may be selectively etched (with respect to the channel layers) through the machining holes. Due to the removal of the channel layers so that the spaces are left between the source/drain layers as described above, the etchant may move into these spaces through the machining holes. Therefore, unlike the etching of the channel layers in all directions from the machining holes, this etching step mainly cause the source/drain layers to be reduced in thickness. As a result, gaps between the source/drain layers may be enlarged, which facilitates subsequently filling the gaps.

Figure 8A:
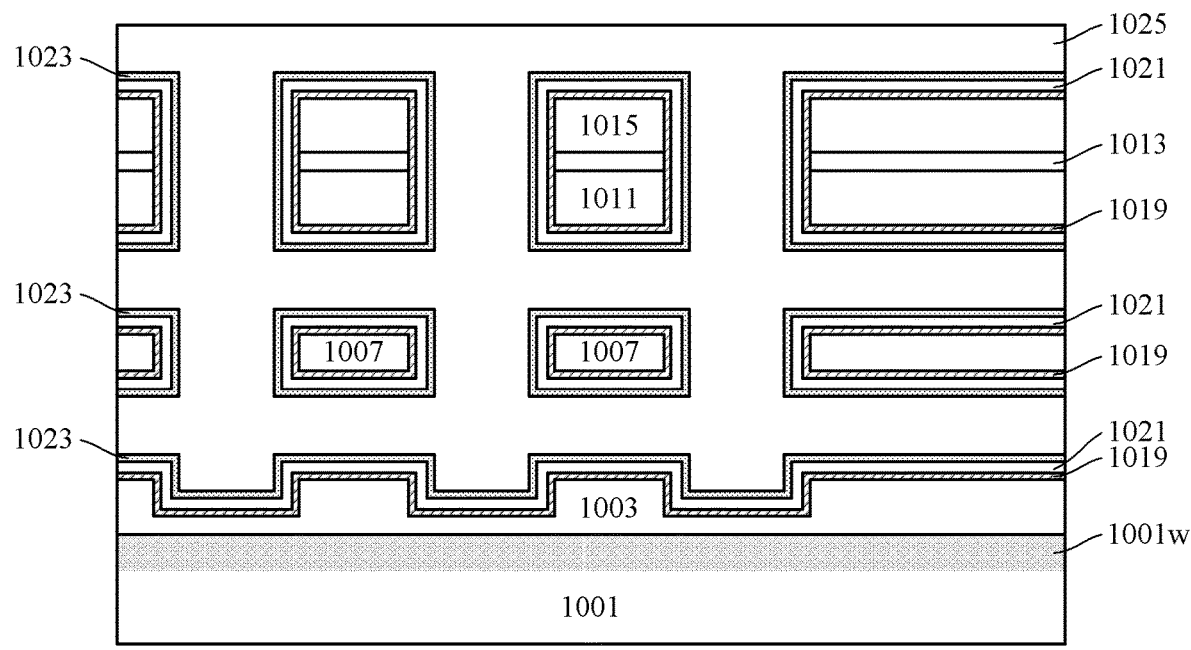
Figure 8B:
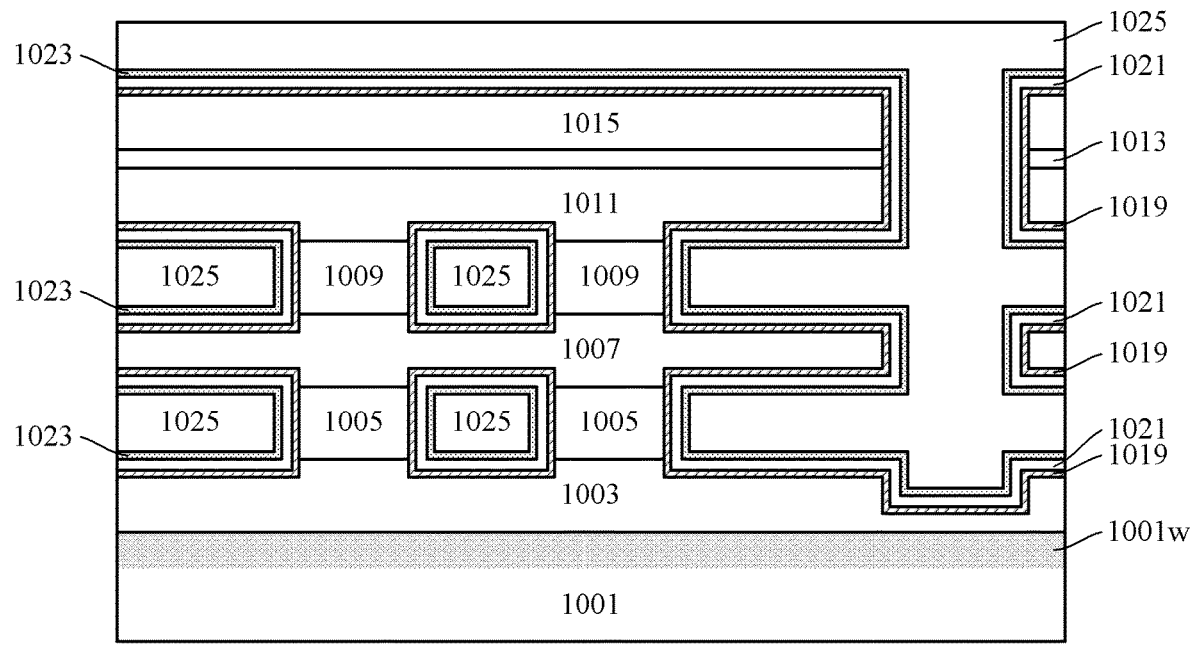

Next, as shown in FIGS. 8(a) and 8(b), storage gate stacks may be formed in the gaps in the stack through the machining holes. For example, a first gate dielectric layer 1019, a floating gate layer or charge trapping layer 1021, a second gate dielectric layer 1023, and a gate conductor layer 1025 may be formed in sequence. For example, the first gate dielectric layer 1019 may comprise high-K gate dielectric such as $HfO_2$, with a thickness of about 1-10 nm, the floating gate layer or charge trapping layer 1021 may comprise a floating gate material such as metal or a charge trapping material such as nitride, with a thickness of about 1-20 nm, the second gate dielectric layer 1023 may comprise high-K gate dielectric such as $HfO_2$, with a thickness of about 1-10 nm, and the gate conductor layer 1025 may comprise a metal gate conductor. Here, the first gate dielectric layer 1019, the floating gate layer or charge trapping layer 1021, and the second gate dielectric layer 1023 are relatively thin and may be formed in a substantially conformal manner, and the gate conductor layer 1025 may be relatively thick to fill up the gaps in the stack. In addition, a work function adjustment layer (not shown) may be further formed between the second gate dielectric layer 1023 and the gate conductor layer 1025.

As shown in FIG. 8(b), the thus formed gate stacks occupy the positions of the channel layers, and thus are self-aligned to the respective cell channel portions 1005 and 1009. Moreover, in one same channel layer, the cell channel portions 1005 or 1009 are separated islands, and all remaining positions in this layer are occupied by the gate stacks. Therefore, in the top view, the gate stacks are integrally formed in that channel layer and surround the respective cell channel portions 1005 or 1009.

Alternatively, the gate stacks may comprise a ferroelectric material. For example, the gate stacks may each comprise a first metal layer, a ferroelectric material layer, a second metal layer, a gate dielectric layer, and a gate conductor layer (not shown) which are stacked in sequence. For example, the ferroelectric material may comprise hafnium oxide such as $HfO_2$, zirconium oxide such as $ZrO_2$, tantalum oxide such as $TaO_2$, hafnium zirconium oxide $Hf_xZr_{1-x}O_2$ (wherein x is in a range of 0 to 1) such as $Hf_{0.5}Zr_{0.5}O_2$, hafnium tantalum oxide $Hf_xTa_{1-x}O_2$ (wherein x is in a range of 0 to 1) such as $Hf_{0.5}Ta_{0.5}O_2$, Si-containing $HfO_2$, Al-containing $HfO_2$, $BaTiO_3$, $KH_2PO_4$ or SBTi, and the first metal layer and the second metal layer may each comprise TiN. In this case, the first metal layer, the ferroelectric material layer, the second metal layer, and the gate dielectric layer may be formed in sequence through the machining holes. These layers may be relatively thin, and may be formed in a substantially conformal manner. In addition, the gate conductor layer may be formed through the machining holes, and may be relatively thick so as to fill up the gaps in the stack.

Figure 9A:
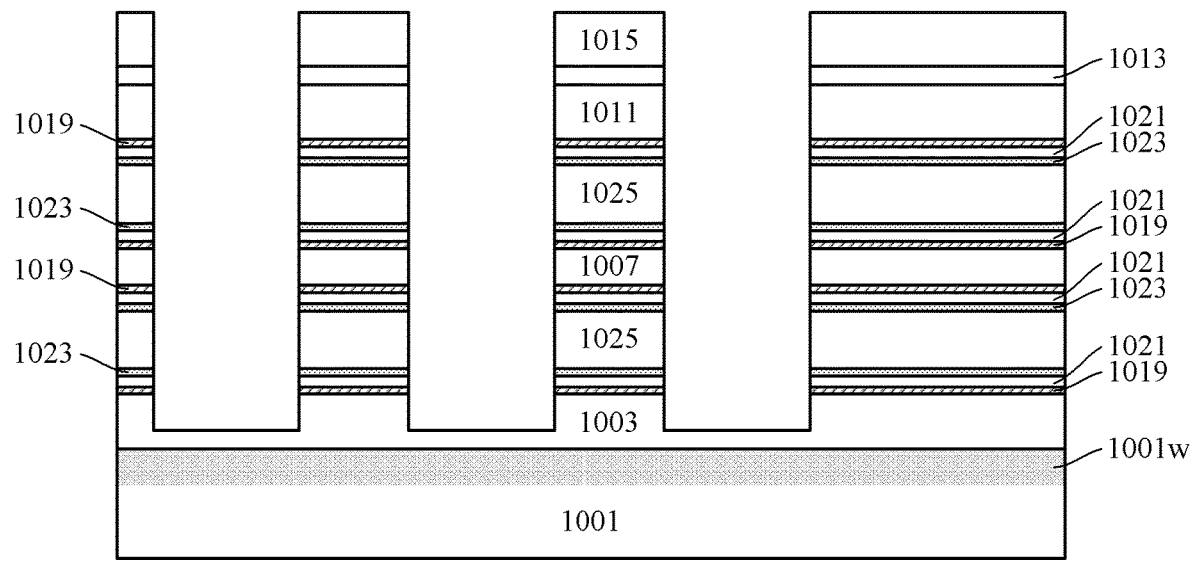
Figure 9B:
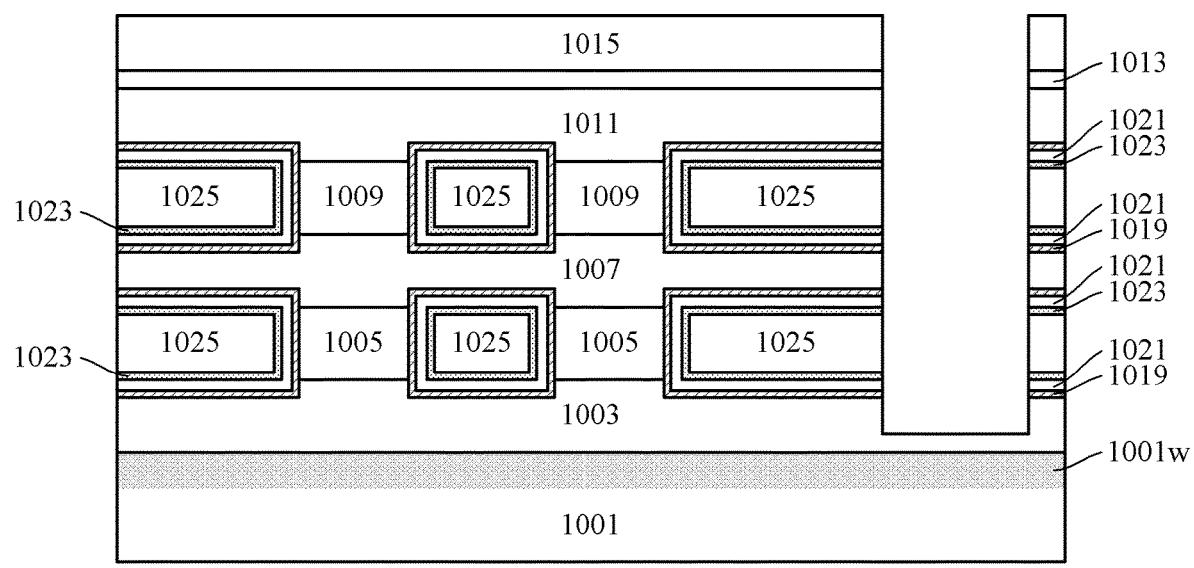

The machining holes are also filled with the gate stacks. For further operations, the machining holes may be emptied, as shown in FIGS. 9(a) and 9(b). Specifically, the gate conductor layer 1025, the second gate dielectric layer 1023, the floating gate layer or charge trapping layer 1021 and the first gate dielectric layer 1019 may be selectively etched in sequence by, for example, RIE. Due to the presence of the hard mask 1015, the gate stacks in the machining holes are removed, while the gate stacks at remaining positions, particularly in the memory cell region, remain.

Figure 10A:
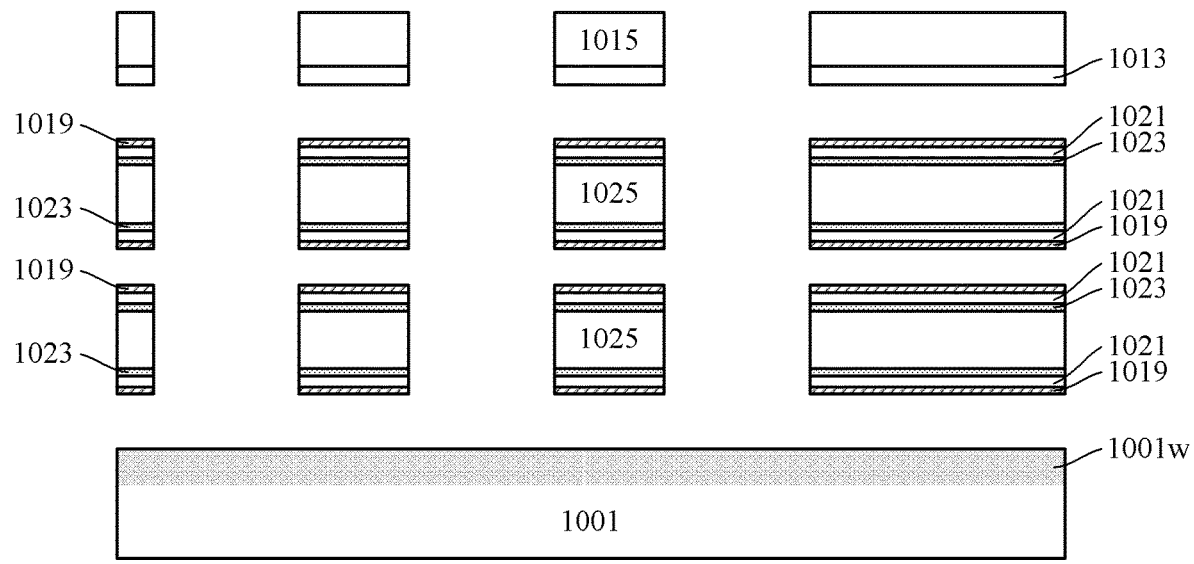
Figure 10B:
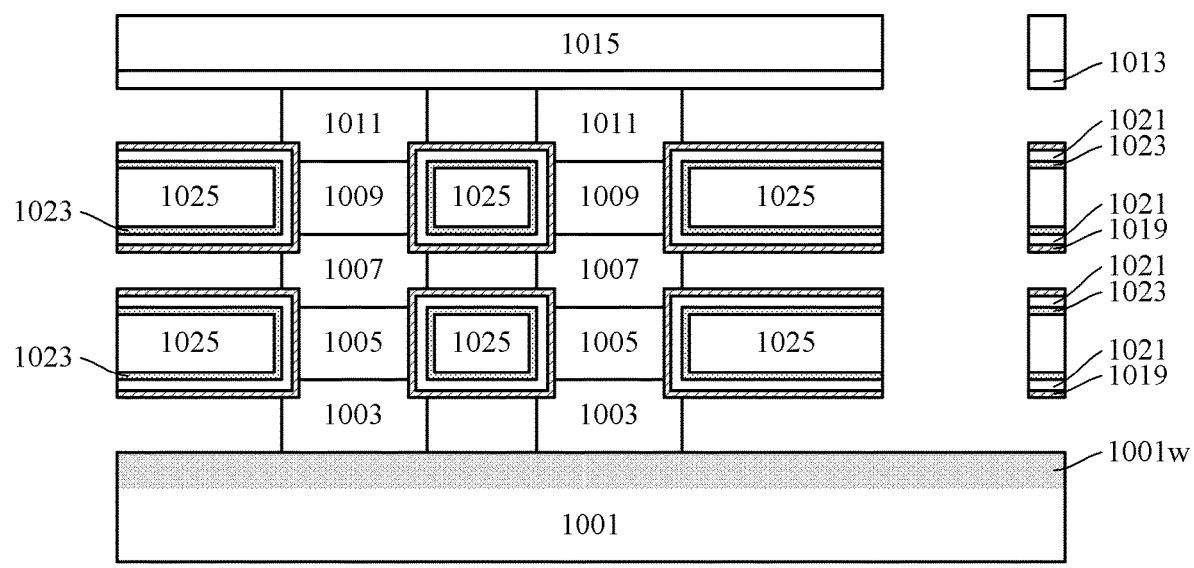

Next, source/drain portions may be separated for the respective memory cells. As shown in FIGS. 10(a) and 10(b), the source/drain layers 1003, 1007 and 1011 may be selectively etched (with respect to the channel layers and the gate stacks) through the machining holes. Reference may also be made to FIG. 19(a). The etching goes on in all directions from the respective machining holes, as indicated by the arrows in FIG. 19(a). Without considering the directionality (i.e., assuming that the etching is isotropic), an extent reached by the etching at any given time point is a circle centered on each of the machining holes, as indicated by dotted circles in the figure. The etching extent (i.e., a radius of the circle) may be controlled by an amount of etching (for example, etching time). By controlling the amount of etching, the etching extent from the respective machining holes may define residual islands between the machining holes. In addition, the machining holes may have a relatively great density in the contact region, so that substantially all portions of the source/drain layers in the contact region may be removed.

Certainly, in order to better control the etching of the source/drain layers, dopants may be similarly driven into the source/drain layers. For example, in the structure illustrated in FIGS. 9(a) and 9(b), a dopant source layer may be formed on the sidewalls of the machining holes and the dopants may be driven into the source/drain layers by annealing. The dopants may have the same conductivity as the source/drain layers. For example, for the n-type devices, n-type dopants such as As or P may be used with a content of about 0.01%-5%; and for the p-type devices, p-type dopants such as B may be used with a content of about 0.01%-5%. After that, the dopant source layer may be removed. The drive-in of the dopants may form a doping distribution in the source/drain layers as described above in connection with FIGS. 19(a) and 19(b) to facilitate forming the isolated islands in the source/drain layers. Certainly, the dopants may also move into the channel layers 1005 and 1009. The content and an amount of diffusion of the dopants may be controlled, so that the doping conductivity of the channel layers 1005 and 1009 may not be changed.

As a result, in each of the source/drain layers 1003, 1007 and 1011, some separated islands remain, which then act as cell source/drain portions for the memory cells. As described above, the positions of these islands are determined by the positions of the machining holes, and therefore are substantially the same as those of the cell channel portions. That is, the cell source/drain portions are substantially aligned with the cell channel portions in the vertical direction. In addition, the amount of etching of the source/drain layers 1003, 1007 and 1011 may be relatively small, so that the cell channel portions are laterally recessed with respect to respective cell source/drain portions.

For the p-type devices, Si is strained after RIE, because SiGe has a greater lattice constant than Si without being strained. The strain will cause a mobility of holes in Si to become greater than that if without the strain, or cause an effective mass of light holes in Si to become smaller than that if without the strain, or cause a concentration of the light holes in Si to become greater than that if without the strain, so that the p-type devices will have an increased ON current and thus has their performances improved. Alternatively, for the n-type devices, Si is strained after RIE, because Si:C has a smaller lattice constant than Si without being strained. The strain will cause a mobility of electrons in Si to become greater than that if without the strain, or cause an effective mass of the electrons in Si to become smaller than that if without the strain, so that the n-type devices will have an increased ON current and thus has their performances improved.

In addition, if SiGe is selected to be used for the channel layers and Si is selected to be used for the source/drain layers, this selection will result in not only an increased ON current but also a reduced OFF current for the p-type devices, so that the performances of the p-type devices are improved. This is because Si has a forbidden band gap greater than that of SiGe, and the mobility of holes in SiGe is higher than that in Si.

As shown in FIG. 10(b), the islands in the respective source/drain layers and the respective channel layers which are aligned in the vertical direction form a series of pillar-shaped active regions (1003/1005/1007/1009/1011). These pillar-shaped active regions form an array as indicated by "x" in FIG. 19(b). Multiple layers of the storage gate stacks (1019/1021/1023/1025) are formed around the respective pillar-shaped active regions. As described above, each layer of the storage gate stacks is self-aligned to the channel layer 1005 or 1009 at a corresponding level.

Therefore, vertical strings of memory cells are formed in the memory cell region, and each of the memory cells comprises a cell source/drain portion, a cell channel portion, and a further cell source/drain portion which are stacked in sequence. As adjacent ones of the memory cells have a shared cell source/drain portion therebetween, the memory cells in each of the strings are connected to each other in series.

In this way, the memory cells are manufactured in the memory cell region. However, at this point, spaces in the machining holes are wasted. In order to avoid such a waste, additional memory cells may be further formed in the machining holes according to an embodiment of the present disclosure. For example, this can be done as follows.

Figure 11A:
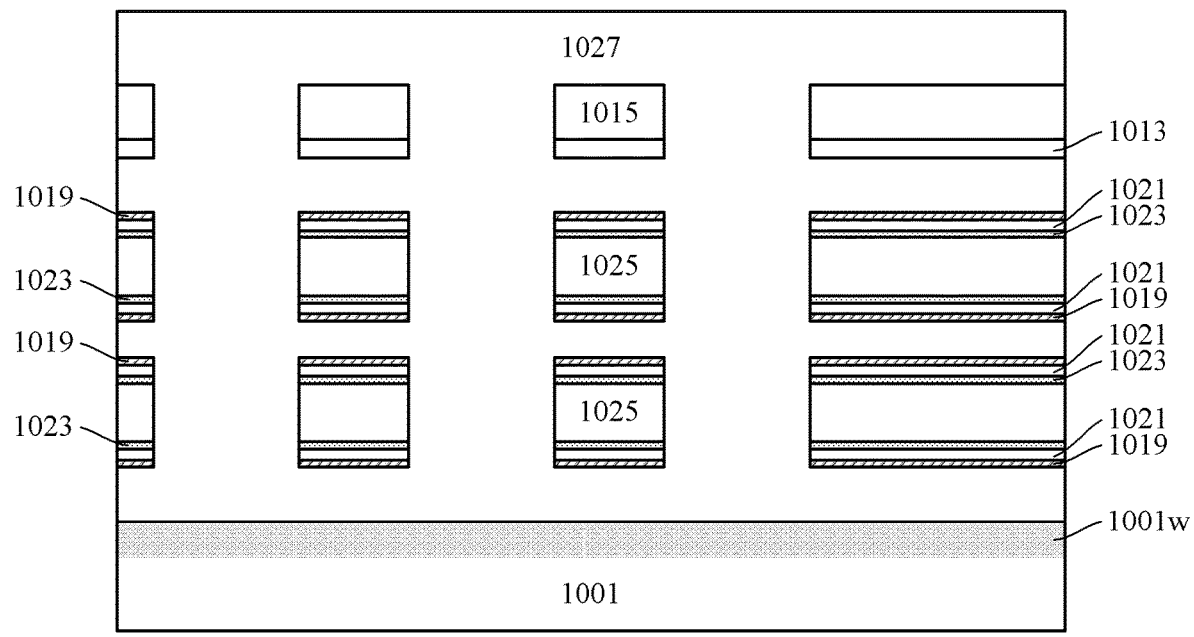
Figure 11B:
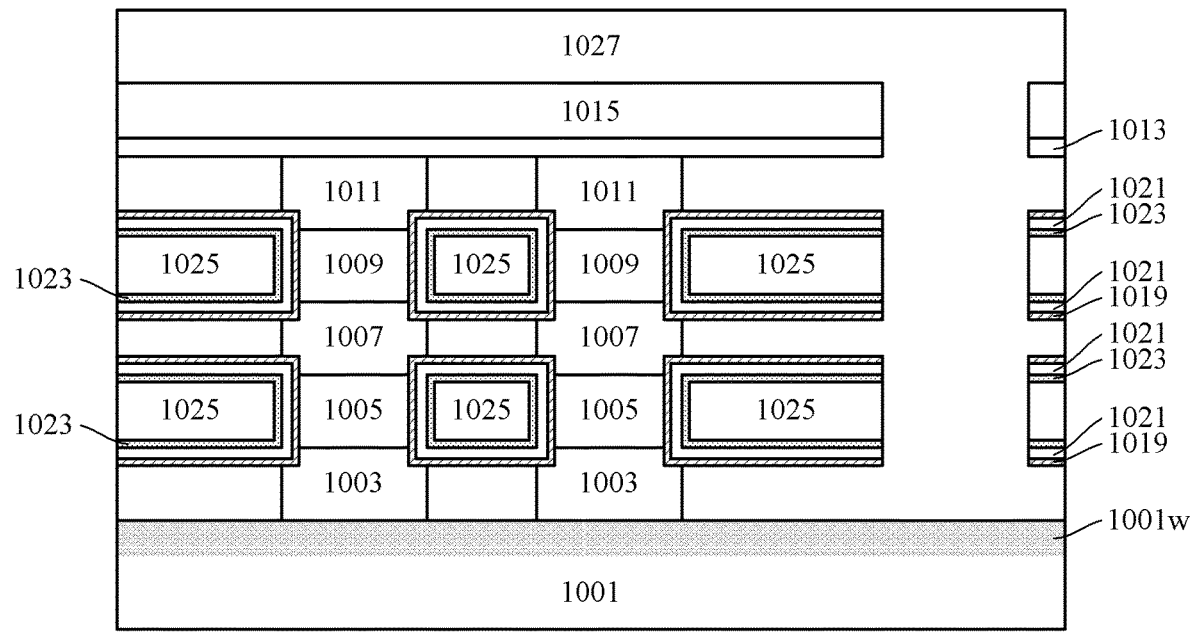

As there are still a lot of gaps in the stack as shown in FIGS. 10(a) and 10(b), a dielectric material may be filled therein to achieve structural support and required electrical isolation. For example, as shown in FIGS. 11(a) and 11(b), a dielectric material may be filled in the gaps in the stack through the machining holes to form an interlayer dielectric layer 1027. For example, oxide may be deposited by, for example, ALD or the like. Here, the interlayer dielectric layer 1027 preferably extends beyond a top surface of the hard mask 1015 and may be planarized by, for example, Chemical Mechanical Polishing (CMP).

Figure 12A:
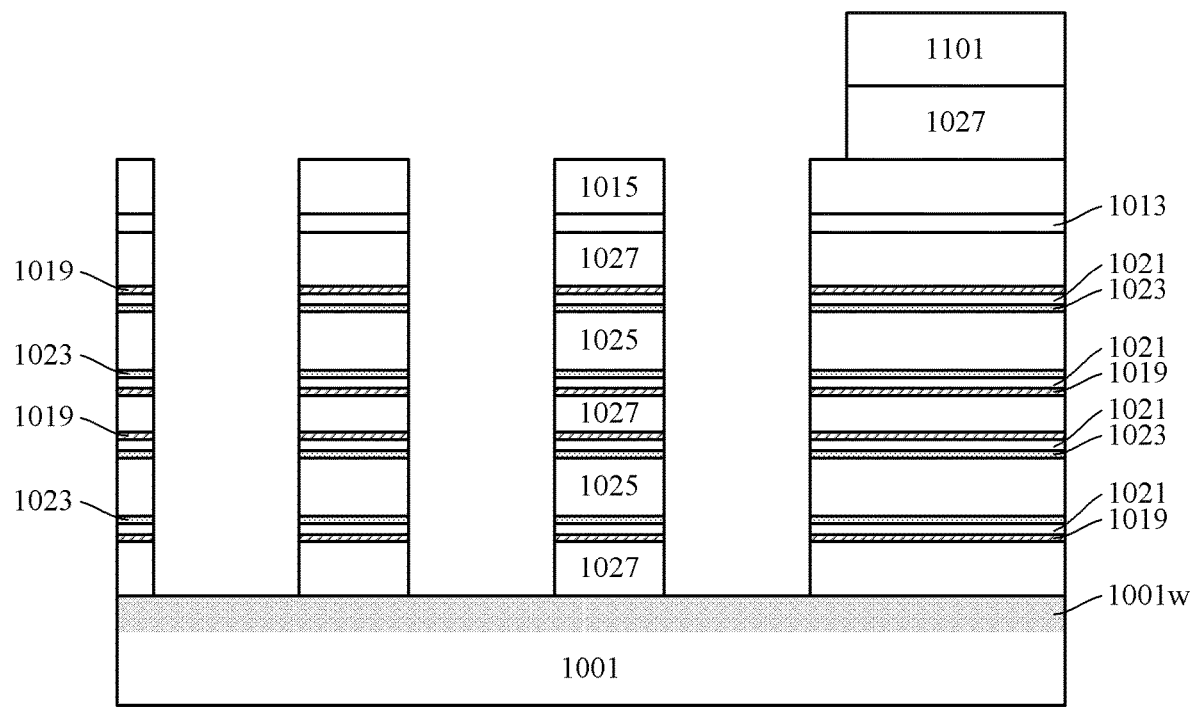
Figure 12B:
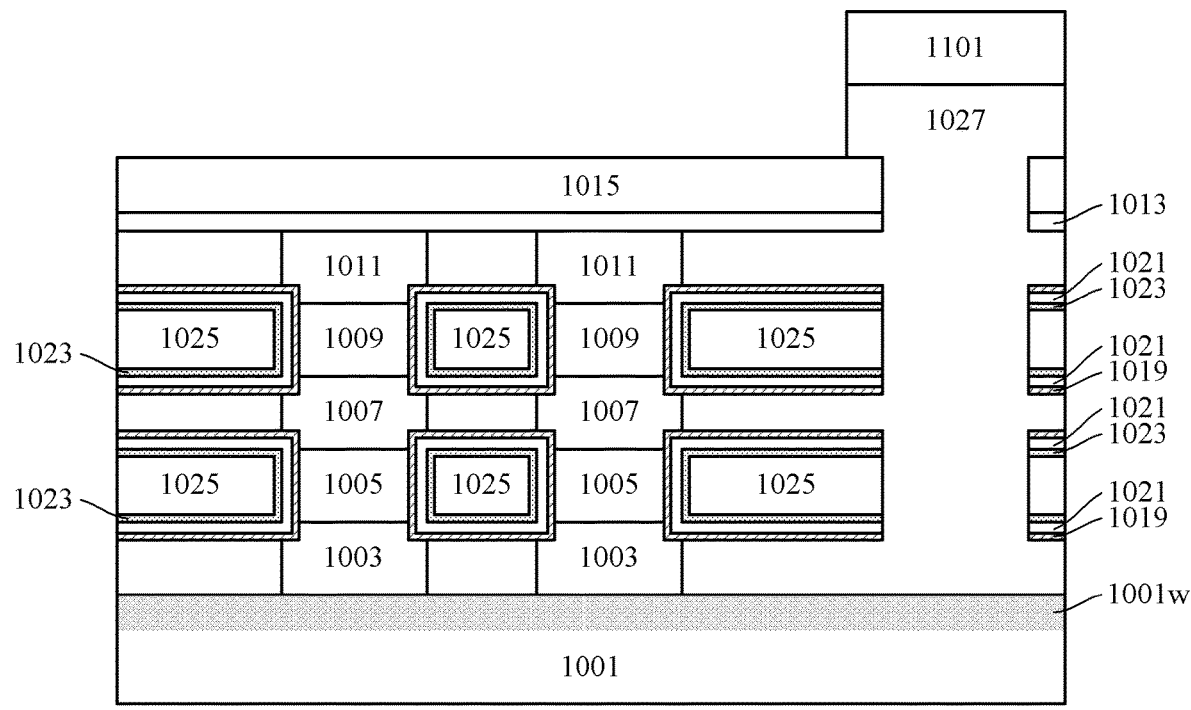
Figure 12C:
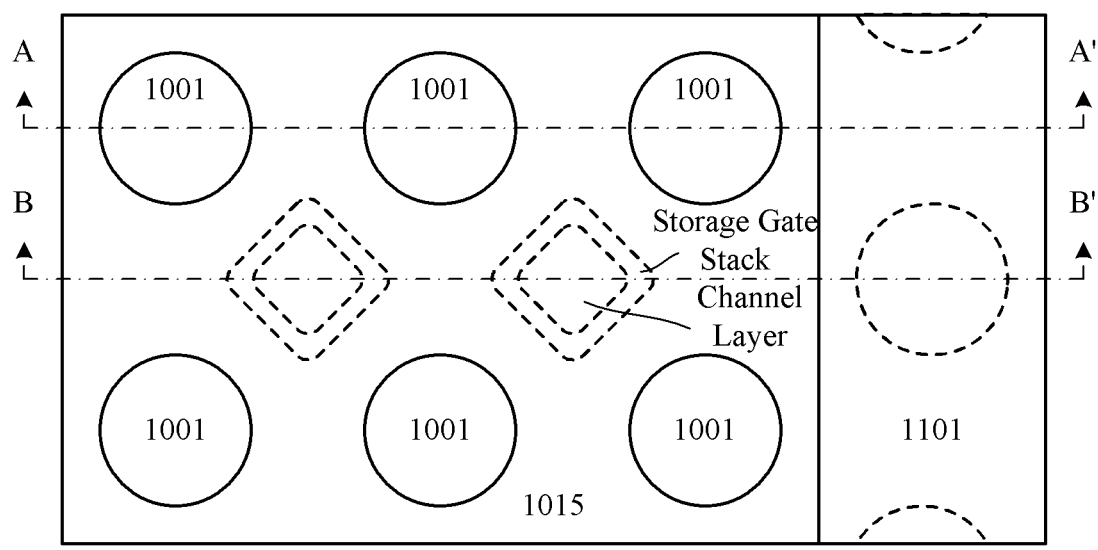

The machining holes are also filled with the interlayer dielectric layer 1027. In order to manufacture additional memory cells in the machining holes, the machining holes may be emptied. In addition, it is desired to form additional memory cells in the memory cell region, but not in the contact region, and therefore it suffices to empty only the machining holes in the memory cell region. To this end, as shown in FIGS. 12(a), 12(b) and 12(c) (FIG. 12(a) is a cross-sectional view taken along line AA' in FIG. 12(c), FIG. 12(b) is a cross-sectional view taken along line BB' of FIG. 12(c), and FIG. 12(c) is a top view), photoresist 1101 may be formed to cover the contact region (particularly the machining holes therein), while exposing the memory cell region. Then, the interlayer dielectric layer 1027 may be selectively etched by, for example, RIE. Then, the machining holes are exposed. After that, the photoresist 1101 may be removed.

Figure 13A:
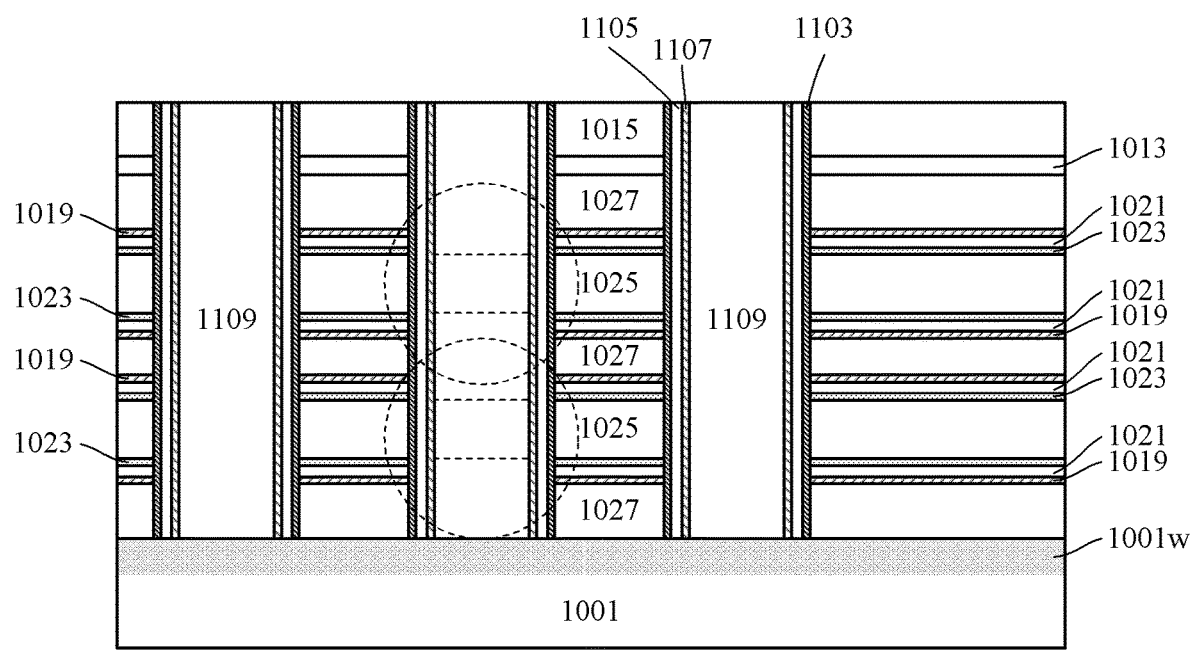
Figure 13B:
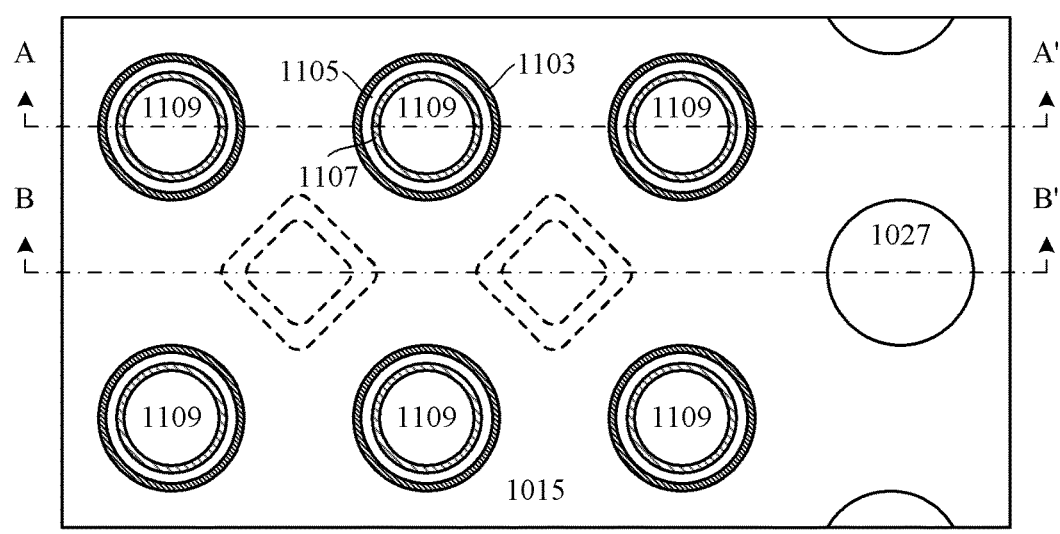

Then, as shown in FIGS. 13(a) and 13(b) (FIG. 13(a) is a sectional view taken along line AA' in FIG. 13(b), and FIG. 13(b) is a top view), additional vertical memory cells may be formed in the machining holes. For example, an additional first gate dielectric layer 1103, an additional charge trapping layer 1105, and an additional second gate dielectric layer 1107 may be formed in sequence around the sidewalls of the machining holes. Those layers extend over the sidewalls of the machining holes, and may be formed by, for example, a spacer formation process. For example, the additional first gate dielectric layer 1103 may comprise high-K gate dielectric such as $HfO_2$, with a thickness of about 1-10 nm, the additional charge trapping layer 1105 may comprise a charge trapping material such as nitride, with a thickness of about 1-20 nm, and the additional second gate dielectric layer 1107 may comprise high-K gate dielectric such as $HfO_2$, with a thickness of about 1-10 nm. As shown in the top view of FIG. 13(b), these layers may be formed as a structure of concentric rings (around an active semiconductor layer 1109 to be formed later). Then, the remaining spaces in the machining holes may be filled with the active semiconductor layer 1109. For example, polysilicon may be deposited in the machining holes to excessively fill up the machining holes. The polysilicon may be in-situ doped to a doping concentration of, for example, about 1E17-1E19 $cm^{-3}$, while it is being deposited. Then, the filled polysilicon may be planarized by, for example, CMP, and the CMP may be stopped at the nitride layer 1015. Then, the active semiconductor layer 1109 is formed in the machining holes.

Here, the active semiconductor layer 1109 is solid. However, the present disclosure is not limited thereto. For example, a thin active semiconductor layer in a hollow structure (not shown) with a thickness of, for example, about 10-20 nm, may be formed on the additional second gate dielectric layer 1107 in order to better suppress the short channel effects and improve the device performances. The hollow structure may then be filled up with a dielectric material such as oxide or nitride.

The respective gate conductor layers 1025 may define channel regions in the active semiconductor layer 1109 via the additional second gate dielectric layer 1107, the additional charge trapping layer 1105, and the additional first gate dielectric layer 1103, as indicated by the dotted blocks in the figure. Source/drain regions may be formed on opposite sides of the respective channel regions (for example, at positions corresponding to the interlayer dielectric layer 1027, that is, positions where the original source/drain layers were located). Then, each of the channel regions and the source/drain regions on upper and lower sides thereof form an additional memory cell, as indicated by the dotted circles in FIG. 13(a). The gate conductor layers 1025 are stacked in multiple levels on the substrate, resulting in a plurality of stacked additional memory cells in the vertically extending active semiconductor layer 1109, with their respective active regions extending integrally and thus connected to each other in series.

As shown in FIGS. 13(a) and 13(b), since the semiconductor layer 1109 forms a series of pillar-shaped active regions, these pillar-shaped active regions form an array as indicated by "•" in FIG. 19(b). Multiple layers of storage gate stacks (1107/1105/1103/1025) are formed around the respective pillar-shaped active regions. Here, the storage gate stacks are defined in layers by the gate conductor layer 1025, though some portions thereof 1107/1105/1103 extend integrally around a surface of the respective pillar-shaped active regions 1109.

Alternatively, the storage gate stacks of the additional memory cells may comprise a ferroelectric material. For example, the gate stacks may each comprise a first metal layer, a ferroelectric material layer, a second metal layer, a gate dielectric layer, and a gate conductor layer (not shown) which are stacked in sequence. For example, the ferroelectric material may comprise hafnium oxide such as $HfO_2$, zirconium oxide such as $ZrO_2$, tantalum oxide such as $TaO_2$, hafnium zirconium oxide $Hf_xZr_{1-x}O_1$ (wherein x is in a range of 0 to 1) such as $Hf_{0.5}Zr_{0.5}O_2$, hafnium tantalum oxide $Hf_xTa_{1-x}O_2$ (wherein x is in a range of 0 to 1) such as $Hf_{0.5}Ta_{0.5}O_2$, Si-containing $HfO_2$, Al-containing $HfO_2$, $BaTiO_3$, $KH_2PO_4$ or SBTi, and the first metal layer and the second metal layer may each comprise TiN. In this case, the gate dielectric layer, the second metal layer, the ferroelectric material layer and the first metal layer may be formed in sequence on the sidewalls of the machining holes, each in a form of, for example, spacer. In addition, an active semiconductor layer such as polysilicon may be filled in a space surrounded by these layers.

In this way, the memory cells are manufactured in the memory cell region. Subsequently, various electrical contacts may be manufactured to achieve desired electrical connections.

In addition, if the islands of the channel layers for structural support are formed in the contact region as described above, these islands of the channel layers may be removed to reduce capacitance or possible leakage between gates. For example, the machining holes in the contact region may be emptied, the isolation layer may be removed through the machining holes, and then the islands of the channel layers are removed. Subsequently, a dielectric material is further filled through the machining holes to complete the isolation layer.

Figure 14A:
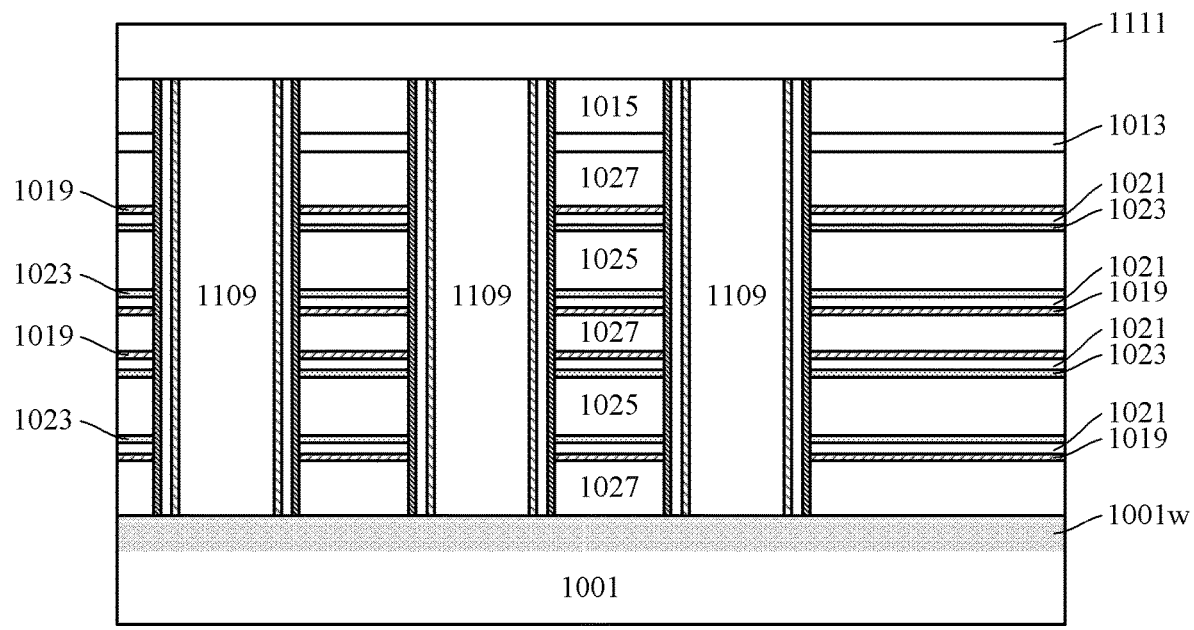
Figure 14B:
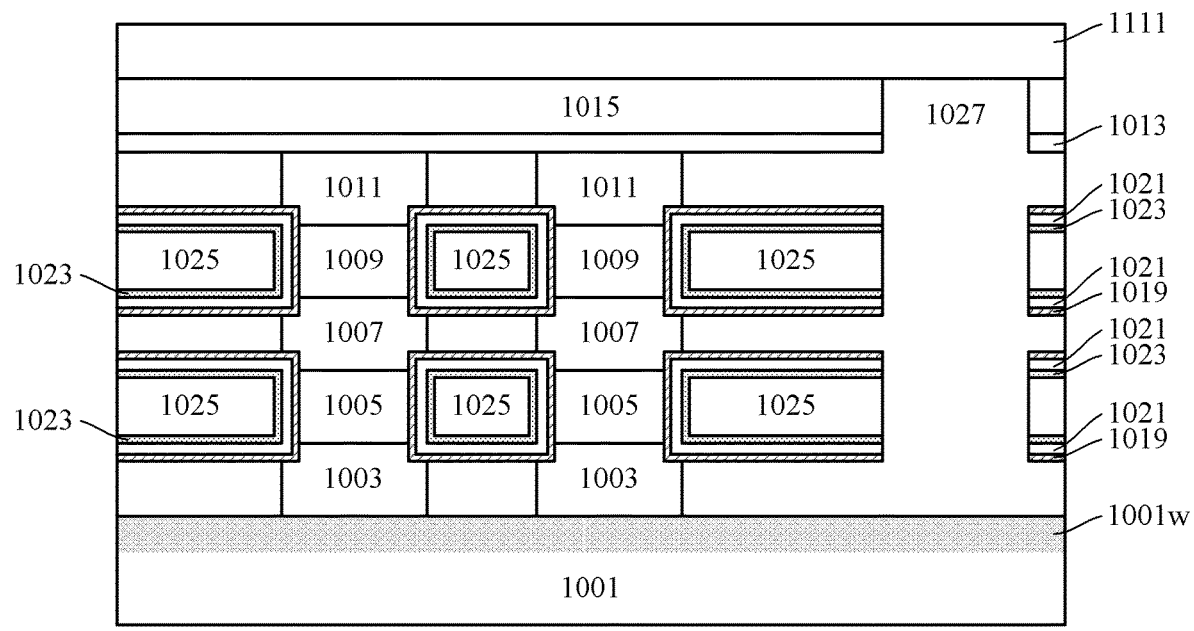

In order to protect the memory cells, particularly the additional memory cells formed in the machining holes (since upper ends thereof are currently exposed), as shown in FIGS. 14(a) and 14(b) (FIGS. 14(a) and 14(b) are sectional views taken along lines AA' and BB' in FIG. 13(b), respectively), a protection layer 1111 may be formed on the structure shown in FIGS. 13(a) and 13(b). For example, nitride with a thickness of about 5-150 nm may be deposited to form the protection layer 1111.

Next, electrical contacts may be formed in the interlayer dielectric layer 1027. For a three-dimensional array, there are various ways in the art to make interconnections. For example, the gate stacks in the contact region may be patterned to have a stepped structure, to form electrical contacts to the respective layers of the gate stacks. A specific example will be described below.

Figure 15A:
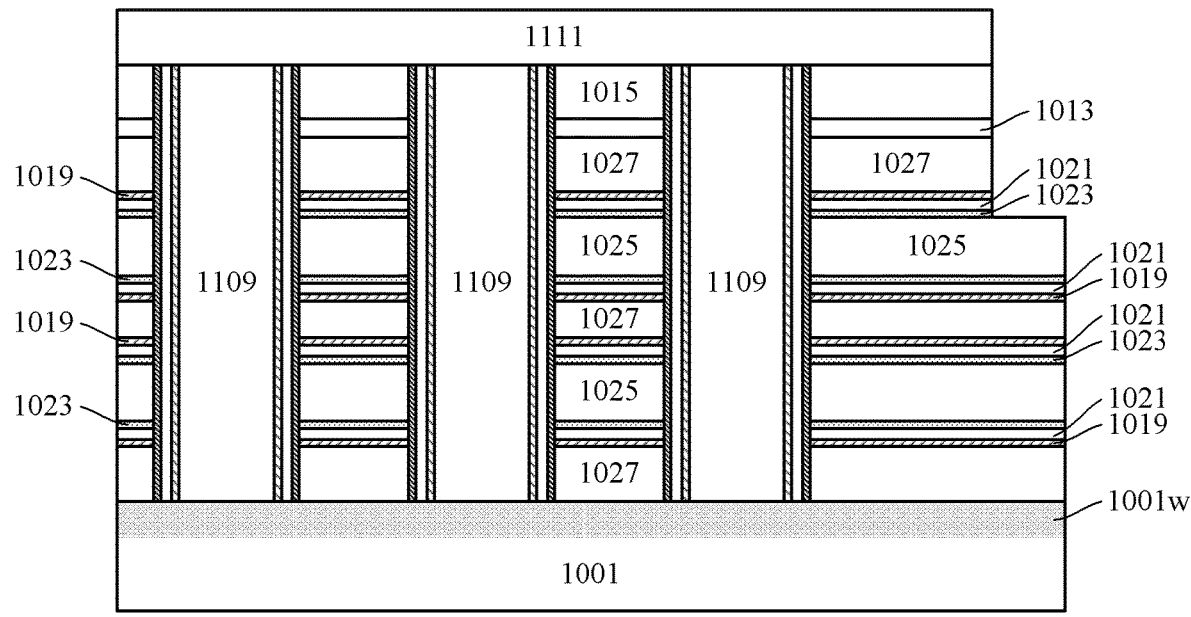
Figure 15B:
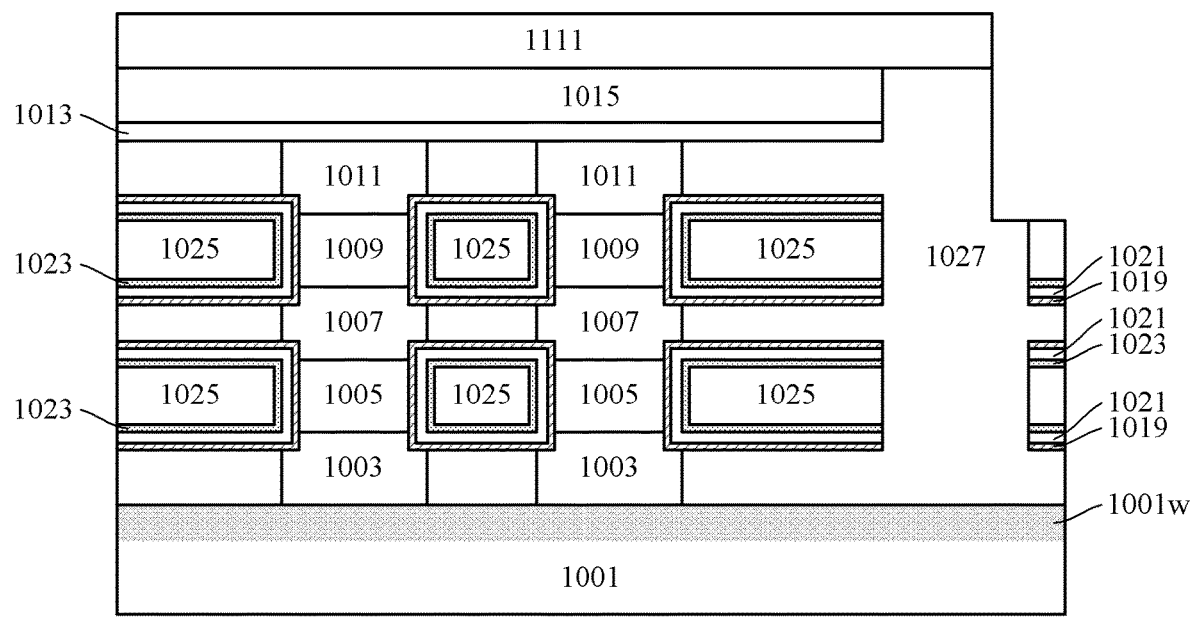
Figure 16A:
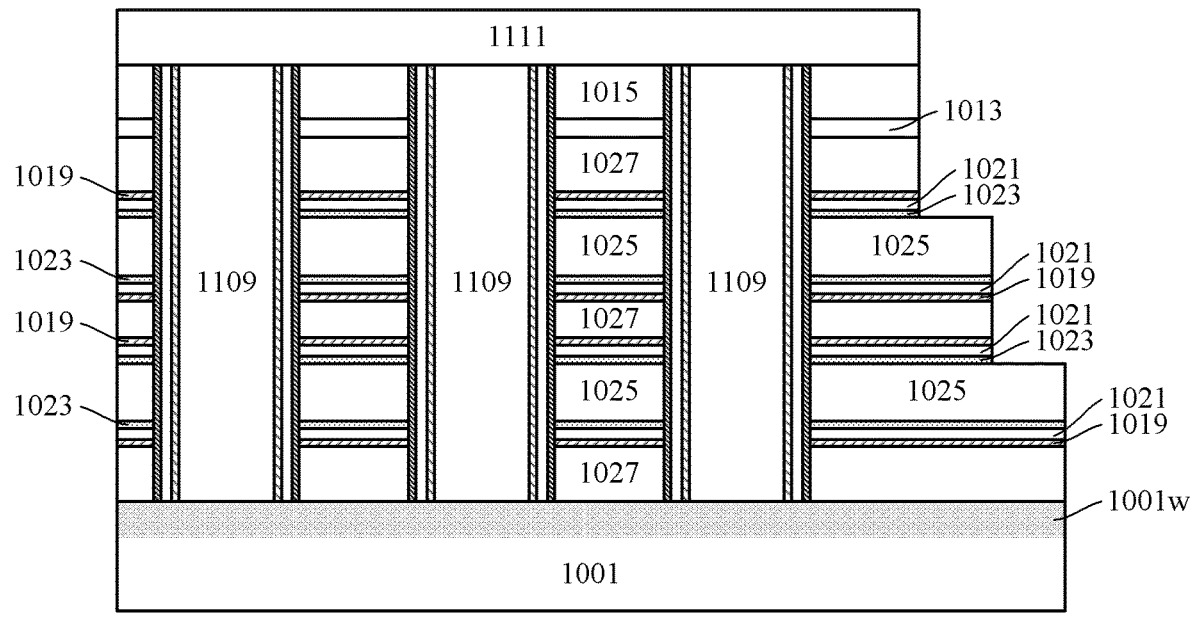
Figure 16B:
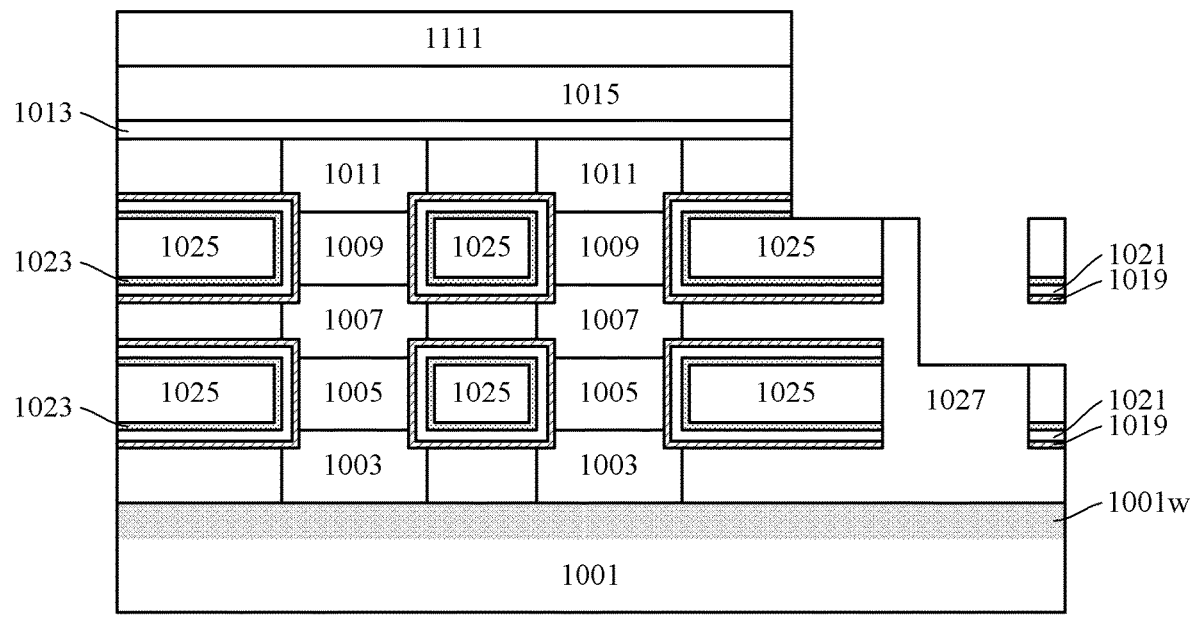
Figure 17A:
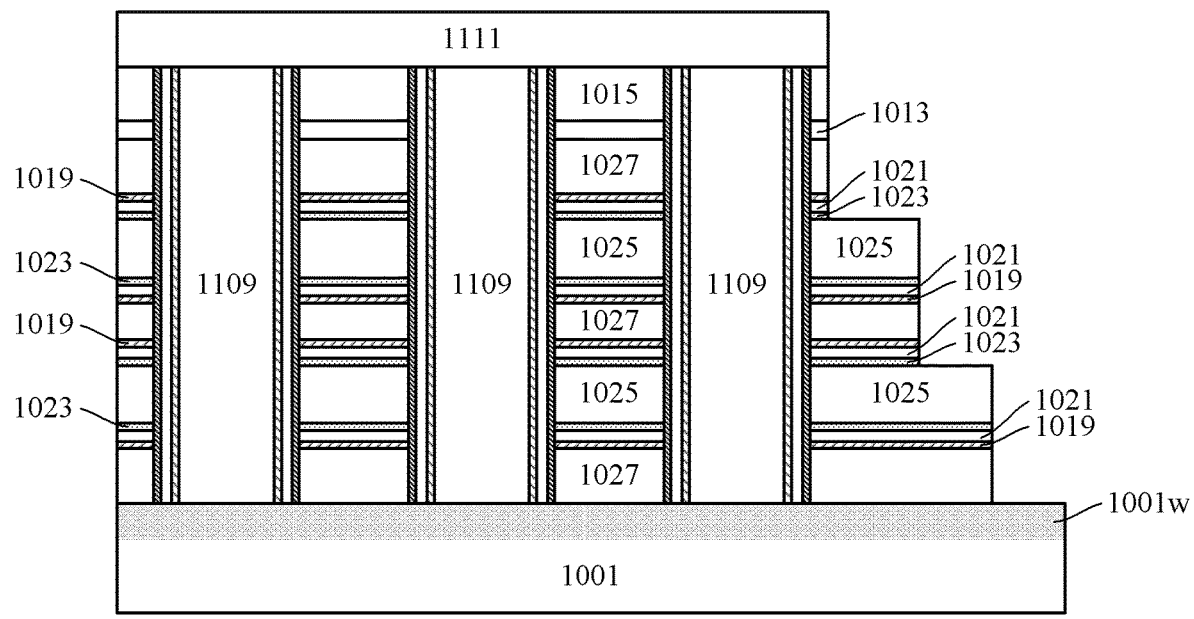
Figure 17B:
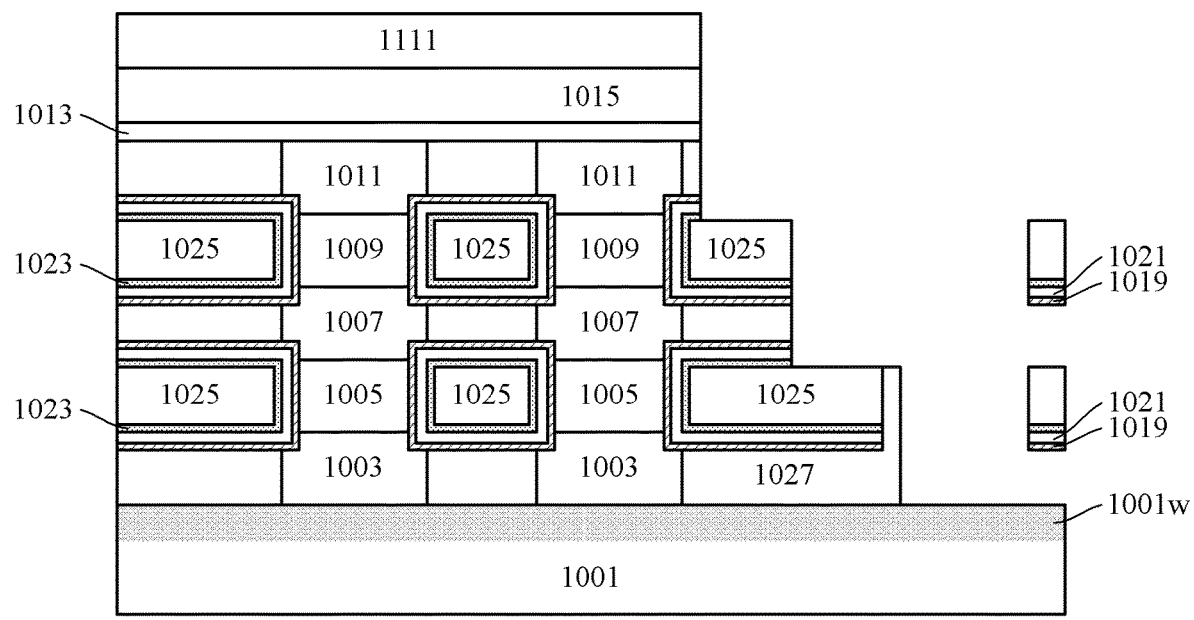

For example, as shown in FIGS. 15(a) and 15(b), the respective material layers on the uppermost gate conductor layer 1025 are selectively etched by, for example, RIE, with the aid of photoresist (not shown). Then, as shown in FIGS. 16(a) and 16(b), the photoresist is trimmed so as to be retracted towards the memory cell region and the respective material layers on the uppermost gate conductor layer 1025 are selectively etched by, for example, RIE. Next, as shown in FIGS. 17(a) and 17(b), the photoresist is further trimmed so as to be further retracted towards the memory cell region and the respective material layers on the uppermost gate conductor layer 1025 are selectively etched by, for example, RIE. In this way, the gate conductor layer is formed to have a stepped structure. There are various ways in the art to pattern multiple vertically-stacked layers into a stepped structure at edges thereof, and detailed descriptions thereof are omitted here.

Figure 18A:
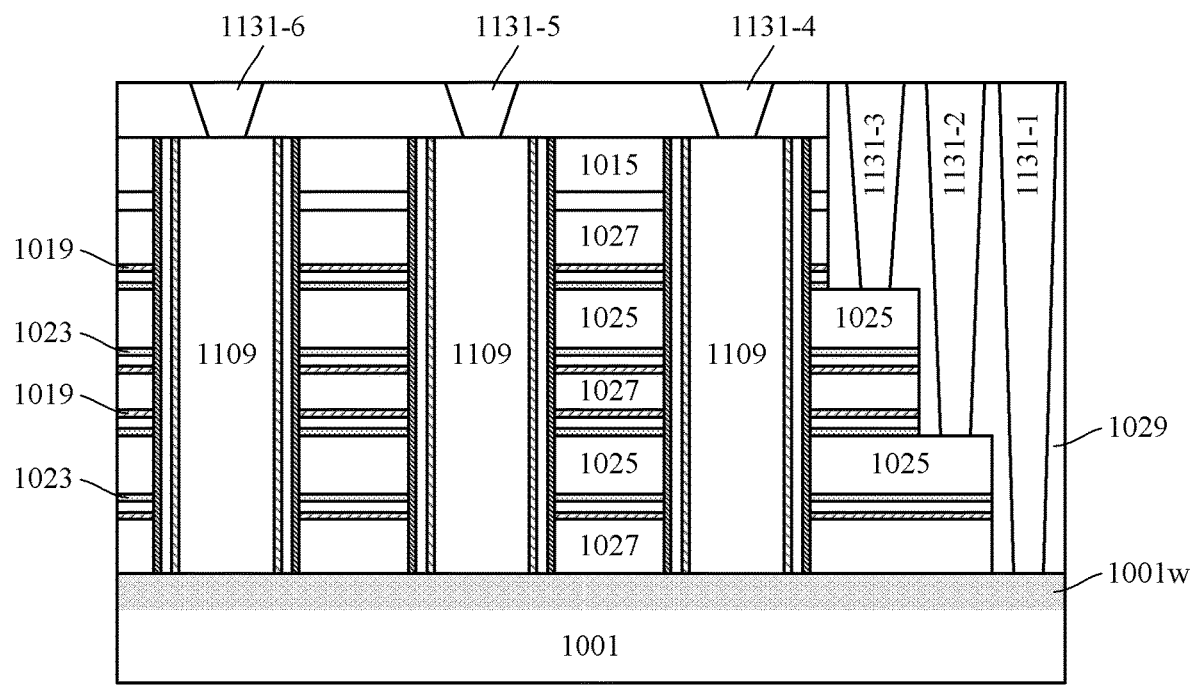
Figure 18B:
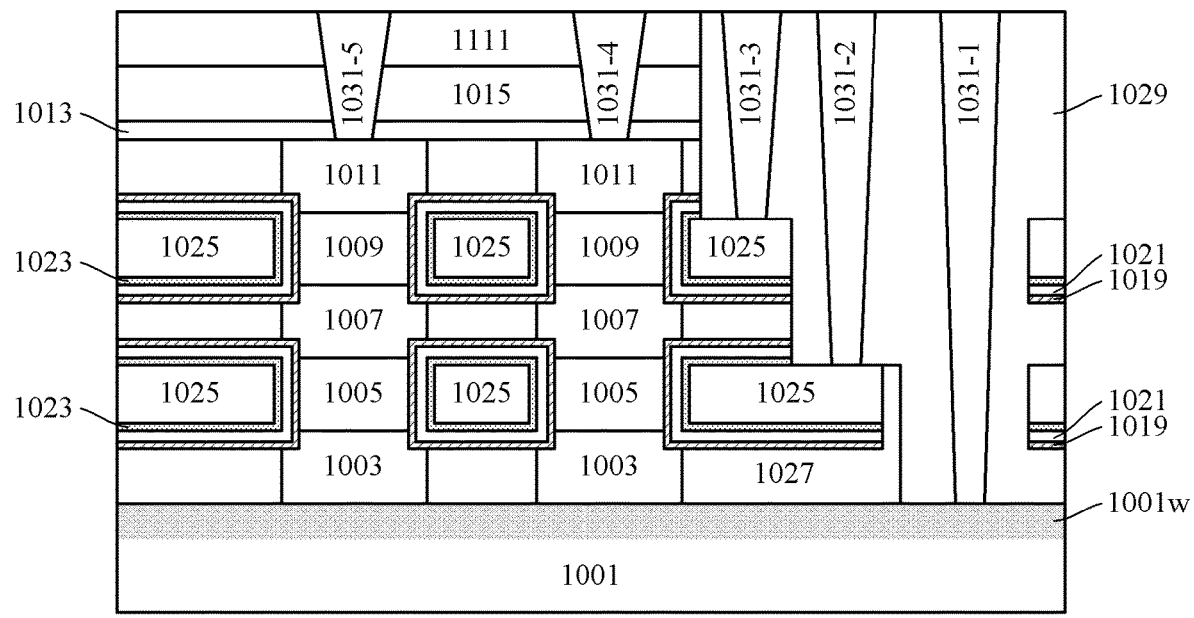

As shown in FIGS. 18(a) and 18(b), a dielectric material (which is, for example, the same material as that of the interlayer dielectric layer 1027) may be deposited to form, together with remaining interlayer dielectric layer 1027, an interlayer dielectric layer 1029. Electrical contacts 1031-1 and 1131-1 to the common ground potential plane 1001w (and thus to all the source/drain regions of the lowermost layer of memory cells), electrical contacts 1031-2, 1031-3, 1131-2 and 1131-3 to the respective gate conductor layers 1025, and electrical contacts 1031-4, 1031-5, 1131-4, 1131-5 and 1131-6 to the respective source/drain regions of the uppermost layer of memory cells may be formed in the interlayer dielectric layer 1029. Such electrical contacts may be made by forming contact holes in the interlayer dielectric layer and filling a conductive material such as W therein.

Then, the memory device according to the embodiment is obtained. As shown in FIGS. 18(a) and 18(b), the memory device may comprise multiple layers of memory cells (in this example, only two layers are shown). Each layer of memory cells comprises a first array of first memory cells and a second array of second memory cells. As illustrated above in connection with FIGS. 19(a) and 19(b), the first array and the second array may be nested with one another.

As shown in FIG. 18(b), each of the first memory cells comprises a stack of a cell source/drain portion, a cell channel portion, and a cell source/drain portion. The first memory cells are connected to form a string in the vertical direction, which is connected to a corresponding one of the electrical contacts at an upper end thereof and also to the common ground plane at a lower end thereof. The respective gate stacks of the first memory cells in each layer are integral.

As shown in FIG. 18(a), each of the second memory cells comprises a channel region defined in the active semiconductor layer 1109 by a corresponding one of the gate conductors 1025 and source/drain regions on opposite sides of the channel region. The respective second memory cells in the same active semiconductor layer 1019 extending in the vertical direction are connected to form a string in the vertical direction, which is connected to a corresponding one of the electrical contacts at an upper end thereof and also to the common ground potential plane at a lower end thereof. The gate conductor for each layer of the second memory cells is provided by that for the first memory cells in this layer.

A specific layer of memory cells may be selected by an electrical contact to a corresponding one of the gate conductors. In addition, a specific string of memory cells may be selected by a corresponding one of the contacts to the source/drain contacts.

Here, gate stacks of the two types of memory cells may be of the same type or different types. For example, the gate stack of the first memory cell may be of a floating gate or charge trapping type, and the gate stack of the second memory cell may be of a charge trapping type; the gate stack of the first memory cell may be of a floating gate or charge trapping type, and the gate stack of the second memory cell may be of a ferroelectric type; the gate stack of the first memory cell may be of ferroelectric type and the gate stack of the second memory cell may be of a charge trapping type; or both of the gate stacks of the first memory cell and the second memory cell may be of a ferroelectric type.

In this example, the electrical contacts are formed for the source/drain regions of all the memory cells in the uppermost layer. Due to a great density of the memory cells, a density of such source/drain contacts is great. According to another embodiment, electrodes which are arranged in rows (or columns) and electrically connected to the source/drain regions of the lowermost layer of memory cells may be formed and electrodes which are arranged in columns (or rows) and electrically connected to the source/drain regions of the uppermost layer of memory cells may be formed. In this way, the respective strings of memory cells may be selected by electrodes on upper and lower sides thereof (which intersect with each other to form an array corresponding to the array of memory cells).

FIGS. 20(a)-22 are schematic views showing some stages in a flow of manufacturing a memory device according to another embodiment of the present disclosure. In the following, descriptions will focus on differences of this embodiment from the above embodiments.

Figure 20A:
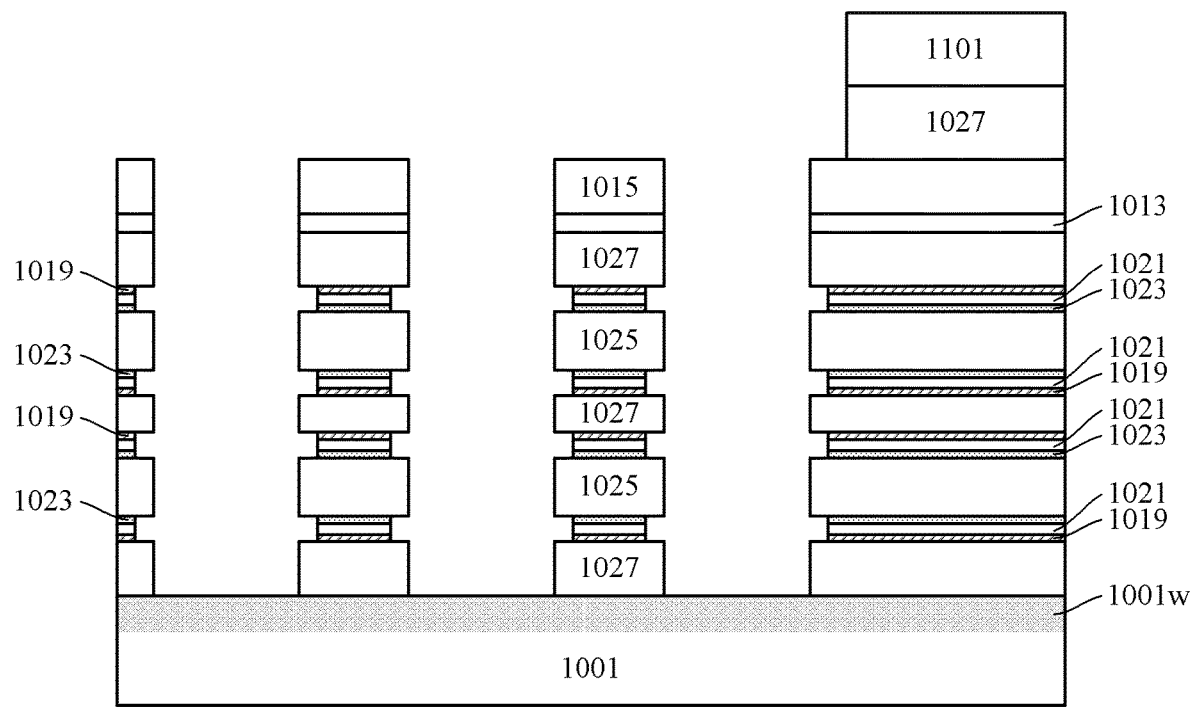
FIGS. 20(a)-22 are schematic views showing some stages in a flow of manufacturing a memory device according to another embodiment of the present disclosure.
Figure 20B:
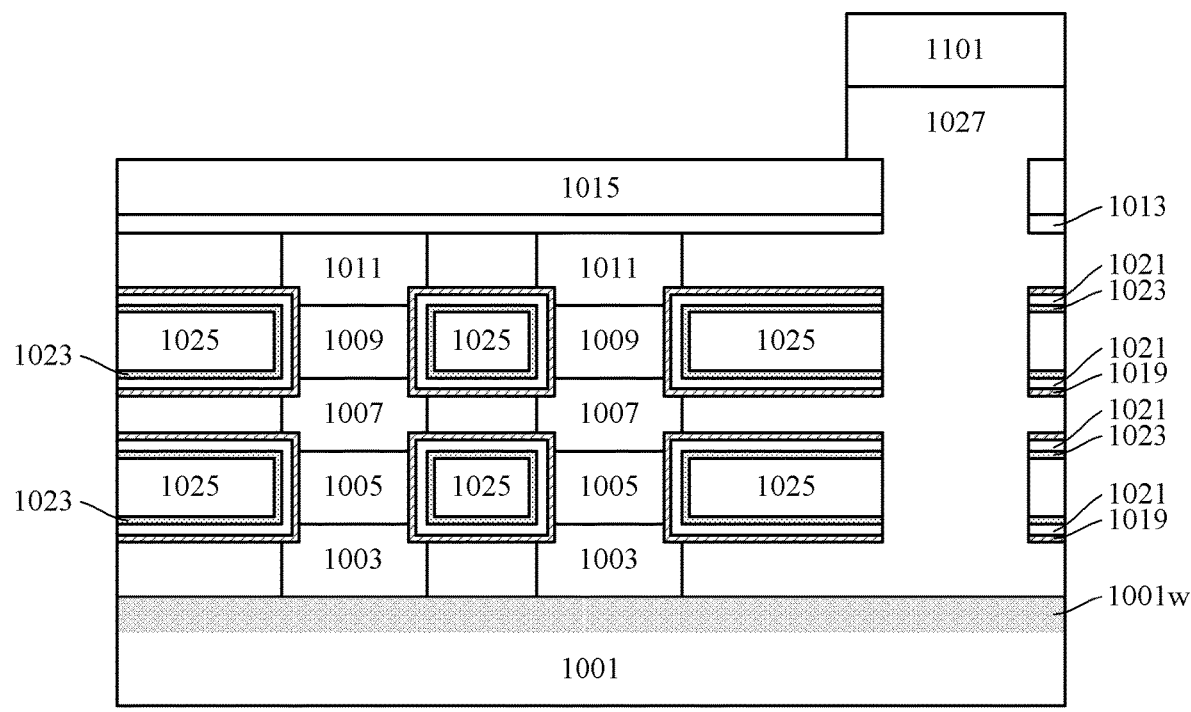
Figure 21:
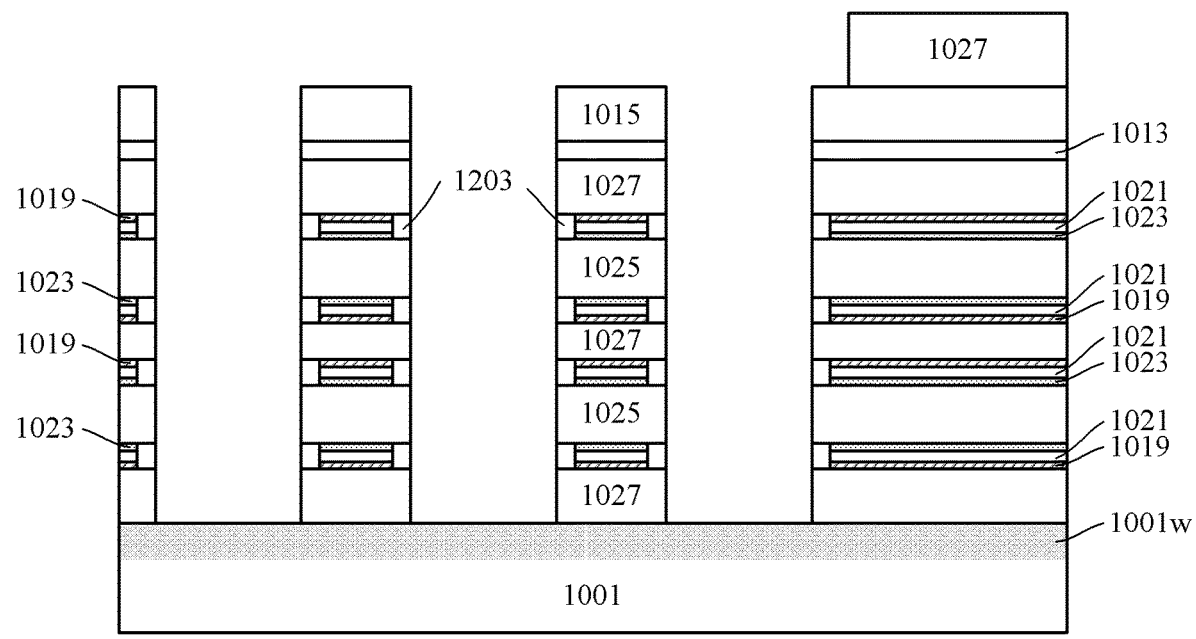

After the machining holes in the memory cell region are emptied as described above in connection with FIGS. 12(a), 12(b), and 12(c), as shown in FIGS. 20(a) and 20(b), the first gate dielectric layer 1019, the floating gate layer or charge trapping layer 1021 and the second gate dielectric layer 1023 are selectively etched back respectively through the machining holes, so that they are relatively laterally recessed. Then, as shown in FIG. 21, a gate conductor material 1203 may be filled in the recess. The gate conductor material 1203 may be the same as that of the gate conductor layer 1025. The filling may be achieved by, for example, deposition and then back-etching.

Figure 22:
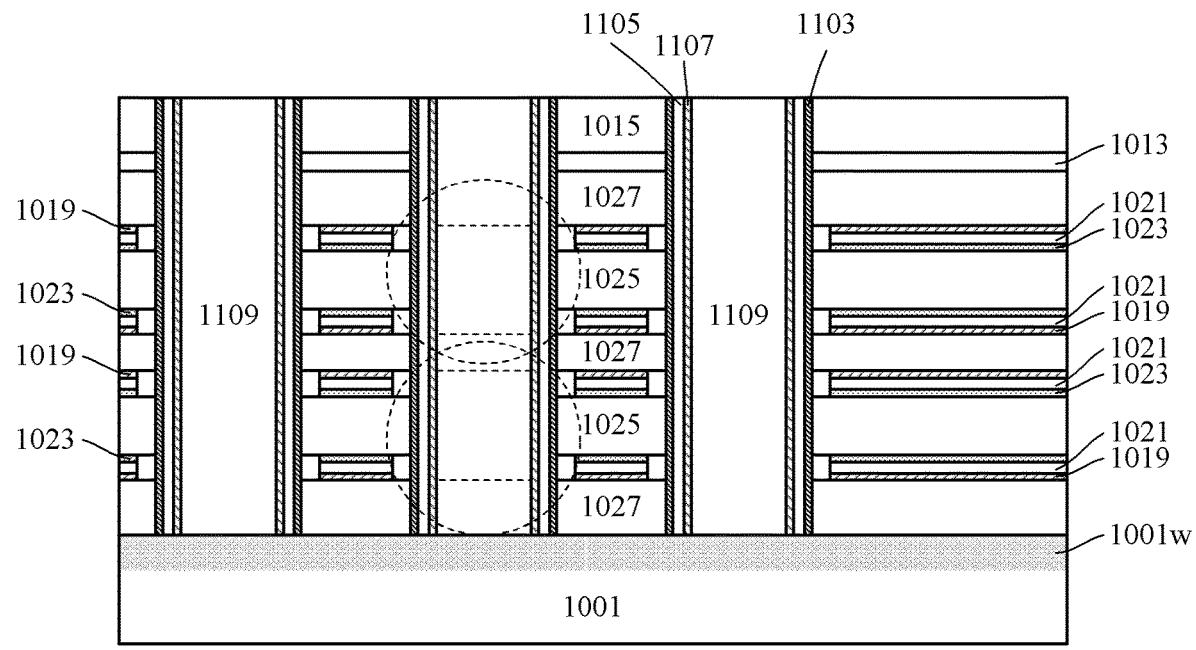

Next, as shown in FIG. 22, additional memory cells may be formed in the machining holes as described above. In this example, the gate conductor layer 1025 and the gate conductor material 1203 may be in contact with each other to together function as the gate conductor for the second memory cells, which may define a channel region in the active semiconductor layer 1109 via the additional second gate dielectric layer 1107, the additional charge trapping layer 1105, and the additional first gate dielectric layer 1103, as indicated by the dotted blocks in the figure. The second memory cell has an increased gate width compared to the above embodiments.

FIGS. 23(a) to 29(b) are schematic views showing some stages in a flow of manufacturing a memory device according to another embodiment of the present disclosure.

Figure 23A:
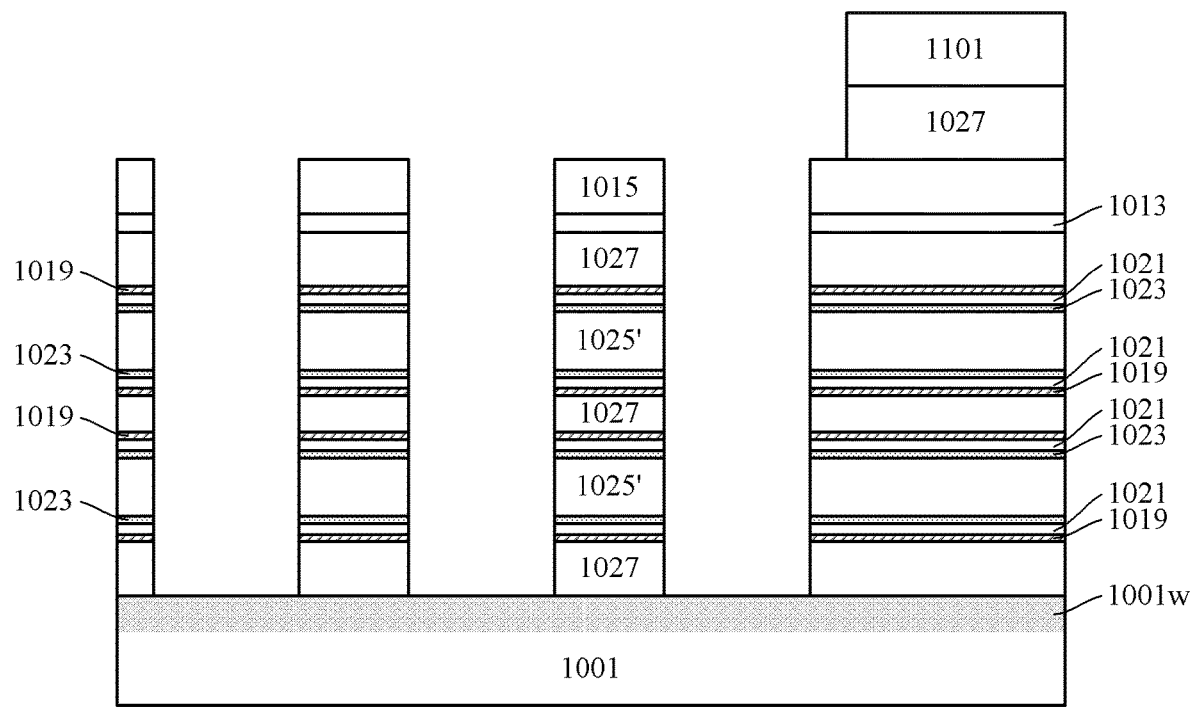
FIGS. 23(a)-29(b) are schematic views showing some stages in a flow of manufacturing a memory device according to another embodiment of the present disclosure.
Figure 23B:
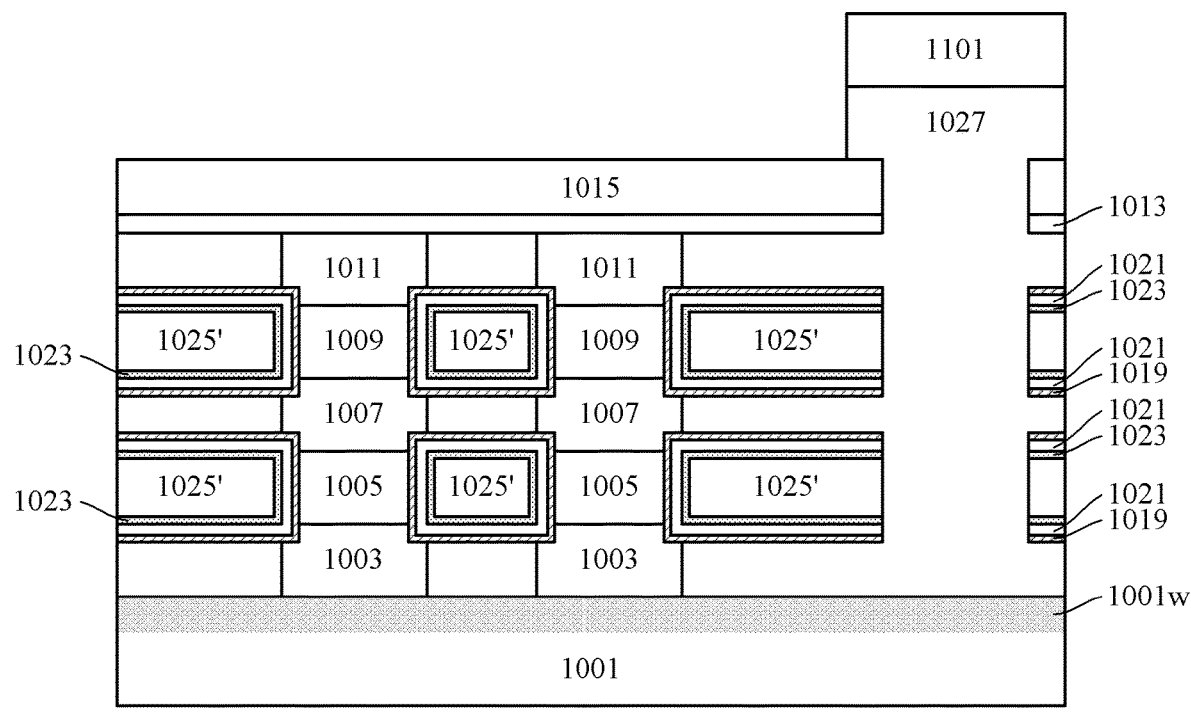

In the process of forming the storage gate stacks for the first memory cells described above with reference to FIGS. 8(a) and 8(b), sacrificial gate conductor layers 1025' of, for example, polysilicon (such as non-doped polysilicon) rather than the gate conductor layers 1025 may be formed. Subsequently, the process may continue as described above. After the operation of emptying the machining holes in the memory cell region described above in connection with FIGS. 12(a), 12(b) and 12(c) is performed, as shown in FIGS. 23(a) and 23(b), the machining holes are exposed in the memory cell region. In this case, sidewalls of the sacrificial gate conductor layers 1025' are exposed in the machining holes. After that, the photoresist 1101 may be removed.

Figure 24A:
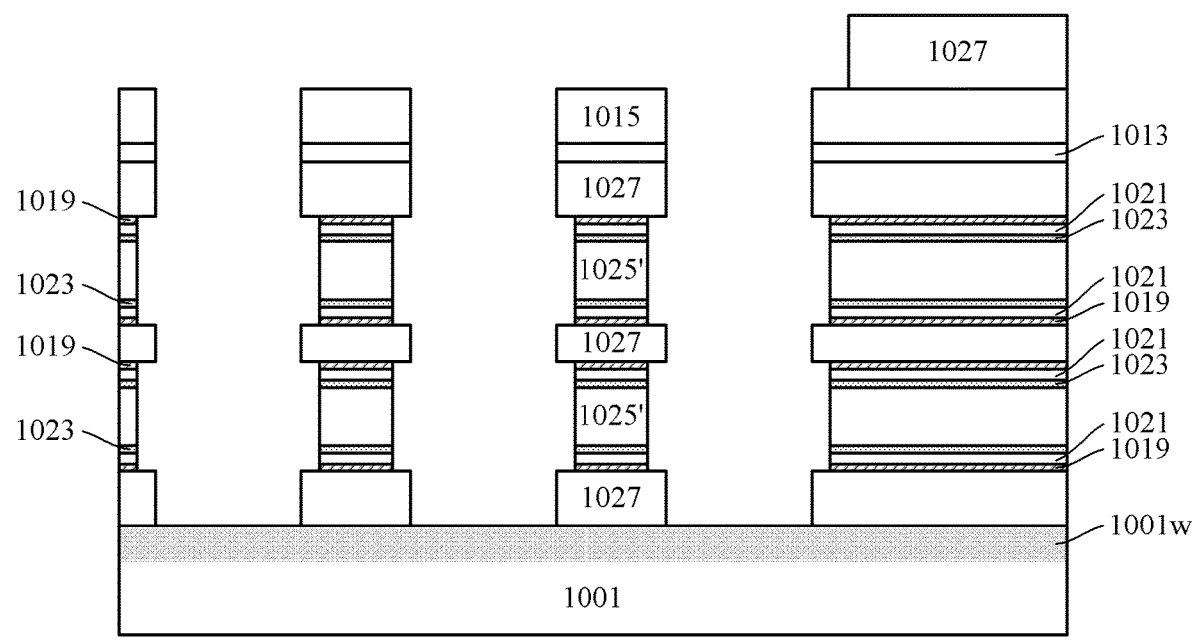
Figure 24B:
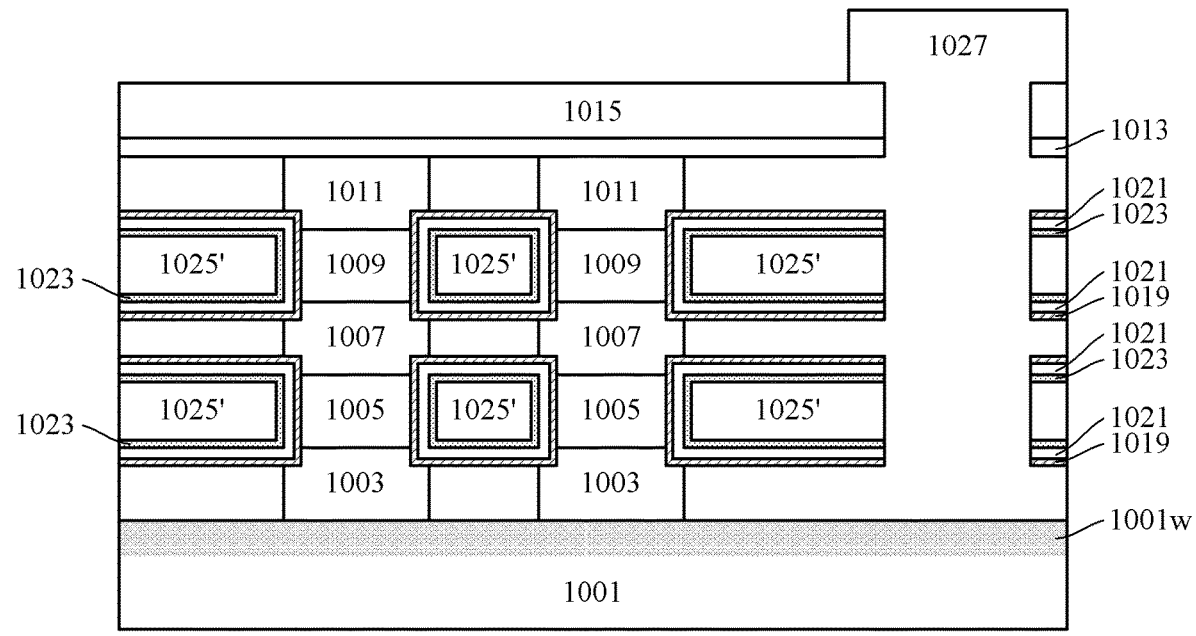

Then, as shown in FIGS. 24(a) and 24(b), the sacrificial gate conductor layers 1025' may be etched back through the machining holes by, for example, selective etching, to be relatively laterally recessed. Next, the second gate dielectric layer 1023, the floating gate layer or charge trapping layer 1021 and the first gate dielectric layer 1019 may be selectively etched respectively. The second gate dielectric layer 1023, the floating gate layer or charge trapping layer 1021, and the first gate dielectric layer 1019 may be relatively laterally recessed to substantially the same extent due to the presence of the sacrificial gate conductor layers 1025' which has been etched back.

Figure 25A:
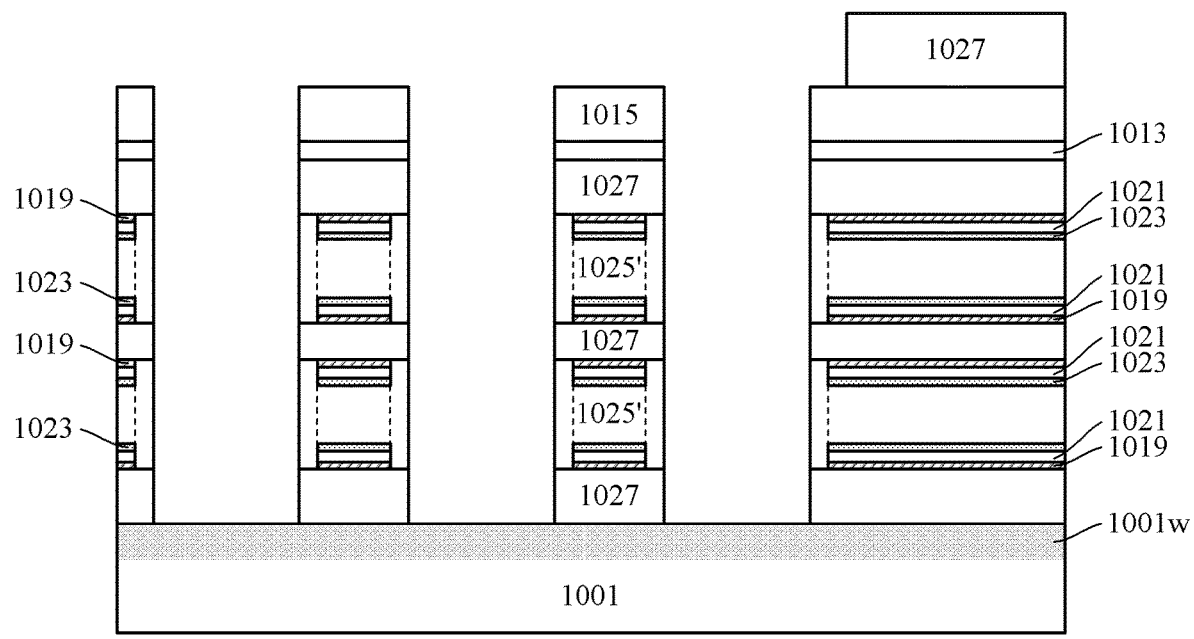
Figure 25B:
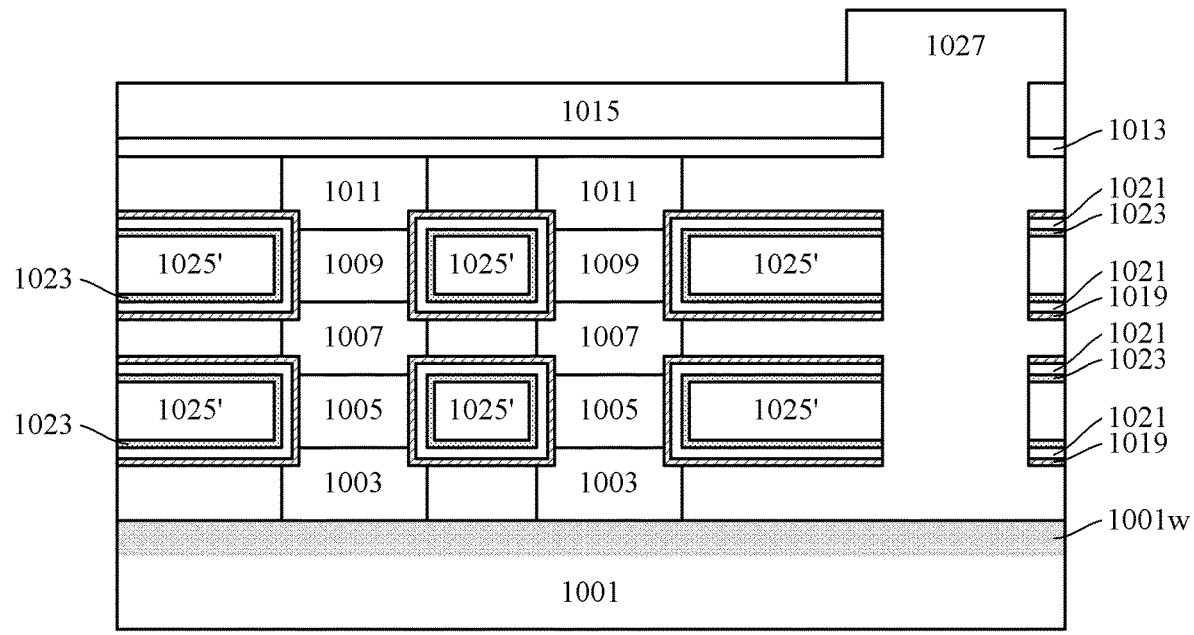

Subsequently, as shown in FIGS. 25(a) and 25(b), the material of the sacrificial gate conductor layers may be filled in the recess through the machining holes, and thus it is shown as 1025' here integrally with the sacrificial gate conductor layers (boundaries therebetween are shown schematically by dotted lines). The filling may be achieved by, for example, deposition and then back-etching.

Figure 26A:
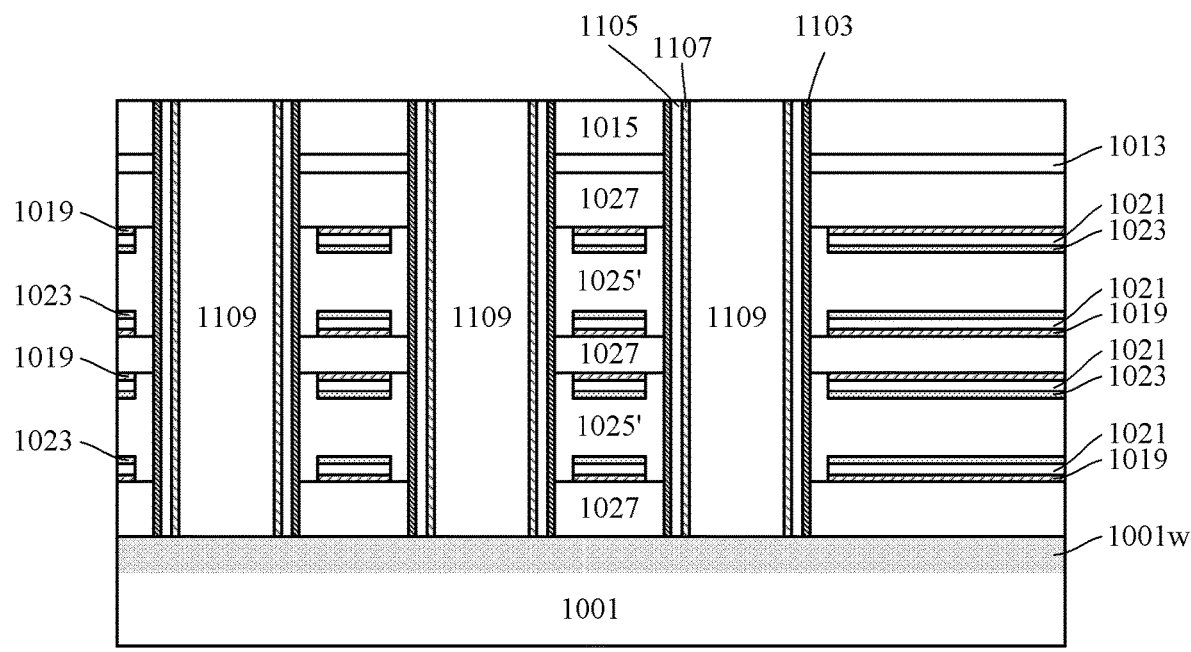
Figure 26B:
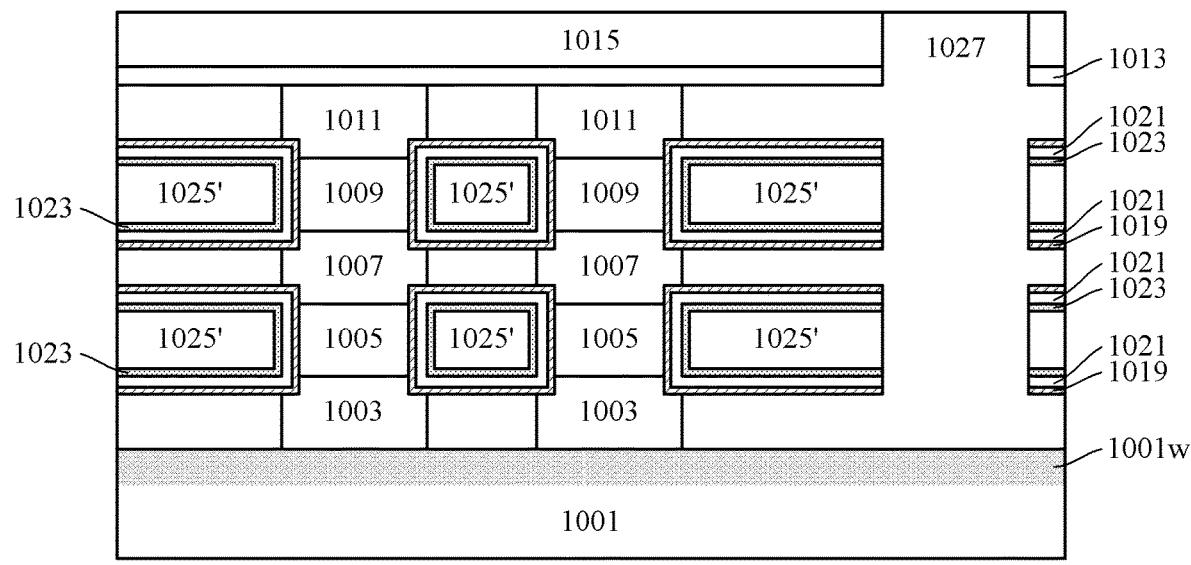

Next, as shown in FIGS. 26(a) and 26(b), additional memory cells may be formed in the machining holes as described above. The structure shown in FIGS. 26(a) and 26(b) is substantially the same as that shown in FIG. 22 except that the gate conductor layers 1025 are replaced by the sacrificial gate conductor layers 1025'.

Then, a gate replacement process may be performed, to replace the sacrificial gate conductor layers with final gate conductor layers.

Figure 27A:
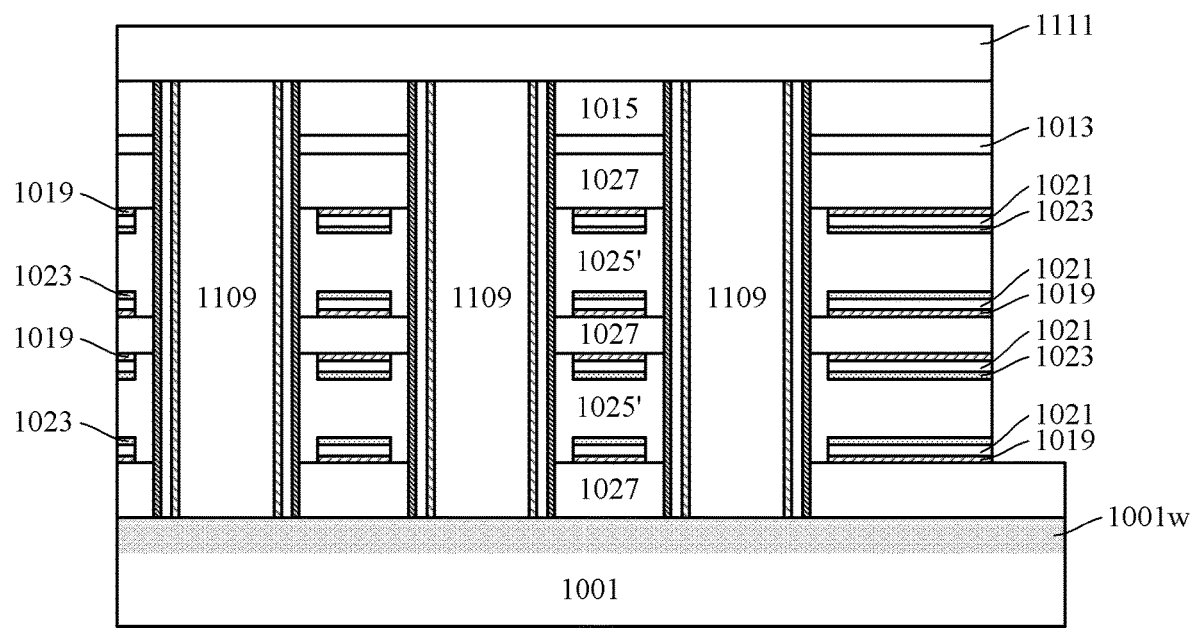
Figure 27B:
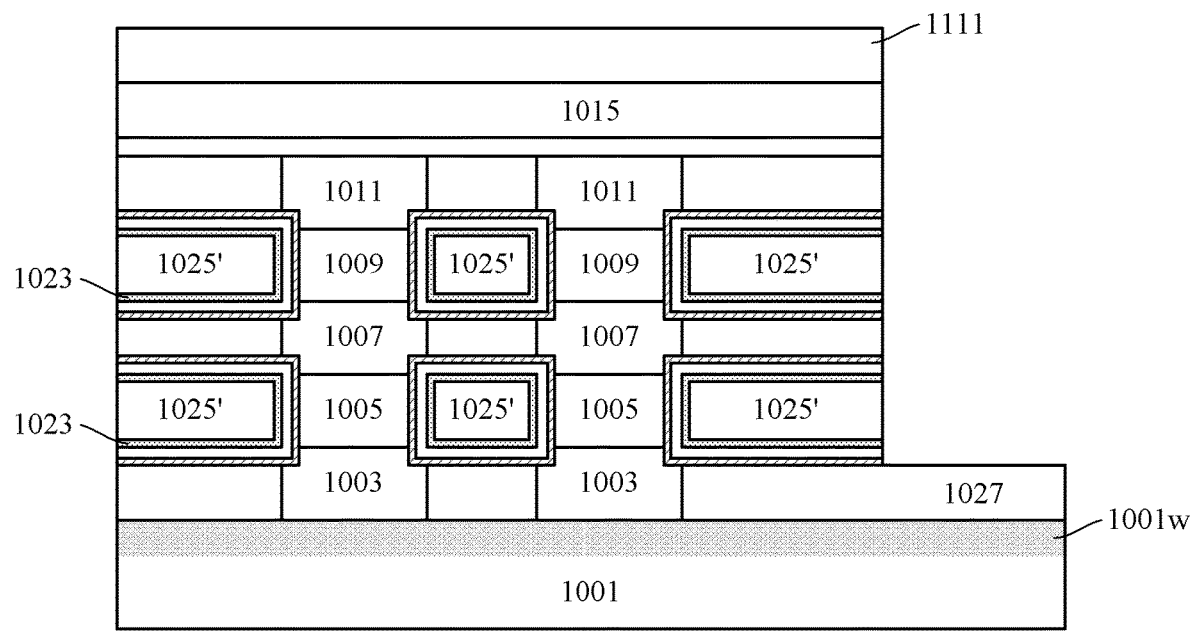

In order to remove the sacrificial gate conductor layers 1025', machining paths to the respective sacrificial gate conductor layers 1025' are required. To this end, as shown in FIGS. 27(a) and 27(b), a trench passing through the respective storage gate stacks for the first memory cells may be formed at a position outside the active region, and preferably, at an edge of the memory cell region, for example, at a boundary between the memory cell region and the contact region. For example, this can be done by lithography. Before that, a protection layer 1111 may be formed firstly as described above in connection with FIGS. 14(a) and 14(b), to protect the memory cells, particularly the additional memory cells formed in the machining holes (as their upper ends are currently exposed).

Figure 28A:
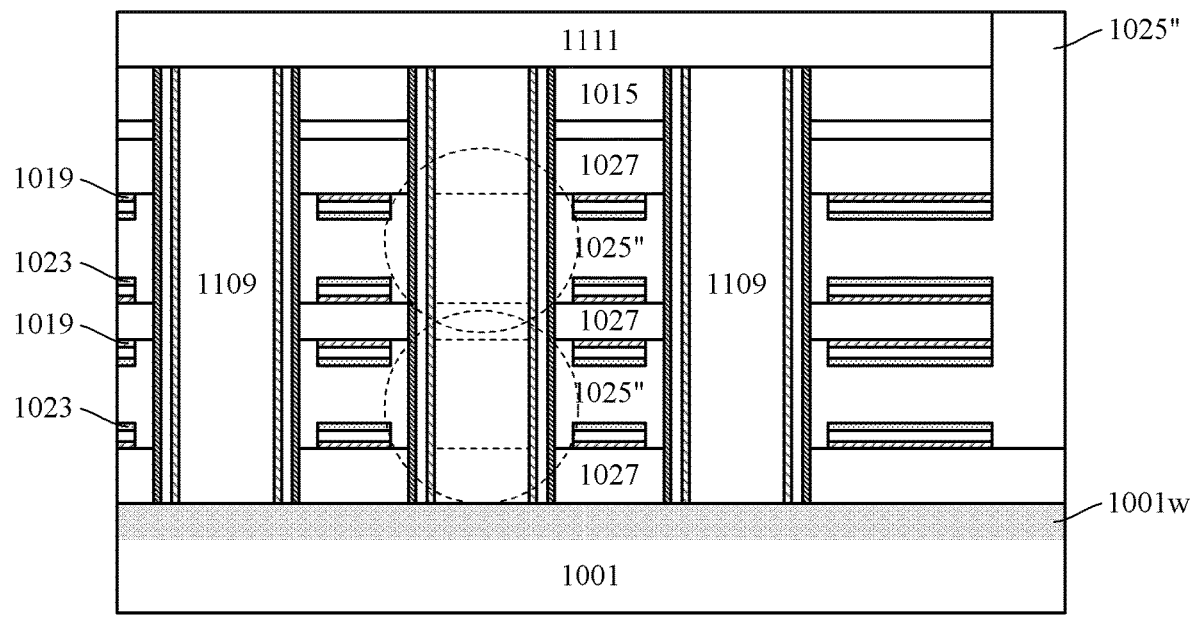
Figure 28B:
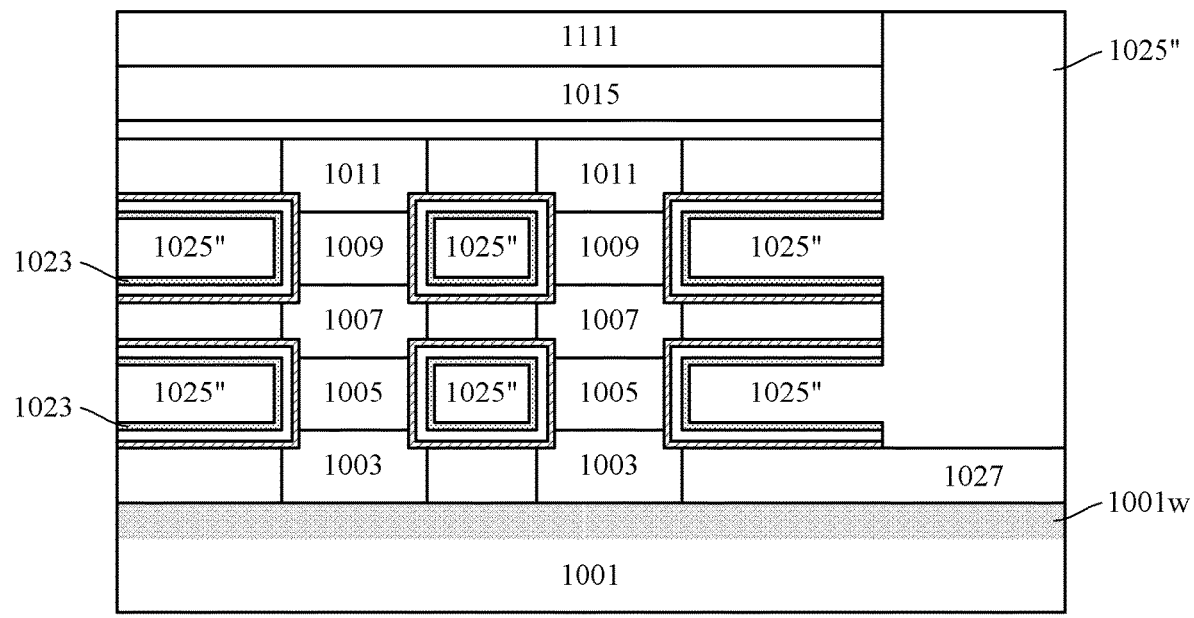

Next, as shown in FIGS. 28(a) and 28(b), the sacrificial gate conductor layers 1025' may be selectively etched through the above trench to remove the sacrificial gate conductor layers 1025'. In spaces which are left due to the removal of the sacrificial gate conductor layers 1025', final gate conductor layers 1025", for example, a metal gate conductor such as W, may be filled through the above trench. For example, this may be done by filling an sufficient amount of W in the spaces left due to the removal of the sacrificial gate conductor layers 1025' by deposition, for example, ALD or CVD, so as to fill up the spaces and the trench. After that, the deposited W may be planarized by, for example, CMP, which may be stopped at the protection layer 1111. A thin barrier layer (not shown) of, for example, TiN, may be further deposited before depositing the metal gate conductor layer.

In this example, the gate conductor layer 1025" may define a channel region in the active semiconductor layer 1109 via the additional second gate dielectric layer 1107, the additional charge trapping layer 1105, and the additional first gate dielectric layer 1103, as indicated by the dotted blocks in FIG. 28(a). The second memory cell has an increased gate width compared to the above embodiments. The first memory cells are the same as those in the above embodiments, as shown in FIG. 28(b).

Figure 29A:
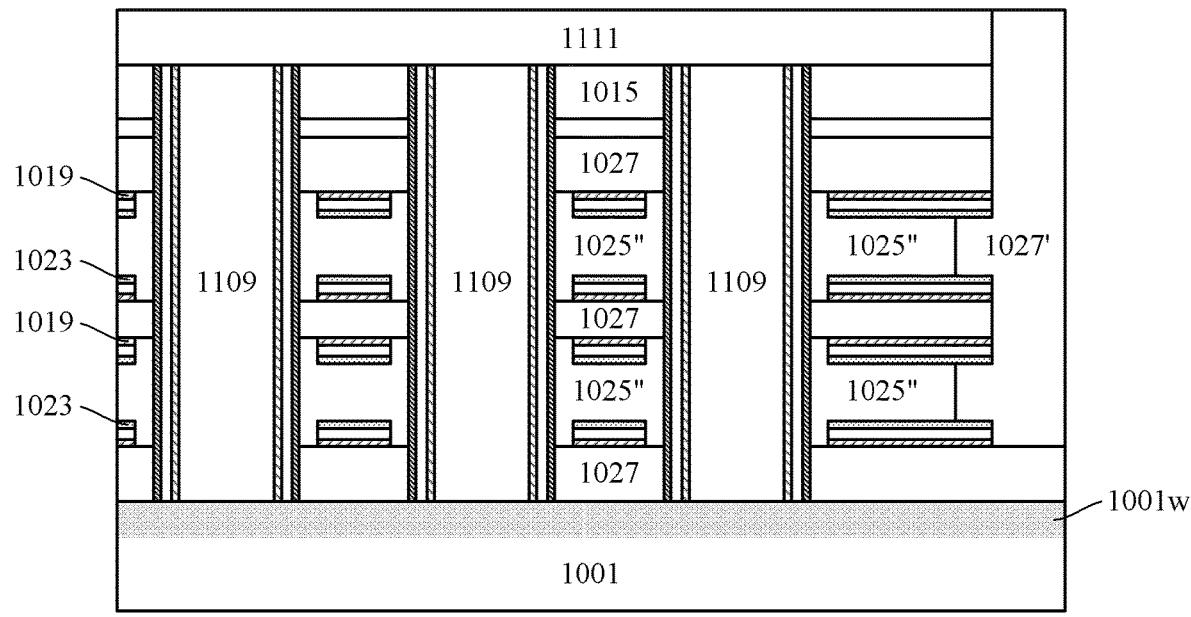
Figure 29B:
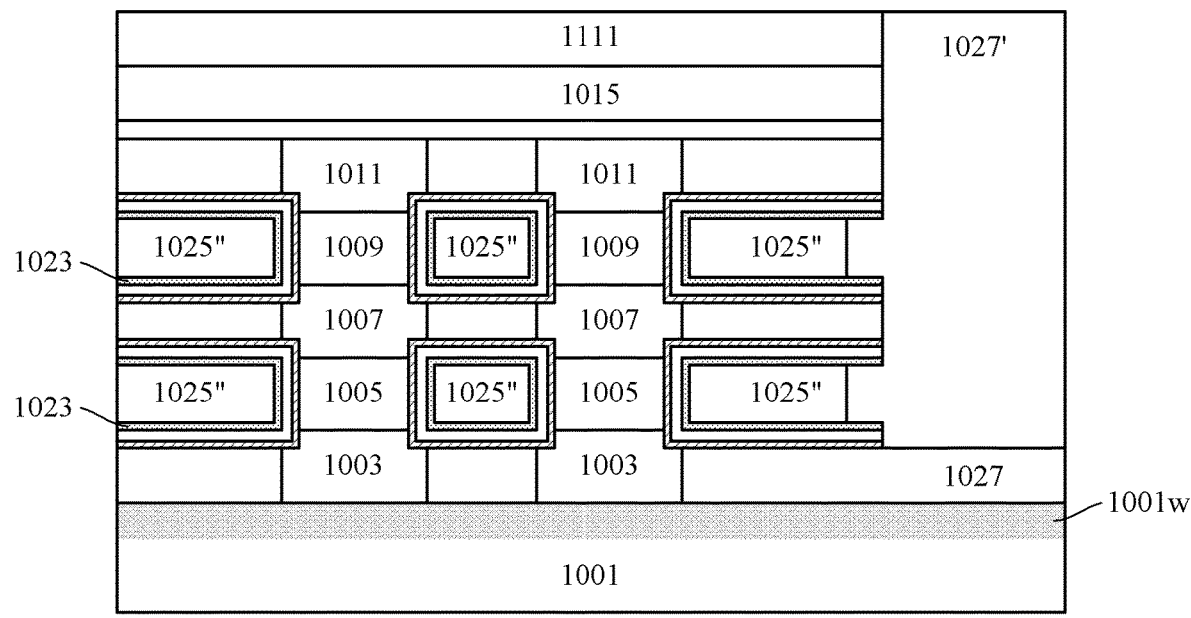

After that, as shown in FIGS. 29(a) and 29(b), the gate conductor layers filled in the trench may be removed, so that the respective gate conductor layers are separated. This can be done by selectively etching the gate conductor layers by, for example, RIE in the vertical direction. The gate conductor layers in the trench is removed by the RIE, so that the respective gate conductor layers are separated. In addition, the gate conductor layers 1025" (and the barrier layer, if present) may be further etched back through the above trench to ensure complete separation between the respective gate conductor layers. After that, a dielectric layer 1027' of, for example, oxide, may be filled in the gaps (for example, the trench and also spaces which are released due to back-etching of the gate conductor layers 1025").

After that, contacts may be formed as described above, and details thereof are omitted here.

In the above embodiments, the second storage gate stacks (except for the gate conductors) are shown as continuously extending on the sidewalls of the machining holes. However, the present disclosure is not limited thereto. For example, they may be formed as multiple layers which are separated from each other, each of which layers corresponds to a corresponding one of the layers of first storage gate stacks, particularly in a case that the second storage gate stacks each comprise a ferroelectric material or a floating gate layer.

FIGS. 30(a)-35(b) are schematic views showing some stages in a flow of manufacturing a memory device according to another embodiment of the present disclosure. In the following, descriptions will focus on differences of this embodiment from the above embodiments.

Figure 30A:
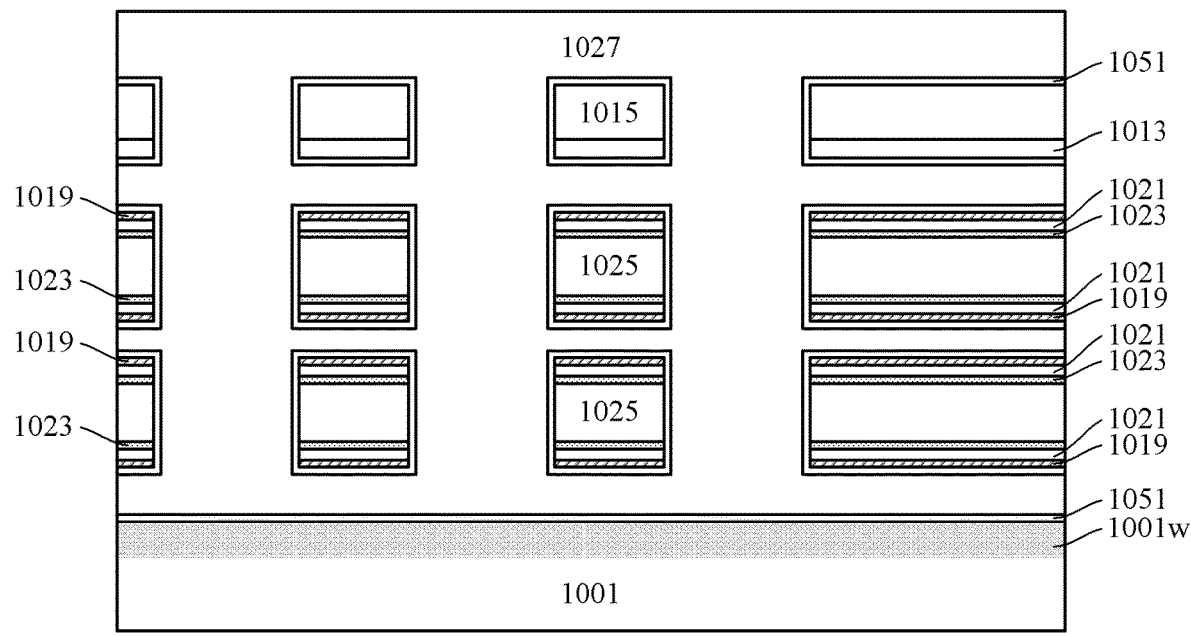
FIGS. 30(a)-35(b) are schematic views showing some stages in a flow of manufacturing a memory device according to another embodiment of the present disclosure.
Figure 30B:
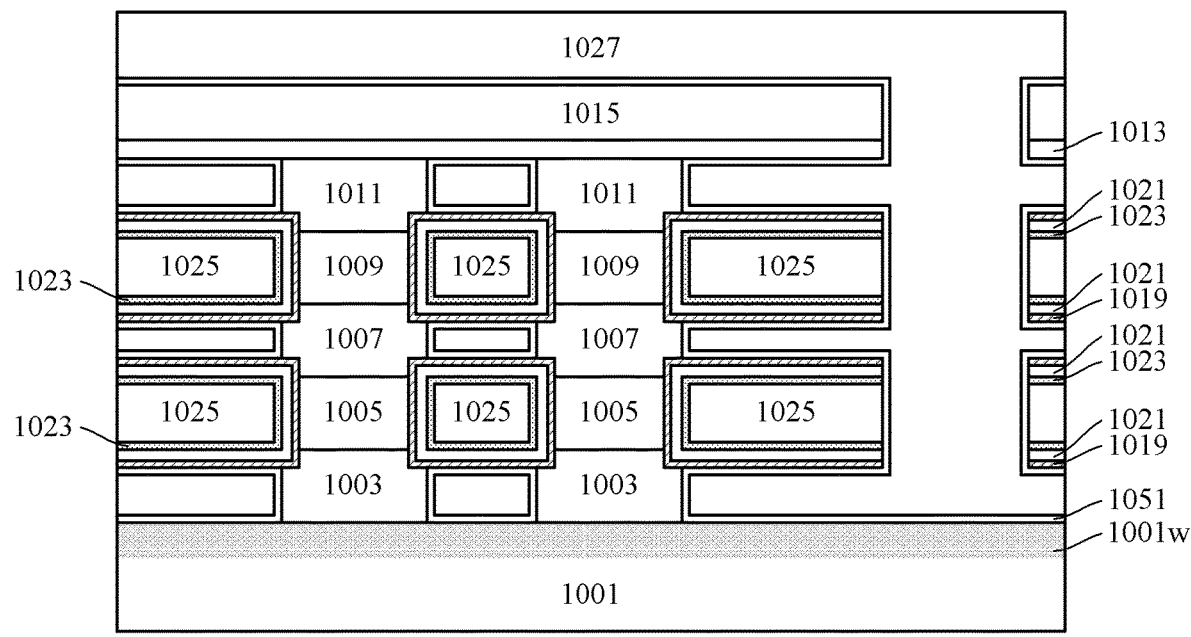

After the source/drain portions of the respective first memory cells are separated as described above in connection with FIGS. 10(a) and 10(b), a protection layer 1051 may be formed on a surface of the gaps in the stack through the machining holes, as shown in FIGS. 30(a) and 30(b). For example, a thin nitride layer with a thickness of about 1-5 nm may be deposited. The protection layer 1051 may protect the gate stacks of the first memory cells in a later process of the gate stacks of the second memory cells. After that, as described above in connection with FIGS. 11(a) and 11(b), a dielectric material may be filled in the gaps in the stack through the machining holes to form the interlayer dielectric layer 1027.

Figure 31A:
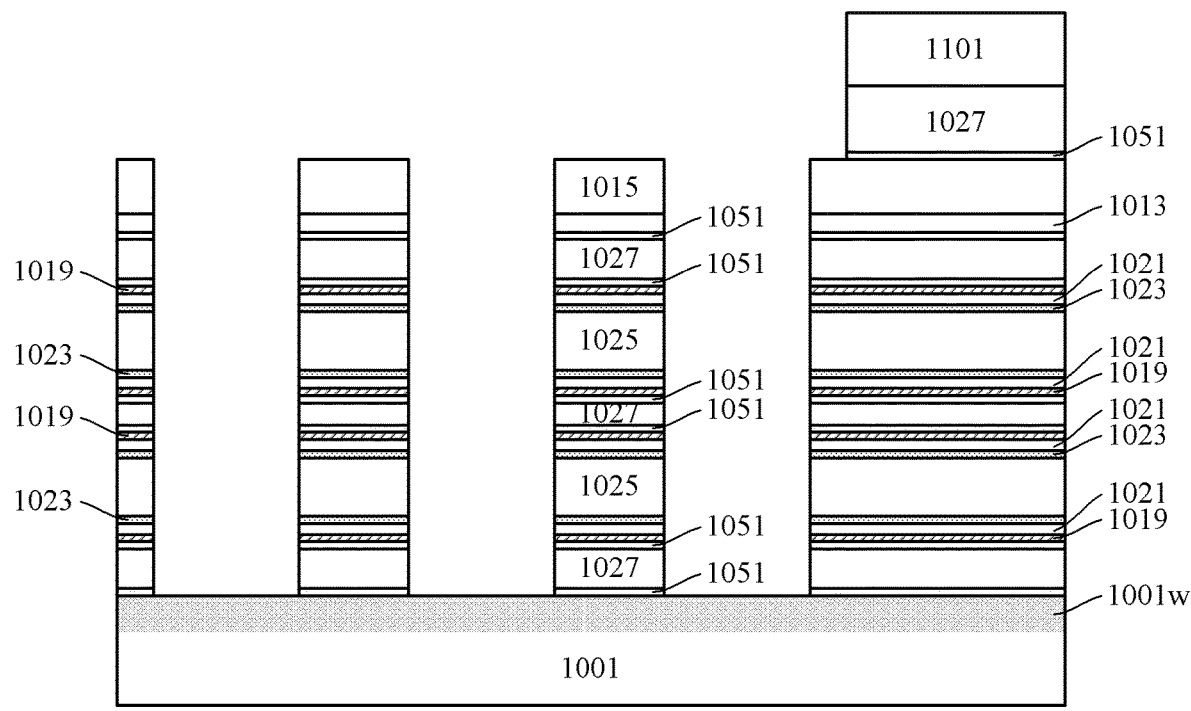
Figure 31B:
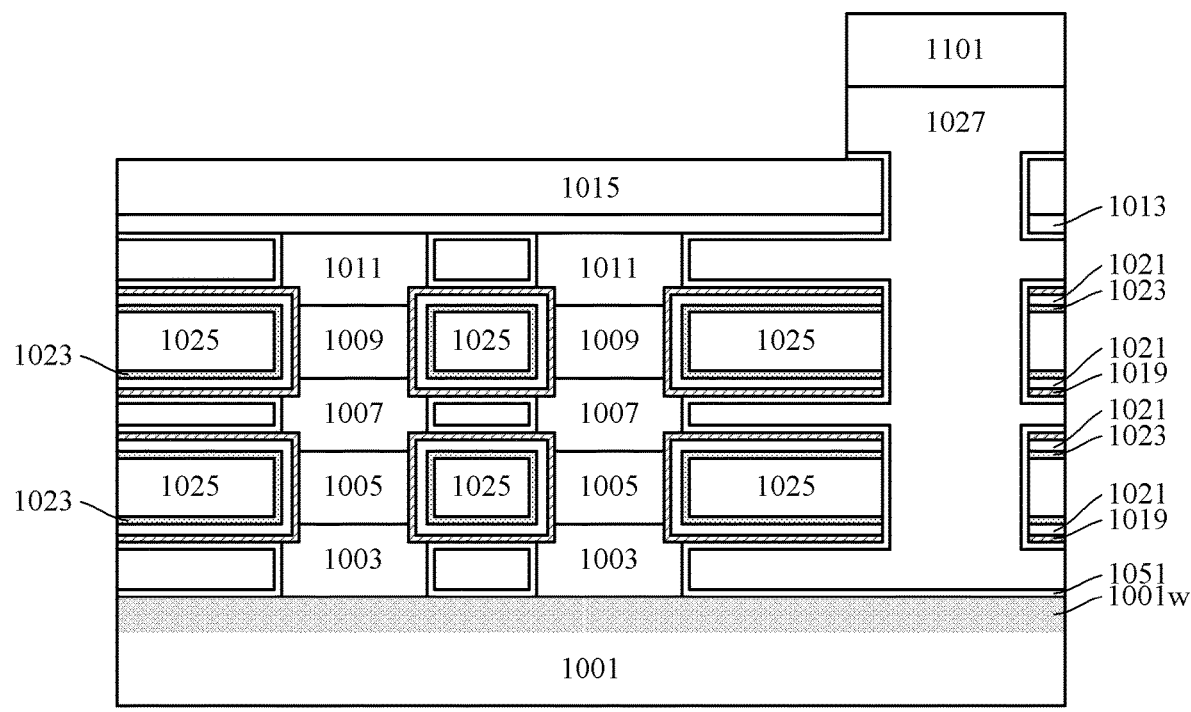

As described above in connection with FIGS. 12(a), 12(b) and 12(c), the machining holes in the memory cell region may be emptied. Here, as shown in FIGS. 31(a) and 31(b), after the interlayer dielectric layer 1027 is selectively etched by, for example, RIE, using the mask 1101 to expose the machining holes, the protection layer 1051 may be further selectively etched by, for example, RIE. In this way, portions of the protection layer 1051 extending on the sidewalls of the machining holes (in the memory cell region) may be removed while the remaining portions of the protection layer 1051 may be left as they are covered. In particular, as shown in FIG. 31(b), the gate stacks (1019/1021/1023) of the first memory cells are covered by the protection layer 1051. After that, the photoresist 1101 may be removed.

Figure 32A:
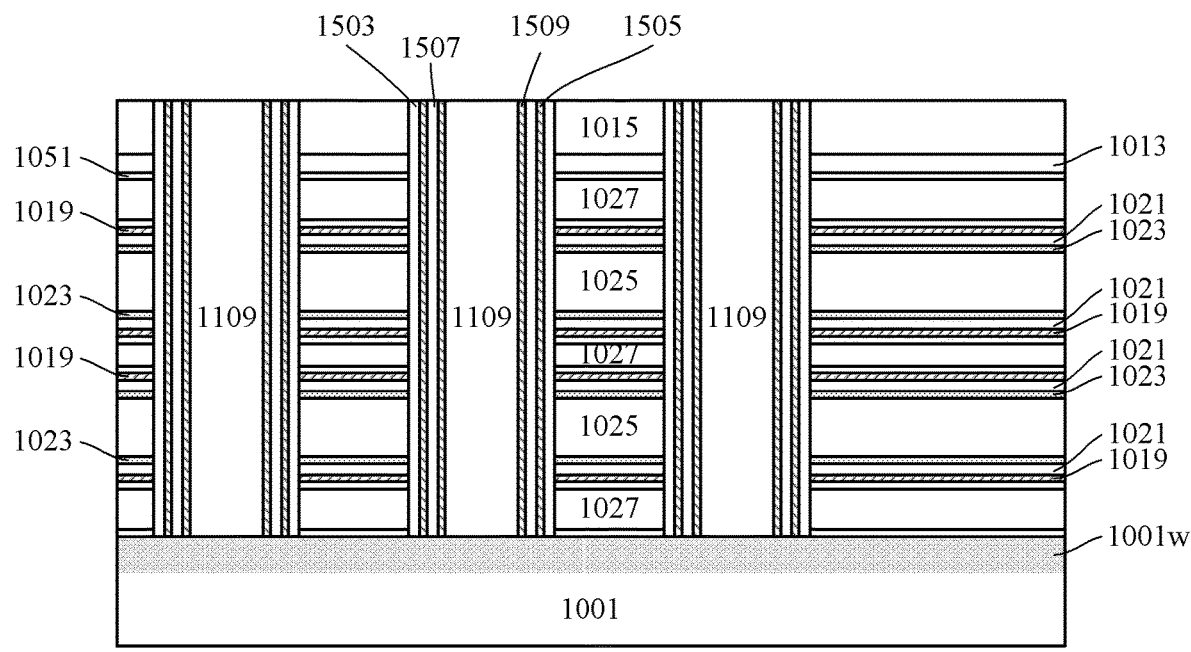
Figure 32B:
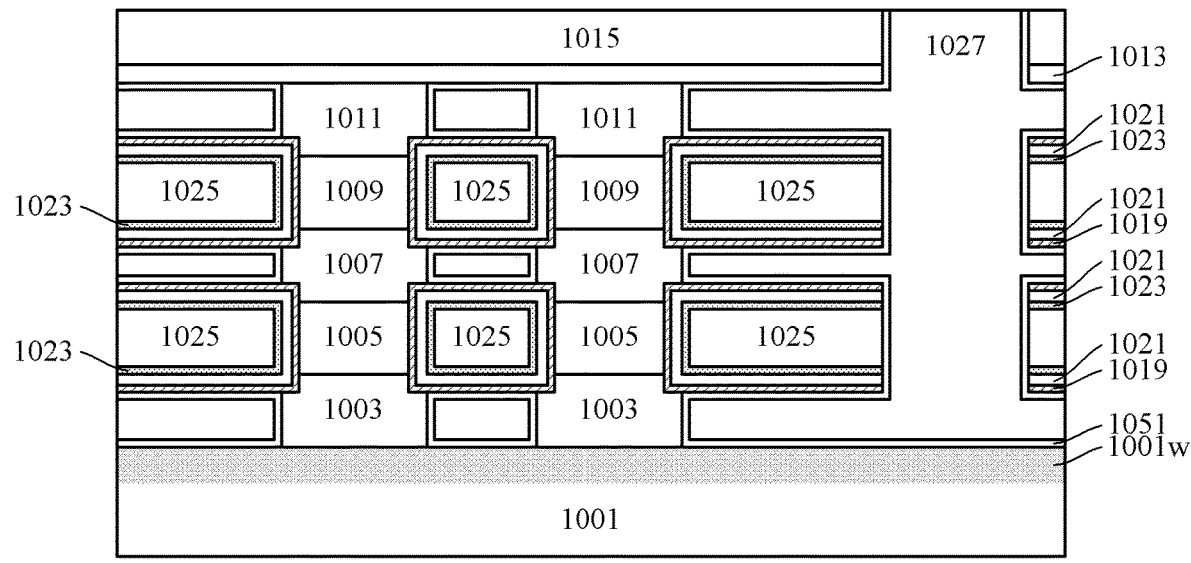

Then, as shown in FIGS. 32(a) and 32(b), additional vertical memory cells may be formed in the machining holes. An operation of forming the additional memory cells is substantially the same as that described above in connection with FIGS. 13(a) and 13(b). However, in this example, different gate stacks are formed. For example, a gate dielectric layer 1503, a first metal layer 1505, a ferroelectric material layer 1507, and a second metal layer 1509 may be formed in sequence around the sidewalls of the machining holes. For example, the gate dielectric layer 1503 may comprise high-K gate dielectric with a thickness of about 1-10 nm, the first metal layer 1505 may comprise TiN with a thickness of about 1-10 nm, the ferroelectric material layer 1507 may comprise $Hf_{1-x}Zr_xO_2$ with a thickness of about 1-20 nm, and the second metal layer 1509 may comprise TiN with a thickness of about 1-10 nm. In addition, the active semiconductor layer 1109 filled in the machining holes may comprise polysilicon with a doping concentration of about 1E16-1E19 $cm^{-3}$.

Here, as shown in FIG. 32(a), the metal layers 1505 and 1509 which extend integrally may cause electrical problems. To this end, they may be separated from each other.

Figure 33A:
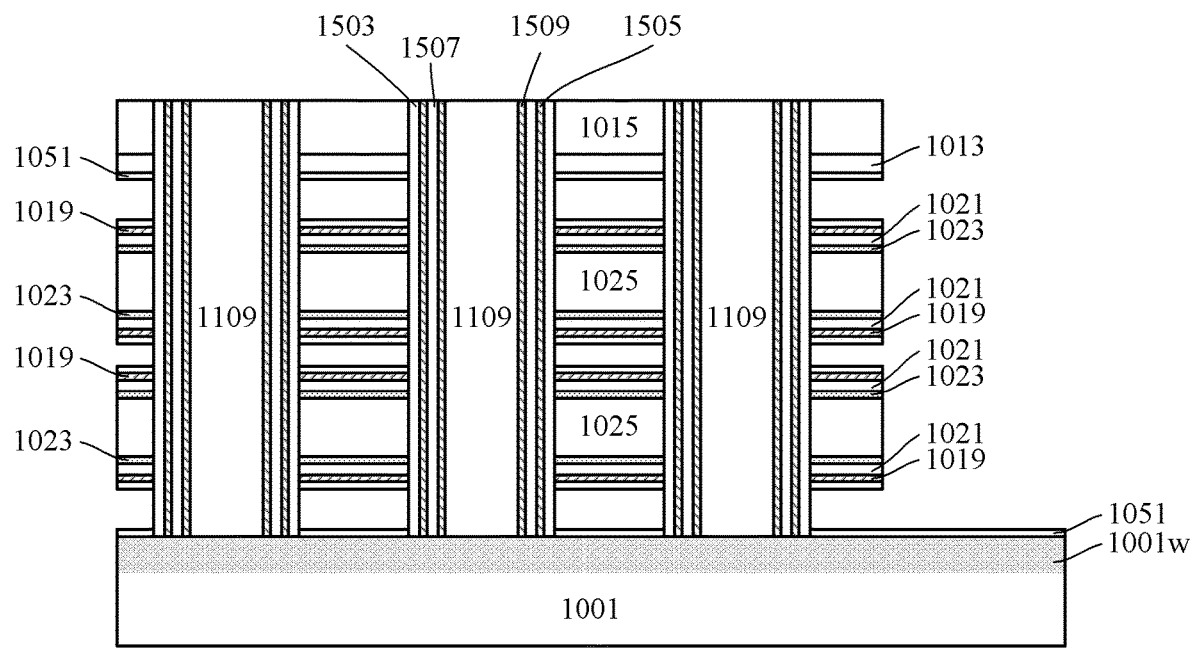
Figure 33B:
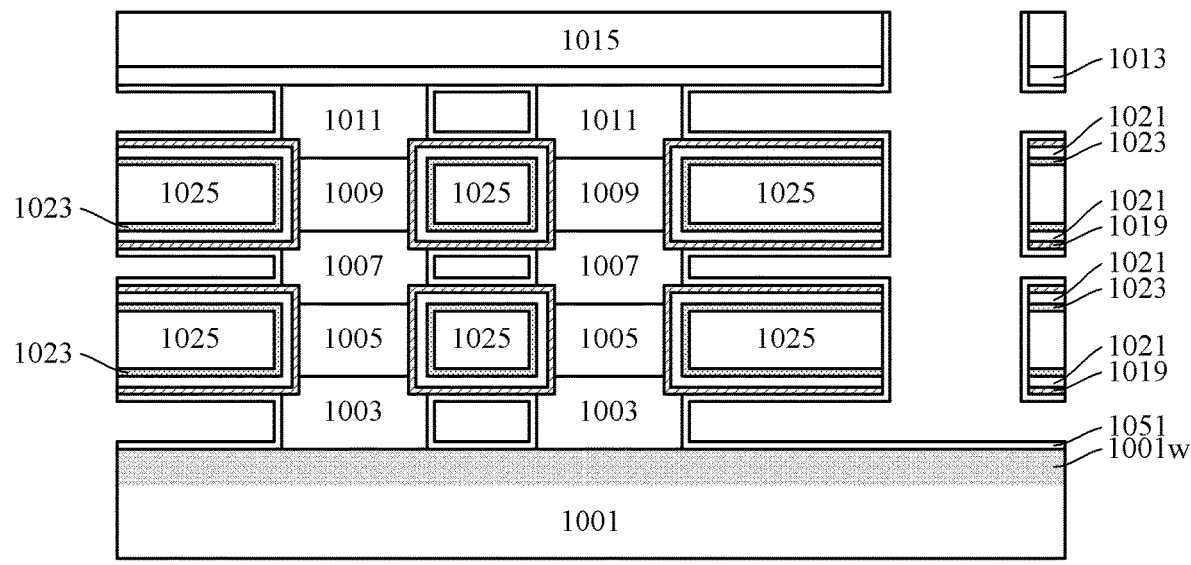

In order to be able to process the gate stacks for the additional memory cells, similarly to those described above in connection with FIGS. 27(a) and 27(b), a trench, as a machining path, which enables exposure of sidewalls of the interlayer dielectric layer 1027 in the stack, may be formed at a position outside the active region, and preferably, at an edge of the memory cell region, for example, at a boundary between the memory cell region and the contact region. Then, the interlayer dielectric layer 1027 may be selectively etched (for example, isotropically etched) through the trench to remove the interlayer dielectric layer 1027, as shown in FIGS. 33(a) and 33(b). Here, the protection layer 1051 may protect most of the material layers. In addition, as shown in FIG. 33(a), the second storage gate stacks are exposed between the respective first storage gate stacks.

Figure 34:
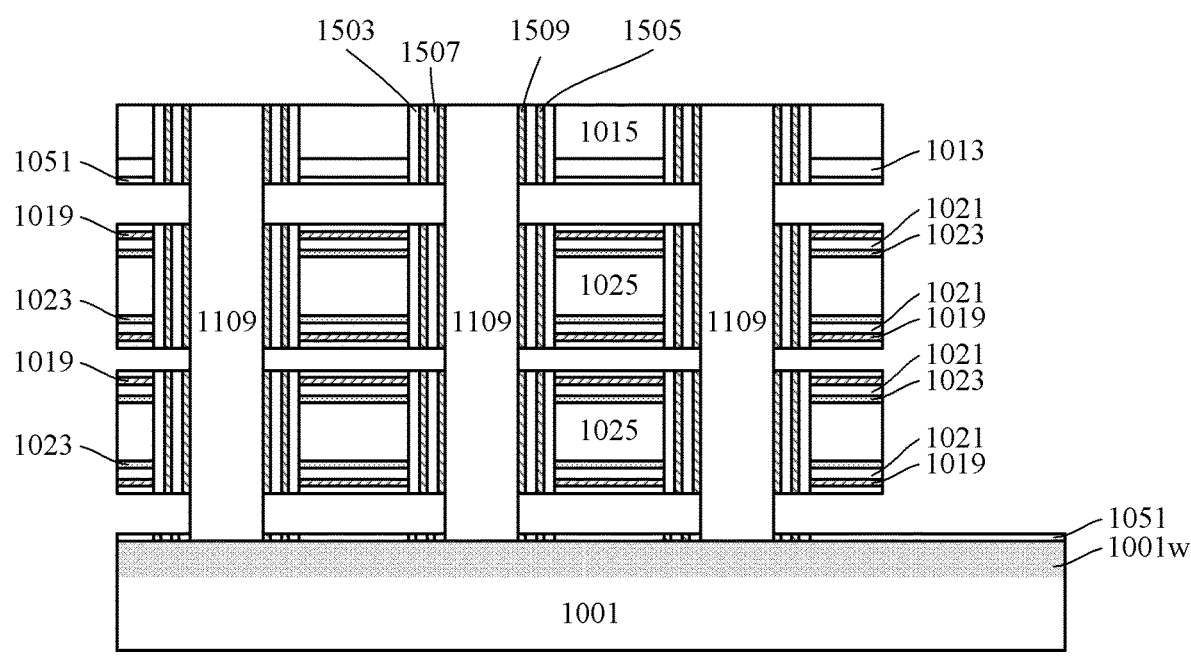

As a result, as shown in FIG. 34, the gate dielectric layer 1503, the first metal layer 1505, the ferroelectric material layer 1507 and the second metal layer 1509 may be selectively etched through the trench. In this way, the second gate stacks may be separated into multiple layers corresponding to respective layers of first gate stacks. Due to the presence of the protection layer 1051, the etching may have substantially no effects on the first gate stacks.

Figure 35A:
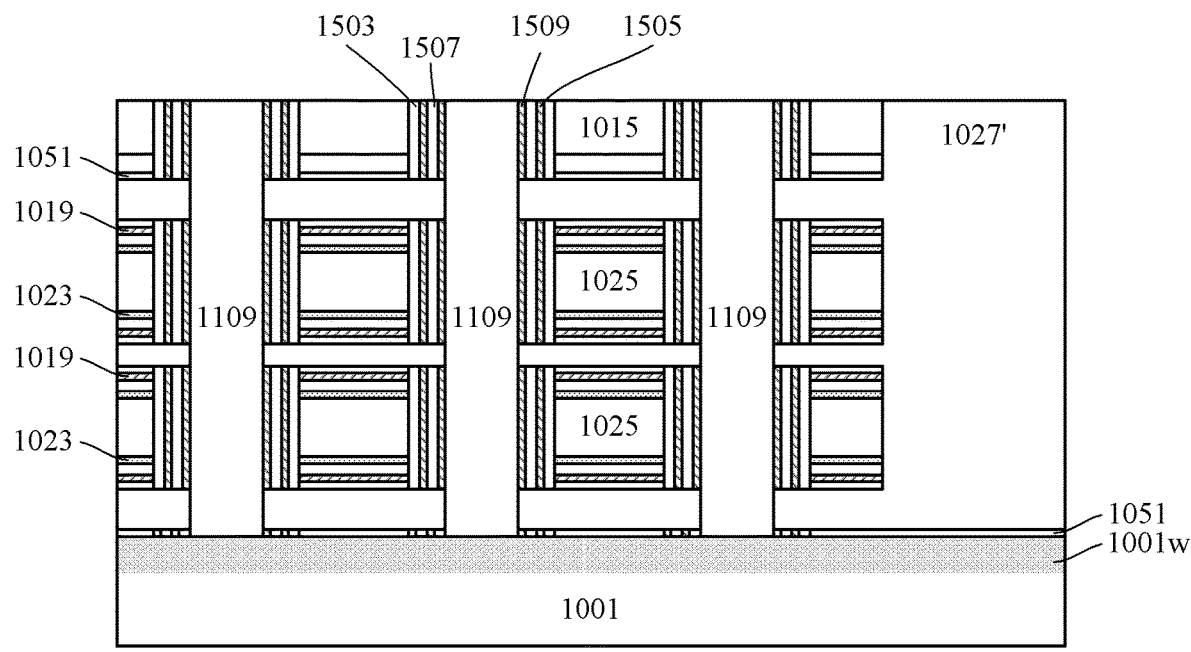
Figure 35B:
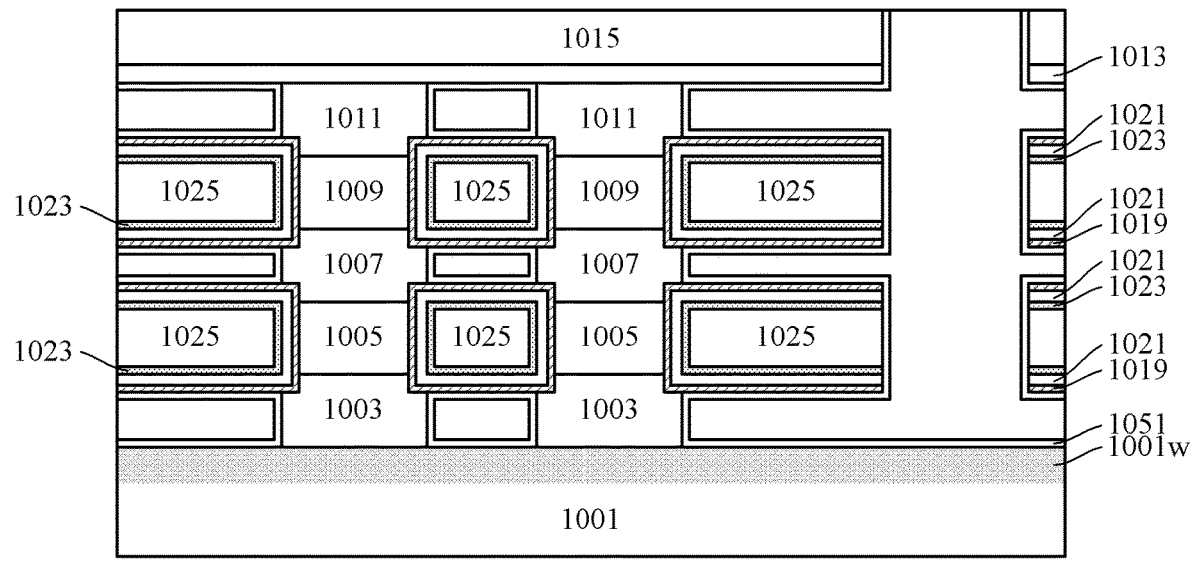

Then, as shown in FIGS. 35(a) and 35(b), the gaps in the stack may be filled with a dielectric material through the trench for structural support and desired electrical isolation. To this end, reference may be made to the descriptions above in connection with FIGS. 11(a) and 11(b).

Subsequent operations may be the same as those in the above embodiments, and details thereof are omitted here.

Figure 36A:
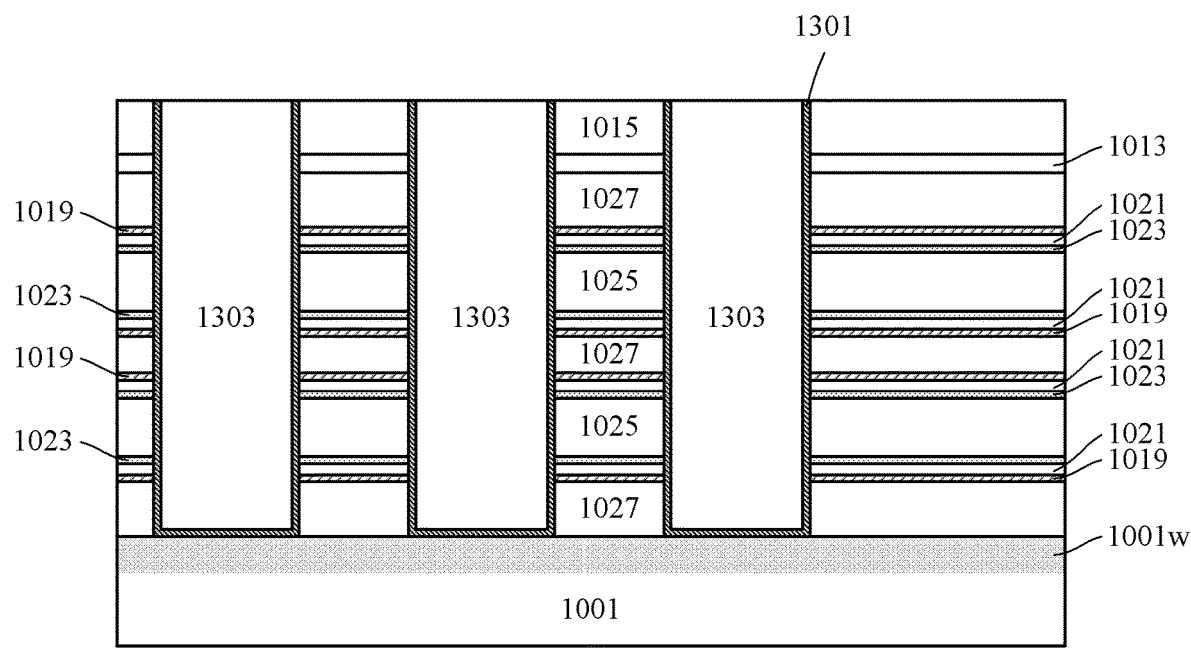
FIGS. 36(a) and 36(b) are schematic views showing some stages in a flow of manufacturing a memory device according to another embodiment of the present disclosure.
Figure 36B:
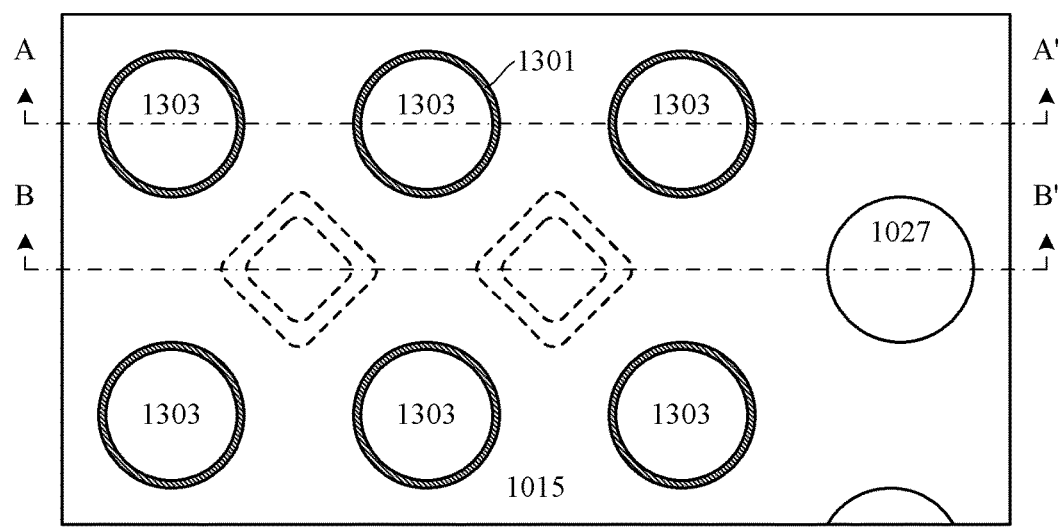

In addition, instead of forming additional memory cells in the machining holes, a stress-applying material may be filled in the machining holes to apply stress to the channel layers. FIGS. 36(a) and 36(b) are schematic views showing some stages in a flow of manufacturing a memory device according to another embodiment of the present disclosure. In the following, descriptions will focus on differences of this embodiment from the above embodiments.

After the machining holes in the memory cell region are emptied as described above in connection with FIGS. 12(a), 12(b), and 12(c), the machining holes may be filled with a stress-applying material 1303, as shown in FIGS. 36(a) and 36(b). In addition, in order to protect the memory cells, a protection layer 1301 may be deposited firstly. For example, the protection layer 1301 may comprise oxide with a thickness of about 1-2 nm, and the stress-applying material 1303 may comprise nitride. The deposited protection layer and stress-applying material may be planarized by, for example, CMP, and CMP may be stopped at the nitride layer 1015, so that the protection layer and the stress-applying material are confined within the machining holes. After that, the device may be manufactured in the same way.

For an n-type memory cell, the stress-applying material 1303 may be compressive stressed to create tensile stress in the channel layers; and for a p-type memory cell, the stress-applying material 1303 may be tensile stressed to create compressive stress in the channel layers.

Alternatively, in the above descriptions in connection with FIGS. 11(a) and 11(b), the stress-applying material may be directly filled in the gaps in the stack. Similarly, a protection layer may be formed firstly before filling the stress-applying material. In this case, it is preferable that the source/drain layers have a thickness greater than that of the channel layers. Thus, the operations of filling the isolation layer and the stress-applying material are combined. As a result, there is no need for a separate operation of filling the machining holes with the stress-applying material, and the device may be manufactured in the same way.

Alternatively, in the above descriptions in connection with FIGS. 11(a) and 11(b), the stress-applying material may be directly filled in the gaps in the stack. Similarly, a protection layer may be formed firstly before the stress-applying material is filled. Then, the machining holes may be emptied as described above in connection with FIGS. 36(a) and 36(b), and a further stress-applying material may be formed in the machining holes. After that, the device may be manufactured in the same way.

In addition, according to embodiments of the present disclosure, selection transistors may be further incorporated at the uppermost ends and/or the lowermost ends of the respective first pillar-shaped active regions and/or the respective second pillar-shaped active regions, and details thereof are omitted here. These selection transistors may also be vertical devices.

The memory devices according to the embodiments of the present disclosure are applicable to various electronic devices. For example, the memory device may store various programs, applications and data required for operations of the electronic device. The electronic device may further comprise a processor operatively coupled to the memory device. For example, the processor may allow the programs stored in the memory device to operate the electronic device. Such an electronic device may be, for example, a smart phone, a computer, a tablet Personal Computer (PC), an artificial intelligence machine, a wearable device, a mobile supply, or the like.

In the above descriptions, techniques such as patterning, etching or the like of various layers are not described in detail. It is to be understood by those skilled in the art that various technical measures may be utilized to form the layers, regions or the like in desired shapes. Further, in order to form the same structure, those skilled in the art can devise processes not completely the same as those described above. The mere fact that the respective embodiments are described separately above does not necessarily mean that measures in the respective embodiments cannot be used in combination to advantage.

The embodiments of the present disclosure are described above. However, those embodiments are provided only for illustrative purpose, rather than limiting the scope of the present disclosure. The scope of the present disclosure is defined by the attached claims as well as equivalents thereof. Those skilled in the art can make various alternations and modifications without departing from the scope of the present disclosure, which all fall within the scope of the present disclosure.

I claim:

1. A memory device, comprising:
 a plurality of first pillar-shaped active regions and a plurality of second pillar-shaped active regions formed on a substrate and extending upward from the substrate,
 wherein the first pillar-shaped active regions are arranged in a first array, and the second pillar-shaped active regions are arranged in a second array,
 wherein each of the first pillar-shaped active regions comprises a composition of alternatively stacked source/drain layers and channel layers, wherein the channel layers of the respective first pillar-shaped active regions at a corresponding level are substantially coplanar with each other, and the source/drain layers of the respective first pillar-shaped active regions at a corresponding level are substantially coplanar with each other, and
 wherein each of the second pillar-shaped active regions comprises an active continuous semiconductor layer extending uninterruptedly and upwardly from the substrate such that portions of the active continuous semiconductor layer are coplanar with the source/drain layers and other portions of the active continuous semiconductor layer are coplanar with the channel layers,
 multiple layers of first storage gate stacks substantially coplanar with the respective levels of the channel layers, wherein the multiple layers of first storage gate stacks surround peripheries of the respective levels of the channel layers, and
 multiple layers of second storage gate stacks which surround peripheries of the respective second pillar-shaped active regions.

2. The memory device according to claim 1, wherein the first array and the second array are nested with each other.

3. The memory device according to claim 1, wherein each of the multiple layers of second storage gate stacks and a corresponding one of the multiple layers of first storage gate stacks comprise a common gate conductor layer, which is substantially coplanar with a corresponding level of the channel layers.

4. The memory device according to claim 1, wherein each of the channel layers has a doping distribution which decreases gradually from its periphery to its center.

5. The memory device according to claim 1,
 wherein each of the first storage gate stacks comprises a first gate dielectric layer, a floating gate layer or charge trapping layer, a second gate dielectric layer and a gate conductor layer which are stacked in sequence, and
 wherein each of the second storage gate stacks comprises another first gate dielectric layer, another charge trapping layer, and another second gate dielectric layer which are stacked in sequence, and the gate conductor layer in each of the multiple layers of first storage gate stacks also acts as the gate conductor layer in a corresponding one of the multiple layers of second storage gate stacks,
 wherein the other first gate dielectric layer, the other charge trapping layer, and the other second gate dielectric layer extend around a periphery of a corresponding one of the second pillar-shaped active regions.

6. The memory device according to claim 1, wherein at least one of the first storage gate stacks and the second storage gate stacks comprises a ferroelectric material.

7. The memory device according to claim 6,
 wherein at least one of the first storage gate stacks and the second storage gate stacks comprises a first metal layer, a ferroelectric material layer, a second metal layer, and a gate dielectric layer which are stacked in sequence; or
 wherein the first storage gate stacks each comprise a first gate dielectric layer, a floating gate layer or charge trapping layer, a second gate dielectric layer and a gate conductor layer which are stacked in sequence, and the second storage gate stacks each comprise a first metal layer, a ferroelectric material layer, a second metal layer, and a gate dielectric layer which are stacked in sequence; or
 wherein the second storage gate stacks each comprise a first gate dielectric layer, a charge trapping layer and a second gate dielectric layer which are stacked in sequence, and the first storage gate stacks each comprise a first metal layer, a ferroelectric material layer, a second metal layer and a gate dielectric layer which are stacked in sequence.

8. The memory device according to claim 7, wherein the ferroelectric material comprises hafnium oxide, zirconium oxide, tantalum oxide, hafnium zirconium oxide, or hafnium tantalum oxide, and the first metal layer and the second metal layer each comprise TiN.

9. The memory device according to claim 8, wherein the hafnium oxide comprises $HfO_2$, the zirconium oxide comprises $ZrO_2$, the tantalum oxide comprises $TaO_2$, the hafnium zirconium oxide comprises $Hf_xZr_{1-x}O_2$, and hafnium tantalum oxide comprises $Hf_xTa_{1-x}O_2$ where x is in a range of 0-1.

10. The memory device according to claim 7, wherein the ferroelectric material comprises Si-containing $HfO_2$, Al-containing $HfO_2$, $BaTiO_3$, $KH_2PO_4$ or SBTi, and the first metal layer and the second metal layer each comprise TiN.

11. The memory device according to claim 1, wherein the channel layers each comprise a monocrystalline semiconductor material, and the source/drain layers each comprise a monocrystalline semiconductor material.

12. The memory device according to claim 11, wherein the monocrystalline semiconductor material of the channel layers and the monocrystalline semiconductor material of the source/drain layers form a heterojunction.

13. The memory device according to claim 12,
wherein the monocrystalline semiconductor material of the channel layers comprises Si, and the monocrystalline semiconductor material of the source/drain layers comprises SiGe; or
wherein the monocrystalline semiconductor material of the channel layers comprises Si, and the monocrystalline semiconductor material of the source/drain layers comprises Si:C; or
wherein the monocrystalline semiconductor material of the channel layers comprises SiGe, and the monocrystalline semiconductor material of the source/drain layers comprises Si.

14. The memory device according to claim 1, wherein the first storage gate stacks are self-aligned to the respective channel layers.

15. The memory device according to claim 1, wherein in each of the first pillar-shaped active regions, the channel layers have their respective peripheries recessed inward with respect to peripheries of the respective source/drain layers.

16. The memory device according to claim 2, wherein the first pillar-shaped active regions are arranged in a two-dimensional array in rows and columns, and the second pillar-shaped active regions are arranged in a two-dimensional array in rows and columns, wherein each of the first pillar-shaped active regions is located at an approximately center of a corresponding one of grids of the two-dimensional array of the second pillar-shaped active regions, and each of the second pillar-shaped active regions is located at an approximately center of a corresponding one of grids of the two-dimensional array of the first pillar-shaped active regions.

17. The memory device according to claim 1,
wherein the respective levels of the channel layers are located at respective planes substantially parallel to a surface of the substrate,
wherein the respective levels of the source/drain layers are located at respective planes substantially parallel to the surface of the substrate, and
wherein each of the first pillar-shaped active regions and the second pillar-shaped active regions extends in a direction substantially perpendicular to the surface of the substrate.

18. The memory device according to claim 3, wherein each of the second storage gate stacks further comprises additional gate conductors which are located on upper and lower sides of a corresponding one of the common gate conductor layers and abut the common gate conductor layer.

19. The memory device according to claim 18, wherein the additional gate conductors are integral with the common gate conductor layer.

20. The memory device according to claim 1, further comprising a ground potential plane to which the lowermost source/drain layers in the respective first pillar-shaped active regions and the respective second pillar-shaped active regions are commonly connected.

21. The memory device according to claim 20, wherein the ground potential plane is a doped region in the substrate.

22. The memory device according to claim 1, wherein each of the second pillar-shaped active regions has a ring-shaped structure.

23. An electronic device, comprising the memory device according to claim 1.

24. The electronic device according to claim 23, further comprising a processor operatively coupled to the memory device.

25. The electronic device according to claim 23, wherein the electronic device comprises a smart phone, a computer, a tablet computer, an artificial intelligence machine, a wearable device, or a mobile power supply.

* * * * *